United States Patent
Li et al.

(10) Patent No.: US 12,382,755 B2
(45) Date of Patent: Aug. 5, 2025

(54) DISPLAY APPARATUS

(71) Applicant: Samsung Display Co., LTD., Yongin-si (KR)

(72) Inventors: Xin Xing Li, Suwon-si (KR); Hee Keun Lee, Suwon-si (KR); Chang Il Tae, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 653 days.

(21) Appl. No.: 17/757,448

(22) PCT Filed: Dec. 11, 2020

(86) PCT No.: PCT/KR2020/018158
§ 371 (c)(1),
(2) Date: Jun. 15, 2022

(87) PCT Pub. No.: WO2021/125704
PCT Pub. Date: Jun. 24, 2021

(65) Prior Publication Data
US 2023/0057723 A1    Feb. 23, 2023

(30) Foreign Application Priority Data

Dec. 16, 2019  (KR) .......................... 10-2019-0168089

(51) Int. Cl.
*H10H 20/831*  (2025.01)
*H01L 25/16*   (2023.01)

(52) U.S. Cl.
CPC ......... *H10H 20/831* (2025.01); *H01L 25/167* (2013.01)

(58) Field of Classification Search
CPC .. H10H 20/831; H10H 20/819; H10H 20/857; H10H 29/142; H10H 20/83;
(Continued)

(56) References Cited

U.S. PATENT DOCUMENTS 8,872,214 B2    10/2014   Negishi et al.
2009/0188544 A1  7/2009   Kobayashi et al.
(Continued)

FOREIGN PATENT DOCUMENTS

JP    2011-103435 A    5/2011
JP    2011-108744 A    6/2011
(Continued)

OTHER PUBLICATIONS

International Search Report of PCT/KR2020/018158, Mar. 22, 2021, 4 pages.
(Continued)

*Primary Examiner* — Julia Slutsker
(74) *Attorney, Agent, or Firm* — Womble Bond Dickinson (US) LLP

(57) ABSTRACT

A display apparatus includes: a substrate including a plurality of pixels; an electrode unit in each of the pixels of the substrate and including: a first electrode having a first outer side having a center of curvature and a curved shape; and a second electrode having a second outer side having a curved shape corresponding to the first outer side and spaced apart from and facing the first electrode; and a plurality of light-emitting elements between the first electrode and the second electrode. The center of curvature of the first electrode is on a peripheral portion of the pixel, and the first outer side of the first electrode faces a center of the pixel.

20 Claims, 26 Drawing Sheets

(58) Field of Classification Search
CPC . H01L 25/167; H01L 25/0753; H01L 21/768; H01L 25/16; H01L 21/76895
See application file for complete search history.

(56) References Cited

U.S. PATENT DOCUMENTS

| | | |
|---|---|---|
| 2011/0019420 A1 | 1/2011 | Kadotani et al. |
| 2011/0116252 A1 | 5/2011 | Agatani et al. |
| 2017/0194297 A1 | 7/2017 | Kuriki |
| 2017/0358563 A1 | 12/2017 | Cho et al. |
| 2019/0067255 A1* | 2/2019 | Lim .................. H10H 20/852 |

FOREIGN PATENT DOCUMENTS

| | | |
|---|---|---|
| JP | 4814394 B2 | 11/2011 |
| JP | 2017-085096 A | 5/2017 |
| KR | 2012-0122159 A | 11/2012 |
| KR | 10-1436123 B1 | 11/2014 |
| KR | 2015-0006798 A | 1/2015 |
| KR | 10-1490758 B1 | 2/2015 |
| KR | 10-1782889 B1 | 9/2017 |
| KR | 2017-0141305 A | 12/2017 |
| KR | 10-2019-0123064 A | 10/2019 |

OTHER PUBLICATIONS

Korean Notice of Allowance for KR Application No. 10-2019-0168089, dated May 20, 2024, 2 pages.

* cited by examiner

EU : EU1,EU2,EU3,EU4,EU5,EU6,EU7,EU8

DISPLAY APPARATUS

CROSS-REFERENCE TO RELATED APPLICATION

This application is a U.S. National Phase Patent Application of International Patent Application Number PCT/KR2020/018158, filed on Dec. 11, 2020, which claims priority to Korean Patent Application Number 10-2019-0168089, filed on Dec. 16, 2019 in the Korean Intellectual Property Office, the entire content of all of which is incorporated herein by reference.

BACKGROUND

1. Field

Aspects of embodiments of the present disclosure relate to a display apparatus.

2. Description of the Related Art

The importance of display devices has steadily increased with the development of multimedia technology. In response thereto, various types of display devices, such as an organic light emitting diode (OLED) display, a liquid crystal display (LCD), and the like have been developed.

A display device is a device for displaying an image and generally includes a display panel, such as an organic light emitting display panel or a liquid crystal display panel. The light emitting display panel may include light emitting elements, such as light emitting diodes (LED). Examples of the light emitting diodes include organic light emitting diodes (OLED) using an organic material as a fluorescent material and an inorganic light emitting diodes using an inorganic material as a fluorescent material.

SUMMARY

Aspects of embodiments of the present disclosure provide a display device including a display apparatus including electrodes having curved side surfaces and facing each other.

Embodiments of the present disclosure also provide a display apparatus in which the electrodes are disposed around a peripheral portion of each pixel with the curved side surfaces thereof facing a center portion of each pixel.

It should be noted that aspects and features of the present disclosure are not limited thereto and other aspects and features, which are not explicitly mentioned herein, will be apparent to those of ordinary skill in the art from the following description.

According to an embodiment of the present disclosure, a display apparatus includes: a substrate including a plurality of pixels; an electrode unit in each of the pixels of the substrate and including: a first electrode having a first outer side having a center of curvature and a curved shape; and a second electrode having a second outer side having a curved shape corresponding to the first outer side and spaced apart from and facing the first electrode; and a plurality of light-emitting elements between the first electrode and the second electrode. The center of curvature of the first electrode is on a peripheral portion of the pixel, and the first outer side of the first electrode faces a center of the pixel.

The electrode unit may include a first type electrode unit in which the first electrode has a first short side extending in a first direction, a second short side extending in a second direction crossing the first direction with one end thereof connected to one end of the first short side. The first outer side of the first electrode may extend between the other end of the first short side and the other end of the second short side, and, in the first electrode of the first type electrode unit, the center of curvature of the first outer side may be the one end of the first short side.

The second electrode may have a third outer side having a curved shape corresponding to the second outer side, a third short side extending in the first direction and connecting one end of the second outer side and one end of the third outer side, and a fourth short side extending in the second direction and connecting the other end of the second outer side and the other end of the third outer side.

The electrode unit may include a first electrode unit in which the center of curvature of the first outer side is on one side of the pixel and a second electrode unit in which the center of curvature of the first outer side is on the other side of the pixel.

The second electrode of the first electrode unit may be directly connected to the second electrode of the second electrode unit.

The display apparatus may further include a bridge electrode in the pixel, and the bridge electrode may have one end connected to the first electrode of the first electrode unit and the other end connected to the second electrode of the second electrode unit.

The second electrode may have an electrode protrusion in which a portion of the third outer side protrudes.

The electrode unit may further include a third electrode between the first electrode and the second electrode and a fourth electrode between the third electrode and the first electrode. The third electrode may have a curved shape corresponding to the second outer side of the second electrode, and the fourth electrode may have a curved shape corresponding to the first outer side of the first electrode.

The third electrode and the fourth electrode may be spaced apart from each other and face each other, and each of the light-emitting elements may be between the third electrode and the fourth electrode.

The display apparatus may further include: a first floating pattern having a shape extending in the first direction and having a portion spaced apart from the first short side of the first electrode and the third electrode in the second direction; and a second floating pattern having a shape extending in the second direction and having a portion spaced apart from a fourth short side of the second electrode and the fourth electrode in the first direction.

The electrode unit may include a second type electrode unit in which the first electrode has a fifth short side extending in the first direction, and the first outer side extends between both ends of the fifth short side. And, in the first electrode of the second type electrode unit, the center of curvature of the first outer side may be between both ends of the fifth short side.

The electrode unit may further include a third type electrode unit in which the first electrode has a circular shape.

The display apparatus may further include: a first contact electrode on the first electrode and having a side curved along the first outer side; and a second contact electrode on the second electrode and having a side curved along the second outer side. The first contact electrode may be in contact with the first electrode and one end of at least one of the light-emitting elements, and the second contact electrode may be in contact with the second electrode and the other end of the at least of the light-emitting elements.

A first separation distance between the first outer side of the first electrode and the second outer side of the second electrode may be less than a second separation distance between the first contact electrode and the second contact electrode.

According to an embodiment of the present disclosure, a display apparatus includes: a plurality of first electrodes each having a first short side and a second short side that extend in directions crossing each other and have ends connected to each other, and a first outer side having a curved shape and extending between the other ends of the first short side and the second short side; a plurality of second electrodes, each of which is spaced apart from and faces the first outer side of the first electrode and has a second outer side having a curved shape corresponding to the first outer side; and a plurality of light-emitting elements between the first electrodes and the second electrodes. The plurality of light-emitting elements are between the first outer side and the second outer side and arranged along a curvature of the first outer side.

The display apparatus may further include a third electrode between the first electrode and the second electrode and a fourth electrode between the third electrode and the first electrode. The third electrode may have a curved shape corresponding to the second outer side of the second electrode, and the fourth electrode may have a curved shape corresponding to the first outer side of the first electrode.

The display apparatus may further include: a first contact electrode on the first electrode and having a side curved along the first outer side; and a second contact electrode on the second electrode and having a side curved along the second outer side.

The first outer side and the second outer side may have the same center of curvature, at least some of the plurality of first electrodes may have different centers of curvature, and at least some of the plurality of second electrodes may have different centers of curvature.

At least some of the second electrodes having different centers of curvature may be directly connected to each other.

The display apparatus may further include a bridge electrode connecting the first electrode and the second electrode, and the second electrode may have a center of curvature different from that of the first electrode.

Details of other embodiments of the present disclosure are included in the detailed description and the accompanying drawings.

A display apparatus according to an embodiment includes: a first electrode having a curved outer side and a center of curvature; and a second electrode having a curved outer side corresponding to the outer side of the first electrode and the same center of curvature as the outer side of the first electrode. The display apparatus includes a plurality of the first electrodes and a plurality of the second electrodes for each pixel or sub-pixel, and each of the first electrodes and second electrodes may be arranged such that a center of curvature thereof is at a peripheral portion of the pixel or sub-pixel.

Accordingly, in a display apparatus according to embodiments of the present disclosure, a ratio of a unit area occupied by the electrodes per unit area of each pixel or sub-pixel is increased, and the number of light-emitting elements disposed per unit area is increased. Thus, the amount of light emission per unit area of each pixel or sub-pixel is increased.

The aspects and features according to embodiments of the present disclosure are not limited to those described above, and more various aspects and features of the present disclosure are included in this disclosure.

DETAILED DESCRIPTION

Figure 1:
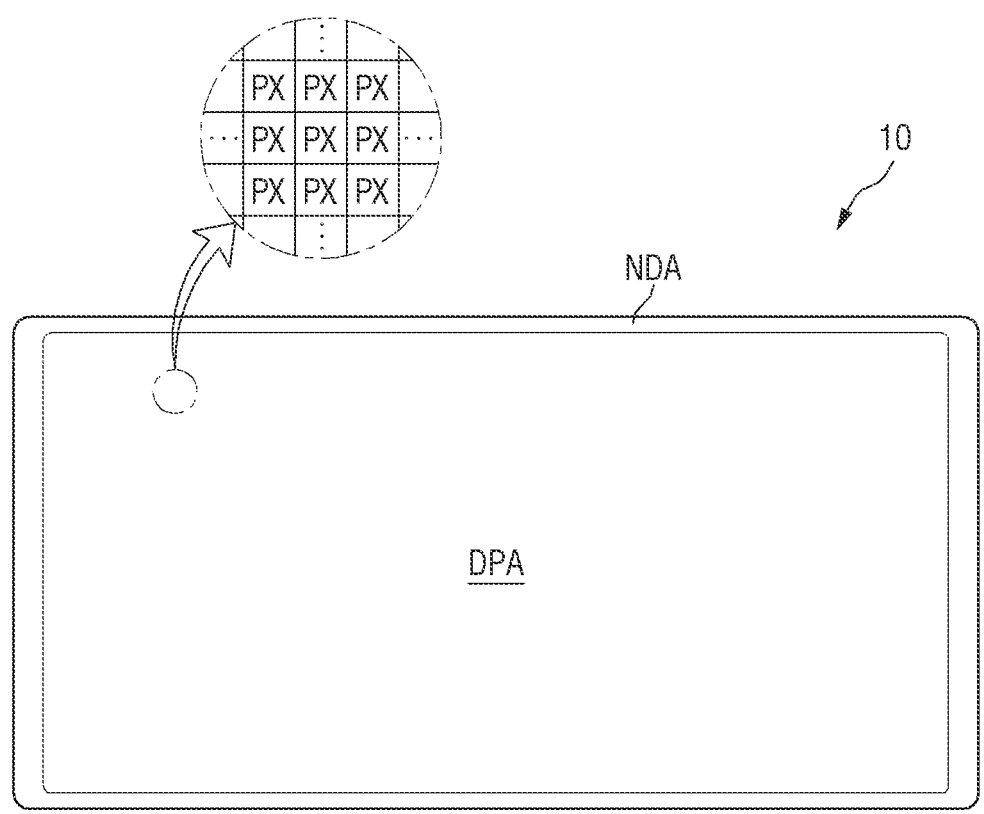
FIG. 1 is a plan view of a display apparatus according to one embodiment.

The present disclosure will now be described more fully hereinafter with reference to the accompanying drawings, in which embodiments of the present disclosure are shown. The present disclosure may, however, be embodied in different forms and should not be limited to the embodiments set forth herein. Rather, these embodiments are provided so that this disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

FIG. 1 is a schematic plan view of a display apparatus according to one embodiment.

Referring to FIG. 1, a display apparatus 10 displays (e.g., is configured to display) a video or a still image. The display apparatus 10 may refer to (or may embody) any electronic device that provide a display screen. For example, the display apparatus 10 may include a television, a notebook, a monitor, an advertising board, an Internet of Things (IoT) device, a mobile phone, a smart phone, a tablet personal computer (PC), an electronic watch, a smart watch, a watch phone, a head mounted display, a mobile communication terminal, an electronic organizer, an electronic book reader, a portable multimedia player (PMP), a navigation device, a game machine, a digital camera, a camcorder, and the like that provide display screens.

The display apparatus 10 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although an embodiment in which the display apparatus 10 is an inorganic light-emitting diode display panel is described, the present disclosure is not limited thereto, and the same technical disclosure and/or spirit is applicable to other types of display panels.

A shape of the display apparatus 10 may be variously modified. For example, the display apparatus 10 may have a rectangular shape in which lateral sides are long, a rectangular shape in which longitudinal sides are long, a square shape, a quadrangular shape in which corner portions (e.g., vertexes) are round, other polygonal shapes, a circular shape, and the like. A shape of a display region DPA of the display apparatus 10 may be similar to the overall shape of the display apparatus 10. In FIG. 1, the display apparatus 10 and the display region DPA both have a rectangular shape in which lateral sides are long.

The display apparatus 10 may have the display region DPA and a non-display region NDA. The display region DPA is a region in which an image may be displayed, and the non-display region NDA is a region in which an image is not displayed. The display region DPA may refer to an active region, and the non-display region NDA may refer to an inactive region. The display region DPA may generally occupy a center of the display apparatus 10.

The display region DPA may include a plurality of pixels PX. The plurality of pixels PX may be disposed in a matrix arrangement. A shape of each of the pixels PX may be a rectangular shape or a square shape in a plan view, but the present disclosure is not limited thereto. The pixels PX may have a rhombus shape in which each side is inclined with respect to one direction. The pixels PX may be alternately arranged in a stripe type or a PenTile® (a registered trademark owned by Samsung Display Co., Ltd.) type (or diamond arrangement). In addition, each of the pixels PX may include one or more light-emitting elements 300 that emit light in a specific wavelength range, thereby displaying a specific color.

The non-display region NDA may be disposed around the display region DPA. The non-display region NDA may completely or partially surround the display region DPA (e.g., surround the display region DPA in a plan view or extend around a periphery of the display region DPA). The display region DPA has a rectangular shape, and the non-display region NDA may be disposed adjacent to four sides of the display region DPA. The non-display region NDA may form a bezel of the display apparatus 10. In the non-display region NDA, lines or circuit driving parts included in the display apparatus 10 may be disposed or external devices may be mounted.

Figure 2:
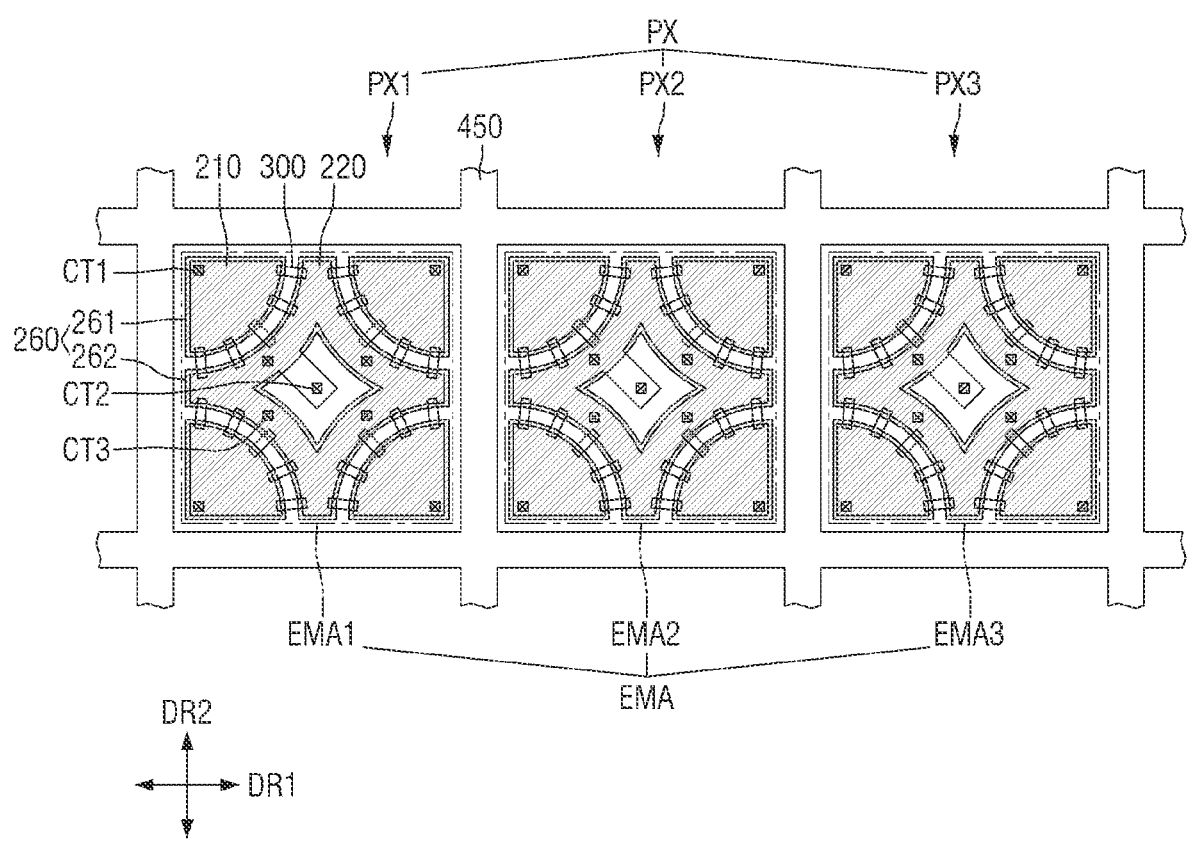
FIG. 2 is a plan view illustrating one pixel of the display apparatus shown in FIG. 1.

FIG. 2 is a plan view illustrating one pixel of the display apparatus shown in FIG. 1.

Referring to FIG. 2, the display apparatus 10 may include the plurality of pixels PX, and each of the pixels PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. However, the present disclosure is not limited thereto, and the sub-pixels PXn may emit light having the same color. In addition, in FIG. 2, the pixel PX is illustrated as including three sub-pixels PXn, but the pixel PX is not limited thereto and may include a greater number of sub-pixels PXn.

Each of the sub-pixels PXn of the display apparatus 10 may have a region defined as a light-emitting region EMA. The first sub-pixel PX1 may include a first light-emitting region EMA1, the second sub-pixel PX2 may include a second light-emitting region EMA2, and the third sub-pixel PX3 may include a third light-emitting region EMA3. The light-emitting region EMA may be defined as a region in which the light-emitting element 300 included in the display apparatus 10 is disposed to emit light in a specific wavelength range. The light-emitting element 300 includes an active layer 330 (see, e.g., FIG. 9), and the active layer 330 may emit light in a specific wavelength range without directivity. For example, the light emitted from the active layer 330 of the light-emitting element 300 may also be emitted in directions toward side surfaces of the light-emitting element 300, including both ends (e.g., opposite ends) thereof. The light-emitting region EMA may include a region in which the light-emitting element 300 is disposed and may include a region which is adjacent to the light-emitting element 300 at where the light emitted from the light-emitting element 300 is emitted.

The present disclosure is not limited thereto, and the light-emitting region EMA may also include a region in which the light emitted from the light-emitting element 300 is reflected or refracted due to another member and emitted. A plurality of light-emitting elements 300 may be disposed in each sub-pixel PXn, and the region in which the light-emitting elements 300 are disposed and a region adjacent to the region form the light-emitting region EMA.

Each of the sub-pixels PXn of the display apparatus 10 may include a non-light-emitting region, which is defined as a region except for (or other than) the light-emitting region EMA. The non-light-emitting region may be a region in which the light-emitting elements 300 are not disposed and the light emitted from the light-emitting elements 300 does not reach so that light is not emitted. In the non-light-emitting region, a region in which layers disposed below a layer on which the light-emitting elements 300 are disposed are partially patterned may be formed. During a manufacturing process of the display apparatus 10, after the light-emitting elements 300 are disposed, some lines disposed below the light-emitting elements 300 may be patterned. The patterning may be performed in the non-light-emitting region, in which the light-emitting elements 300 are not disposed, in each sub-pixel PXn. A more detailed description thereof will be provided below.

Each of the sub-pixels PXn of the display apparatus 10 may include a plurality of electrodes 210 and 220, the plurality of light-emitting elements 300, and a plurality of contact electrodes 260. In addition, the display apparatus 10 may further include an outer bank 450 disposed to surround (e.g., surround in a plan view or extend around a periphery of) each sub-pixel PXn. According to one embodiment, the display apparatus 10 may include a first electrode 210 and a second electrode 220, each having a curved side so that the number of the light-emitting elements 300 disposed in a unit area of each sub-pixel PXn is increased. In addition, the light-emitting elements 300 may be disposed between the curved sides of the electrodes 210 and 220, and each sub-pixel PXn may have various light-emitting directions. Hereinafter, the electrodes 210 and 220 and the light-emitting elements 300 disposed in each sub-pixel PXn of the display apparatus 10 will be described in detail with further reference to other drawings.

Figure 3:
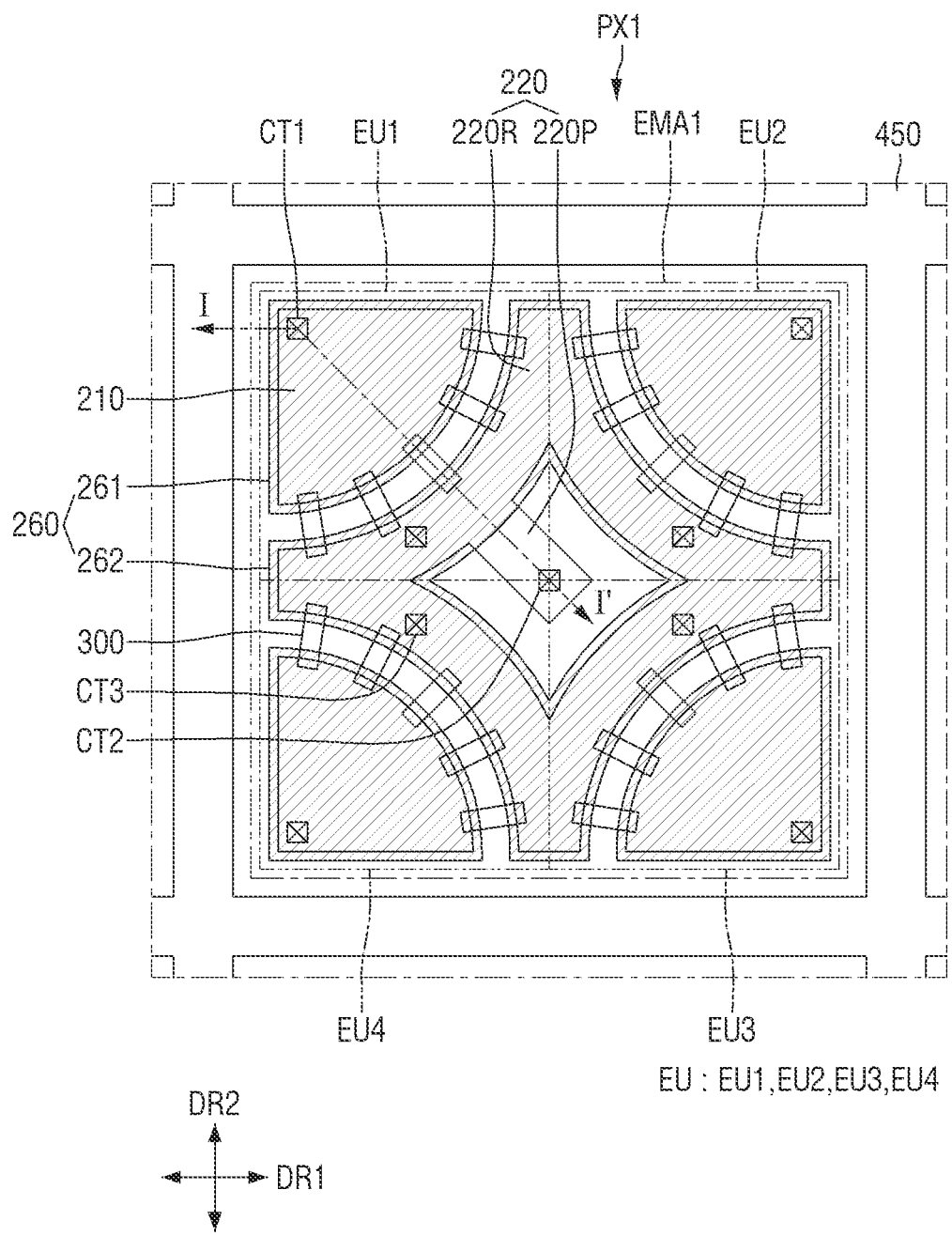
FIG. 3 is a plan view illustrating one sub-pixel of the pixel shown in FIG. 2.
Figure 4:
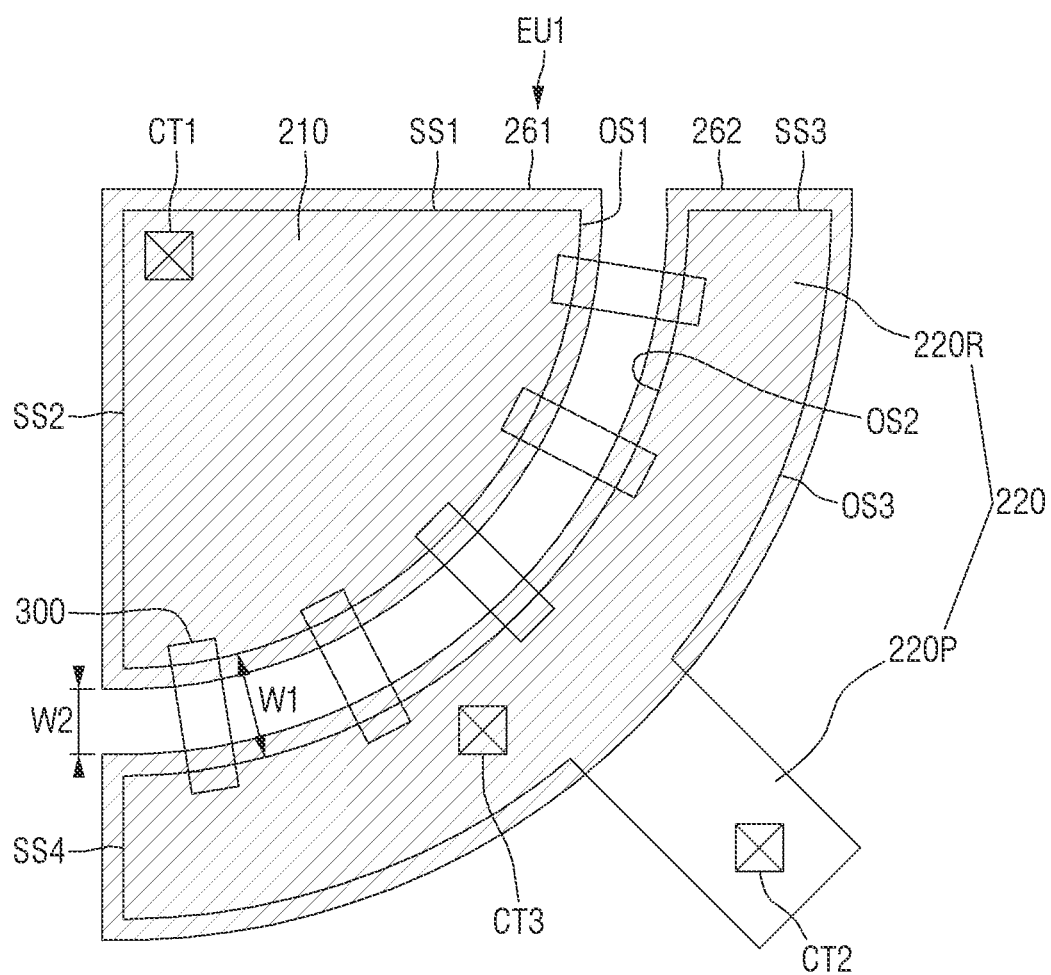
FIG. 4 is a schematic plan view illustrating an electrode unit according to one embodiment.

FIG. 3 is a plan view illustrating one sub-pixel of the pixel shown in FIG. 2, and FIG. 4 is a schematic plan view illustrating an electrode unit of the sub-pixel shown in FIG. 3.

FIG. 3 illustrates the first sub-pixel PX1 shown in FIG. 2, and FIG. 4 illustrates an enlarged view of an electrode unit EU including the first electrode 210 and the second electrode 220 of the first sub-pixel PX1 shown in FIG. 3.

Referring to FIGS. 3 and 4, each of the sub-pixels PXn of the display apparatus 10 may include the electrode unit EU including the plurality of electrodes 210 and 220. The electrode unit EU may include the first electrode 210 and the second electrode 220, and one sub-pixel PXn may include a plurality of electrode units EU. For example, as shown in FIG. 3, one sub-pixel PXn may include a first electrode unit EU1, a second electrode unit EU2, a third electrode unit EU3, and a fourth electrode unit EU4. FIG. 4 illustrates the first electrode 210 and the second electrode 220 included in the first electrode unit EU1 shown in FIG. 3.

The first electrode 210 of the electrode unit EU may have a curved shape on at least one side thereof. For example, the first electrode 210 may include a first short side SS1 extending in a first direction DR1, a second short side SS2 extending in a second direction DR2, and a first outer side OS1 configured to connect (or extend between) the first short side SS1 and the second short side SS2 and having a curved shape. The first short side SS1 and the second short side SS2 of the first electrode 210 may extend in directions crossing (e.g., perpendicular to) each other, ends thereof may be connected to each other, and the other ends thereof may be connected to the first outer side OS1.

In an embodiment, the first electrode 210 may have a quarter-circle shape in a plan view. As shown in FIG. 4, in the first electrode 210, the first short side SS1 and the second short side SS2 may extend to be perpendicular to each other, and the first outer side OS1 may have a shape curved (e.g., convexly curved) about a portion at which the first short side SS1 and the second short side SS2 are connected to each other. For example, the first outer side OS1 of the first electrode 210 may be an arc of a quarter-circle having a center of curvature at where the first short side SS1 and the second short side SS2 are interconnected, and having a shape of the first electrode 210.

However, the present disclosure is not limited thereto. The first short side SS1 and the second short side SS2 may not have a shape crossing (e.g., perpendicular to) each other as long as the first electrode 210 includes the first outer side OS1 having a shape curved about a center of curvature. For example, the first electrode 210 may have a shape in which the first short side SS1 and the second short side SS2 do not cross each other or do not extend in one direction. In addition, in the first electrode 210, the first short side SS1 and the second short side SS2 may not be directly connected to each other, and the first electrode 210 may have another side, and the first short side SS1 and the second short side SS2 may be connected to each other through the other side. The other side may extend in one direction or may have a curved shape similar to the first outer side OS1.

Further, the first electrode 210 may be electrically connected to a line disposed therebelow through a first contact hole (e.g., a first contact opening) CT1 passing through at least some of layers disposed below the first electrode 210. A description thereof will be provided below.

The second electrode 220 may be disposed to be spaced apart from and face the first electrode 210. The second electrode 220 may be disposed to be spaced apart from and face the curved first outer side OS1 of the first electrode 210 and may have a side curved along (or corresponding to) the first outer side OS1. For example, the second electrode 220 may have a second outer side OS2 and a third outer side OS3, which correspond to the first outer side OS1 and have the same curvature as the first outer side OS1, and a third short side SS3 and a fourth short side SS4 connecting both sides of the second outer side OS2 and the third outer side OS3, respectively. The second outer side OS2 of the second electrode 220 may be spaced apart from and may face the first outer side OS1 of the first electrode 210, and the third outer side OS3 may be a side opposite to the second outer side OS2. The second outer side OS2 and the third outer side OS3 may have the same curvature and center of curvature. However, a length of the second outer side OS2 may be less than a length of the third outer side OS3 because the second outer side OS2 is located nearer to the center of curvature.

The third short side SS3 of the second electrode 220 may have a shape extending in the first direction DR1, and the fourth short side SS4 may have a shape extending in the second direction DR2. In one embodiment, the first short side SS1 of the first electrode 210 and the third short side SS3 of the second electrode 220 may extend in the first direction DR1 to be collinear with each other, and the second short side SS2 of the first electrode 210 and the fourth short side SS4 of the second electrode 220 may extend in the second direction DR2 to be collinear with each other.

In an embodiment, the second electrode 220 may have a portion having a specific planar width and having a curved arc shape. The second electrode 220 may be spaced apart from and face the first outer side OS1 of the first electrode 210 by including the portion having a curved arc shape. For example, the second outer side OS2 of the second electrode 220 may have the same center of curvature as at least the first outer side OS1 of the first electrode 210.

However, the present disclosure is not limited thereto. As long as the second electrode 220 has the second outer side OS2 having a curved shape corresponding to at least the first outer side OS1 of the first electrode 210, the third outer side OS3 and the third and fourth short sides SS3 and SS4, which are the other sides, may have different shapes. For example, the second electrode 220 may have a shape in which the second outer side OS2 is included but the third outer side OS3 is omitted so that the third short side SS3 and the fourth short side SS4 are directly connected to each other and may have other sides between the third short side SS3 and the fourth short side SS4 in addition to the third outer side OS3. The description thereof is the same as described above with reference to the first electrode 210.

The second electrode 220 may further include a portion that is connected to one side of the portion having a curved arc shape and protrudes from the one side. According to one embodiment, the second electrode 220 may include an electrode curved portion 220R having a curved arc shape and an electrode protrusion 220P that is connected to one side of the electrode curved portion 220R and protrudes from the one side. The electrode protrusion 220P may have a shape protruding in one direction and may be connected to the electrode curved portion 220R. For example, as shown in FIG. 4, the electrode protrusion 220P may protrude from the third outer side OS3 of the electrode curved portion 220R in one direction. The electrode protrusion 220P may be a portion electrically connected to lines disposed below the second electrode 220. In FIG. 4, the second electrode 220 is illustrated as including the electrode curved portion 220R and the electrode protrusion 220P, but the present disclosure is not limited thereto. In some embodiments, the electrode unit EU may include the second electrode 220 in which the electrode protrusion 220P is omitted and only the electrode curved portion 220R having a curved arc shape is included.

Further, the second electrode 220 may be electrically connected to a line disposed therebelow through a second contact hole (e.g., a second contact opening) CT2 and a third contact hole (e.g., a third contact opening) CT3 passing through at least some of layers disposed below the second electrode 220. A description thereof will be provided below.

In an embodiment, in some of the electrode units EU disposed in each sub-pixel PXn, the second electrode 220 may not include the electrode protrusion 220P, and in at least one electrode unit EU, the second electrode 220 may include the electrode protrusion 220P. The electrode protrusion 220P may be electrically connected to lines disposed therebelow, for example, voltage lines, and the electrode unit EU including the electrode protrusion 220P may receive an electrical signal directly from the voltage line. However, the present disclosure is not limited thereto.

The electrode unit EU shown in FIGS. 3 and 4 may be an electrode unit EU in which the first electrode 210 has a shape of a quarter-circle. That is, the electrode unit EU including the first electrode 210 of a first type, which has a quarter-circle shape at the first outer side OS1 and the second electrode 220 disposed to surround the first outer side OS1 may be a first type electrode unit. The display apparatus 10 according to one embodiment may include the first electrode 210 having various shapes in addition to the first type electrode unit including the first electrode 210 of the first type. For example, the electrode unit EU may include another type of electrode unit EU including the first electrode 210, which has a half-circle shape or a circular shape, and the second electrode 220 corresponding to the first electrode 210 and surrounding the first outer side OS1. This will be described below with reference to other embodiments.

The plurality of light-emitting elements 300 may be disposed between the first electrode 210 and the second electrode 220. As an example, the light-emitting elements 300 may be disposed to be spaced apart from each other between the first electrode 210 and the second electrode 220. However, a separation distance between the light-emitting elements 300 is not particularly limited. In some embodiments, the plurality of light-emitting elements 300 may be disposed adjacent to each other to form a group, and a plurality of other light-emitting elements 300 may be grouped in a state of being spaced apart at an interval (e.g., a predetermined interval) and may be disposed to have a non-uniform density.

The light-emitting elements 300 according to one embodiment may include active layers 330 (see, e.g., FIG. 9) having different materials to emit light in different wavelength ranges to the outside. The display apparatus 10 according to one embodiment may include the light-emitting elements 300 emitting light in different wavelength ranges. The light-emitting element 300 of the first sub-pixel PX1 may include an active layer 330 that emits light of a first color having a first wavelength at a central wavelength range, the light-emitting element 300 of the second sub-pixel PX2 may include an active layer 330 that emits light of a second color having a second wavelength at a central wavelength range, and the light-emitting element 300 of the third sub-pixel PX3 may include an active layer 330 that emits light of a third color having a third wavelength at a central wavelength range.

Thus, the light of the first color may be emitted from the first sub-pixel PX1, the light of the second color may be emitted from the second sub-pixel PX2, and the light of the third color may be emitted from the third sub-pixel PX3. In some embodiments, the light of the first color may be blue light having a central wavelength range ranging from about 450 nm to about 495 nm, the light of the second color may be green light having a central wavelength range ranging from about 495 nm to about 570 nm, and the light of the third color may be red light having a central wavelength range ranging from about 620 nm to about 752 nm. However, the present disclosure is not limited thereto. In some embodiments, the first sub-pixel PX1, the second sub-pixel PX2, and the third sub-pixel PX3 may include the same type of light-emitting elements 300 to emit light of the substantially same color.

According to one embodiment, the light-emitting elements 300 may be disposed in a space in which the first electrode 210 and the second electrode 220 are spaced apart from each other, that is, between the first outer side OS1 and the second outer side OS2. The first outer side OS1 and the second outer side OS2 may each have a curved shape, and the plurality of light-emitting elements 300 disposed therebetween may be arranged along the first outer side OS1 and the second outer side OS2 that are curved about a center of the first electrode 210.

As shown in FIGS. 3 and 4, the plurality of light-emitting elements 300 may have a shape extending in one direction. Each of the light-emitting elements 300 may have an orientation direction that is directed in an extending direction thereof, and the light-emitting elements 300 disposed between the first electrode 210 and the second electrode 220 may have different orientation directions. For example, from among the plurality of light-emitting elements 300, the light-emitting element 300 disposed between the first outer side OS1 and the second outer side OS2 and adjacent to the first short side SS1 and the third short side SS3 may be disposed such that the orientation direction thereof is directed in the first direction DR1. From among the plurality of light-emitting elements 300, the light-emitting element 300 disposed between the first outer side OS1 and the second outer side OS2 and adjacent to the second short side SS2 and the fourth short side SS4 may be disposed such that the orientation direction thereof is directed in the second direction DR2. In addition, the light-emitting elements 300 disposed between the above-described light-emitting elements 300 may be disposed such that the orientation directions thereof are directed in a direction between the first direction DR1 and the second direction DR2. For example, the plurality of light-emitting elements 300 may be disposed along a direction in which the first outer side OS1 and the second outer side OS2 are curved and may have different orientation directions.

As will be described below, the light-emitting elements 300 may be electrically connected to the first electrode 210 and the second electrode 220 and may receive electrical signals from the first electrode 210 and the second electrode 220 to emit light of a specific wavelength range. The light-emitting element 300 may emit light at both ends thereof in the extending direction. The display apparatus 10, according to one embodiment, may include the first electrode 210 and the second electrode 220, each of which has at least one side having a curved shape, the curved sides are spaced apart from each other and face each other, and the orientation directions of the light-emitting elements 300 disposed therebetween may be different. In each sub-pixel PXn, light may be emitted in various directions without being limited to a specific direction, and visibility of the display apparatus 10 in various directions may be improved.

Further, the display apparatus 10 according to one embodiment may include one or more electrode units EU in which the light-emitting elements 300 having various orientation directions are disposed for each sub-pixel PXn. For example, one sub-pixel PXn may include the first electrode unit EU1, the second electrode unit EU2, the third electrode unit EU3, and the fourth electrode unit EU4 forming the plurality of electrode units EU. Each of the electrode units EU may include the first electrode 210 and the second electrode 220 including at least one curved side, and thus, the first to fourth electrode units EU1, EU2, EU3, and EU4 may include a center of curvature of the first outer side OS1 of the first electrode 210. According to one embodiment, in the display apparatus 10, the plurality of electrode units EU disposed in each sub-pixel PXn may be disposed such that centers of curvature of the first outer sides OS1 of the first electrodes 210 thereof are located on opposite sides with respect to a center of each sub-pixel PXn.

For example, each sub-pixel PXn may include a first imaginary line extending in the first direction DR1 and crossing the center of the sub-pixel PXn and a second imaginary line extending in the second direction DR2 and crossing the center of the sub-pixel PXn. The first and second imaginary lines are shown as dot-dash lines in FIG. 3. In each sub-pixel PXn, upper and lower sides with respect to the first imaginary line and left and right sides with respect to the second imaginary line may be defined. The plurality of electrode units EU may be disposed such that centers of curvature of the first outer sides OS1 of the first electrodes 210 are located on sides opposite to each other with respect to the first imaginary line and the second imaginary line. For example, the first electrode unit EU1 may be disposed such that the center of curvature of the first outer side OS1 is located on the upper side of the first imaginary line and the left side of the second imaginary line. The second electrode unit EU2 may be disposed such that the center of curvature of the first outer side OS1 is located on the upper side of the first imaginary line and the right side of the second imaginary line, the third electrode unit EU3 may be disposed such that the center of curvature of the first outer side OS1 is located on the lower side of the first imaginary line and the right side of the second imaginary line, and the fourth electrode unit EU4 may be disposed such that the center of curvature of the first outer side OS1 is located on the lower side of the first imaginary line and the left side of the second imaginary line.

As described above, the center of curvature of the first outer side OS1 of the first electrode 210 may be one side in which the first short side SS1 and the second short side SS2 are interconnected. For example, the first electrode unit EU1 and the second electrode unit EU2 may be symmetrically disposed with the fourth electrode unit EU4 and the third electrode unit EU3, respectively, based on the first imaginary line extending in the first direction DR1. In addition, the first electrode unit EU1 and the fourth electrode unit EU4 may be symmetrically disposed with the second electrode unit EU2 and the third electrode unit EU3 based on the second imaginary line extending in the second direction DR2.

In addition, according to one embodiment, in the first electrode 210 of each of the electrode units EU1, the center of curvature of the first outer side OS1 may be located at a peripheral portion of each sub-pixel PXn, and the first outer side OS1 may have a shape convex toward the center of each sub-pixel PXn. The center of curvature of each of the first outer sides OS1 of the first electrodes 210 may be located at a peripheral portion of each sub-pixel PXn in a diagonal direction, and the plurality of first electrodes 210 may be disposed such that each of the first outer sides OS1 is curved from the center of curvature thereof toward the center of the sub-pixel PXn. The plurality of first electrodes 210 may be disposed such that the first outer sides OS1 face each other, and the second electrodes 220 may be disposed such that the second outer side OS2 is spaced apart from and faces the first outer side OS1 and has a shape surrounding the first outer side OS1. The display apparatus 10, according, to one embodiment may include one or more first electrodes 210 disposed in each sub-pixel PXn, the first outer sides OS1 of the first electrodes 210 face each other, and at least one second electrode 220 may be disposed between the first outer sides OS1 of the first electrodes 210.

When each sub-pixel PXn includes the electrode units EU, each of which includes the first electrode 210 having a shape of a quarter-circle, an area occupied by the plurality of first electrodes 210 may have a circular shape according to the number of the first electrodes 210. For example, when each sub-pixel PXn includes the first to fourth electrode units EU1, EU2, EU3, and EU4 as shown in, for example, FIG. 3, an area occupied by the four first electrodes 210 may be the same as an area occupied by one circular electrode (e.g., the four first electrodes 210 occupy the area of one circle). When a plurality of electrodes having a circular shape are disposed per unit area, an area of a region in which the electrode is not disposed increases, and a ratio of an area occupied by the circular electrode may decrease. For example, when each of the electrodes 210 and 220 of each sub-pixel PXn has a circular shape, an area occupied by the electrodes 210 and 220 per unit area may be small, and the number of the light-emitting elements 300 disposed per unit area may be smaller. However, when the first electrodes 210 of each of the electrode units EU has a quarter-circle shape as shown in, for example, FIG. 3, and a center of curvature is disposed on a peripheral portion of the sub-pixel PXn rather than a center of the sub-pixel PXn, a ratio of an area occupied by the electrode per unit area may increase. That is, the area occupied by the electrodes 210 and 220 per unit area of each sub-pixel PXn is large, and the number of the light-emitting elements 300 disposed per unit area may increase. Accordingly, in the display apparatus 10, an amount of light emission per unit area of each sub-pixel PXn may increase.

In the first electrode unit EU1, the second electrode 220 may include the electrode protrusion 220P, and in the second to fourth electrode units EU2 to EU4, the second electrode 220 may not include the electrode protrusion 220P. However, in the electrode units EU disposed in each sub-pixel PXn, the second electrodes 220 may be partially connected and integrated. When the second electrode 220 included in one electrode unit EU includes the electrode protrusion 220P, the electrical signal transmitted through the second contact hole CT2 may be transmitted to the second electrode 220 of another electrode unit EU in the same sub-pixel PXn.

As shown in FIG. 3, when each of the sub-pixels PXn includes the plurality of electrode units EU, the second electrodes 220 between the electrode units EU may be partially connected to each other. According to one embodiment, in the display apparatus 10, at least some regions of the second electrodes 220 of the electrode units EU disposed in each sub-pixel PXn may be connected to each other and integrated. For example, the second electrode 220 of the first electrode unit EU1 may be partially integrated with the second electrode 220 of the second electrode unit EU2 and the second electrode 220 of the fourth electrode unit EU4. The second electrode 220 of the third electrode unit EU3 may also be partially integrated with the second electrode 220 of the second electrode unit EU2 and the second electrode 220 of the fourth electrode unit EU4. That is, at least some of the second electrodes 220 having different centers of curvature may be directly connected to (e.g., integrally formed with) each other. Accordingly, the first electrodes 210 disposed in each sub-pixel PXn may be disposed to be spaced apart from each other, and the electrical signals transmitted to the second electrode 220 of the first electrode unit EU1 may be transmitted to the second electrodes 220 of the second to fourth electrode units EU2 to EU4. However, the present disclosure is not limited thereto, and the second electrodes 220 of the electrode units EU disposed in each sub-pixel PXn may be disposed to be spaced apart from each other without being connected to each other. In such an embodiment, different electrode units EU may receive electrical signals from the voltage lines connected through the second contact hole CT2 through different electrodes or lines.

A first contact electrode 261 may be disposed on the first electrode 210. In an embodiment, the first contact electrode 261 may have the same shape as the first electrode 210. For example, the first contact electrode 261 may have both short sides extending in one direction and crossing each other similar to the first electrode 210 and a curved outer side connecting (or extending between) the short sides. As will be described below, the first contact electrode 261 may have a width measured in one direction that is greater than that of the first electrode 210 to entirely cover the first electrode 210. However, the present disclosure is not limited thereto.

A second contact electrode 262 may be disposed on the second electrode 220. In an embodiment, the second contact electrode 262 may have the same shape as the electrode curved portion 220R of the second electrode 220. For example, the second contact electrode 262 may have both short sides extending in one direction like the second electrode 220 and curved outer sides connecting (or extending between) the short sides. As will be described below, the second contact electrode 262 may have a width measured in one direction that is greater than that of the second electrode 220 to cover both short sides and both outer sides of the second electrode 220. However, the second contact electrode 262 may not be disposed on the electrode protrusion 220P. In an embodiment in which the first electrode unit EU1 includes the second electrode 220 including the electrode protrusion 220P, the second contact electrode 262 may be disposed only on the electrode curved portion 220R and may not be disposed on the electrode protrusion 220P. On the other hand, for each of the second to fourth electrode units EU2 to EU4 in which the second electrode 220 does not include the electrode protrusion 220P, the second contact electrode 262 may be disposed to cover the second electrode 220. In addition, the second contact electrodes 262 disposed in each sub-pixel PXn may also be partially connected to each other to be integrated into one contact electrode, similar to the second electrode 220. However, the present disclosure is not limited thereto.

The first contact electrode 261 and the second contact electrode 262 may each be electrically connected to at least one end of the light-emitting element 300 and the first electrode 210 or the second electrode 220. As an example, the first contact electrode 261 may be in direct contact with the first electrode 210 and one end of the light-emitting element 300, and the second contact electrode 262 may be in direct contact with the second electrode 220 and the other end of the light-emitting element 300. An electrical signal transmitted to the first electrode 210 and the second electrode 220 may be transmitted to the light-emitting element 300 through the first contact electrode 261 and the second contact electrode 262, respectively. The light-emitting element 300 may receive the electrical signal and emit light in a specific wavelength range.

According to one embodiment, a first separation distance W1, which is a separation distance between the first outer side OS1 of the first electrode 210 and the second outer side OS2 of the second electrode 220, may be greater than a second separation distance W2, which is a separation distance between the first contact electrode 261 and the second contact electrode 262. The light-emitting element 300 may be disposed such that both ends thereof are placed on the first electrode 210 and the second electrode 220, respectively. However, in at least some of the light-emitting elements 300, one or both ends may be disposed between the first electrode 210 and the second electrode 220. The contact electrodes 261 and 262 are disposed such that the second separation distance W2 therebetween is less than the first separation distance W1 between the electrodes 210 and 220 and, thus, may be in contact with the light-emitting elements 300 disposed between the electrodes 210 and 220. Because the second separation distance W2 is less than the first separation distance W1 between the electrodes 210 and 220, the contact electrodes 261 and 262 may be in contact with both ends of the light-emitting element 300 even though one end (or both ends) of the light-emitting element 300 is not placed on the electrodes 210 and 220 and disposed therebetween. However, the present disclosure is not limited thereto.

The outer bank 450 may be disposed at a boundary between each of the sub-pixels PXn. The outer bank 450 may be disposed to extend at least in the second direction DR2 and surround (or extend around a periphery of) some of the inner banks 410 and 420 and the electrodes 210 and 220, including the region in which the light-emitting element 300 is disposed between the inner banks 410 and 420 and between the electrodes 210 and 220. In addition, the outer bank 450 may include a portion extending in the first direction DR1 to form a grid pattern on the entire surface of the display region DPA. However, the present disclosure is not limited thereto, and in some embodiments, the outer bank 450 may be omitted.

Hereinafter, a stacked structure of the display apparatus 10 will be described in detail with further reference to other drawings.

Figure 5:
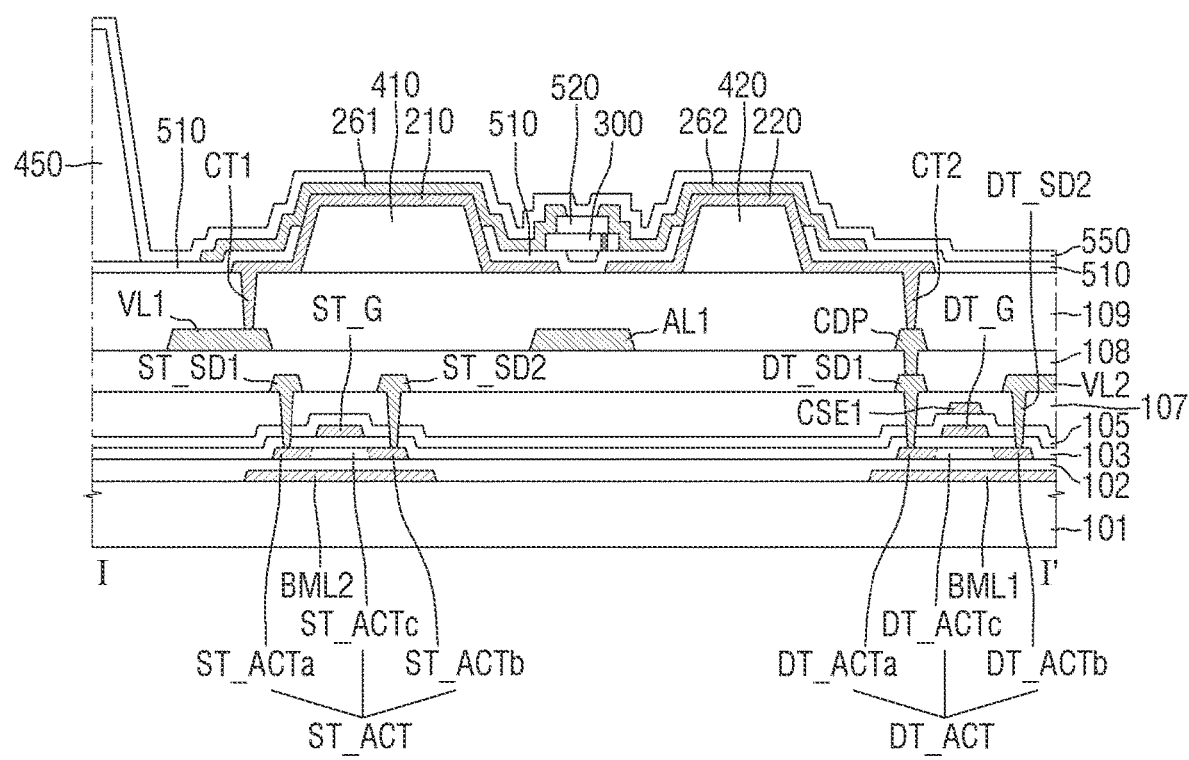
FIG. 5 is a cross-sectional view taken along the line I-I' of FIG. 3.

FIG. 5 is a cross-sectional view taken along the line I-I' of FIG. 3.

Although FIG. 5 illustrates only a partial cross-section of the sub-pixel shown in FIG. 3, the description of FIG. 5 may be equally applied to other pixels PX or sub-pixels PXn. FIG. 5 illustrates a cross section crossing one end and the other end of the light-emitting element 300 disposed in the first sub-pixel PX1 of FIG. 3.

Referring to FIG. 5, the display apparatus 10 may include a circuit element layer and a display element layer disposed on a first substrate 101. A semiconductor layer, a plurality of conductive layers, and a plurality of insulating layers are disposed on the first substrate 101, each of which may constitute the circuit element layer and the display element layer. The plurality of conductive layers may include a first gate conductive layer, a second gate conductive layer, a first data conductive layer, and a second data conductive layer disposed below a first planarization layer 109 to form the circuit element layer, and electrodes 210 and 220 and contact electrodes 260 disposed on the first planarization layer 109 to form the display element layer. The plurality of insulating layers may include a buffer layer 102, a first gate insulating layer 103, a first protective layer 105, a first interlayer insulating layer 107, a second interlayer insulating layer 108, the first planarization layer 109, a first insulating layer 510, a second insulating layer 520, a third insulating layer 550, and the like.

The circuit element layer may include circuit elements and a plurality of lines for driving the light-emitting element 300, such as, a driving transistor DT, a switching transistor ST, a first conductive pattern CDP, a plurality of alignment lines AL1, and a plurality of voltage lines VL1 and VL2, and the display element layer may include the light-emitting element 300 and the first electrode 210, the second electrode 220, the first contact electrode 261, the second contact electrode 262, and the like.

The first substrate 101 may be an insulating substrate. The first substrate 101 may be made of an insulating material, such as glass, quartz, a polymer resin, or the like. In addition, the first substrate 101 may be a rigid substrate or a flexible substrate that is bendable, foldable, rollable, or the like.

Light-blocking layers BML1 and BML2 may be disposed on the first substrate 101. The light-blocking layers BML1 and BML2 may include a first light-blocking layer BML1 and a second light-blocking layer BML2. The first light-blocking layer BML1 and the second light-blocking layer BML2 are disposed to at least respectively overlap a first active material layer DT_ACT of the driving transistor DT and a second active material layer ST_ACT of the switching transistor ST. The light-blocking layers BML1 and BML2 may include light-blocking materials to prevent light from being incident on the first and second active material layers DT_ACT and ST_ACT. As an example, the first and second light-blocking layers BML1 and BML2 may be made of opaque metal materials that block light from being transmitted therethrough. However, the present disclosure is not limited thereto, and in some embodiments, the light-blocking layers BML1 and BML2 may be omitted. The first light-blocking layer BML1 may be electrically connected to a first source/drain electrode DT_SD1 of the driving transistor DT, which will be described below, and the second light-blocking layer BML2 may be electrically connected to a first source/drain electrode ST_SD1 of the switching transistor ST.

The buffer layer 102 may be entirely disposed on the first substrate 101, including on the light-blocking layers BML1 and BML2. The buffer layer 102 may be formed on the first substrate 101 to protect the transistors DT and ST of the pixel PX from moisture permeating through the first substrate 101, which is vulnerable to moisture permeation, and may provide surface planarization. The buffer layer 102 may be formed of a single inorganic layer or a plurality of inorganic layers alternately stacked or stacked in multiple layers. For example, the buffer layer 102 may be formed as multiple layers in which inorganic layers including at least one of silicon oxide ($SiO_x$), silicon nitride ($SiN_x$), and silicon oxynitride ($SiO_xN_y$) are alternately stacked.

The semiconductor layer is disposed on the buffer layer 102. The semiconductor layer may include the first active material layer DT_ACT of the driving transistor DT and the second active material layer ST_ACT of the switching transistor ST. The first active material layer DT_ACT and the second active material layer ST_ACT may be disposed to partially overlap gate electrodes DT_G and ST_G or the like of the first gate conductive layer, to be described below.

In an embodiment, the semiconductor layer may include polycrystalline silicon, single-crystalline silicon, an oxide semiconductor, and the like. The polycrystalline silicon may be formed by crystallizing amorphous silicon. Examples of the crystallization method may include rapid thermal annealing (RTA) method, solid phase crystallization (SPC) method, excimer laser annealing (ELA) method, metal induced lateral crystallization (MILC) method, and sequential lateral solidification (SLS) method, and the like, but the present disclosure is not limited thereto. When the semiconductor layer includes polycrystalline silicon, the first active material layer DT_ACT may include a first doped region DT_ACTa, a second doped region DT_ACTb, and a first channel region DT_ACTc. The first channel region DT_ACTc may be disposed between the first doped region DT_ACTa and the second doped region DT_ACTb. The second active material layer ST_ACT may include a third doped region ST_ACTa, a fourth doped region ST_ACTb, and a second channel region ST_ACTc. The second channel region ST_ACTc may be disposed between the third doped region ST_ACTa and the fourth doped region ST_ACTb. The first doped region DT_ACTa, the second doped region DT_ACTb, the third doped region ST_ACTa, and the fourth doped region ST_ACTb may be partial regions of each of the first active material layer DT_ACT and the second active material layer ST_ACT that is doped with impurities and may be source/drain regions of the first active material layer DT_ACT and the second active material layer ST_ACT.

In an embodiment, the first active material layer DT_ACT and the second active material layer ST_ACT may include an oxide semiconductor. In such an embodiment, the doped region of each of the first active material layer DT_ACT and the second active material layer ST_ACT may be a region that has become (or has been made to be) conductive. The oxide semiconductor may be an oxide semiconductor including indium (In). In some embodiments, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), or the like. However, the present disclosure is not limited thereto.

The first gate insulating layer 103 is disposed on the semiconductor layer and the buffer layer 102. The first gate insulating layer 103 may act as gate insulating films of the driving transistor DT and the switching transistor ST. The first gate insulating layer 103 may be formed as a single inorganic layer including an inorganic material, such as silicon oxide ($SiO_x$), silicon nitride ($SiN_x$), and silicon oxynitride ($SiO_xN_y$), or may be formed as a structure in which the inorganic layers are alternately stacked or are stacked in multiple layers.

The first gate conductive layer is disposed on the first gate insulating layer 103. The first gate conductive layer may include a first gate electrode DT_G of the driving transistor DT and a second gate electrode ST_G of the switching transistor ST. The first gate electrode DT_G is disposed to overlap at least a partial region of the first active material layer DT_ACT, and the second gate electrode ST_G is disposed to overlap at least a partial region of the second active material layer ST_ACT. For example, the first gate electrode DT_G may be disposed to overlap the first channel region DT_ACTc of the first active material layer DT_ACT in a thickness direction, and the second gate electrode ST_G may be disposed to overlap the second channel region ST_ACTc of the second active material layer ST_ACT in the thickness direction.

The first gate conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first protective layer 105 is disposed on the first gate conductive layer. The first protective layer 105 may be disposed to cover the first gate conductive layer and may protect the first gate conductive layer. The first protective layer 105 may be formed as a single inorganic layer including an inorganic material, such as silicon oxide ($SiO_x$), silicon nitride ($SiN_x$), and silicon oxynitride ($SiO_xN_y$), or may be formed as a structure in which the inorganic layers are alternately stacked or are stacked in multiple layers.

The second gate conductive layer is disposed on the first protective layer 105. The second gate conductive layer may include a first capacitor electrode CSE1 of a storage capacitor disposed so that at least a partial region thereof overlaps the first gate electrode DT_G in the thickness direction. The first capacitor electrode CSE1 and the first gate electrode DT_G may overlap each other in the thickness direction with the first protective layer 105 interposed therebetween, and the storage capacitor may be formed therebetween. The second gate conductive layer may be formed as a single layer or as multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first interlayer insulating layer 107 is disposed on the second gate conductive layer. The first interlayer insulating layer 107 may act as an insulating film between the second gate conductive layer and other layers disposed thereon. The first interlayer insulating layer 107 may be formed as a single inorganic layer including an inorganic material, such as silicon oxide ($SiO_x$), silicon nitride ($SiN_x$), and silicon oxynitride ($SiO_xN_y$), or may be formed as a structure in which the inorganic layers are alternately stacked or are stacked in multiple layers.

The first data conductive layer is disposed on the first interlayer insulating layer 107. The first gate conductive layer may include the first source/drain electrode DT_SD1 and a second source/drain electrode DT_SD2 of the driving transistor DT, the first source/drain electrode ST_SD1 and a second source/drain electrode ST_SD2 of the switching transistor ST, and a second voltage line VL2.

The first source/drain electrode DT_SD1 and the second source/drain electrode DT_SD2 of the driving transistor DT may be in contact with the first doped region DT_ACTa and the second doped region DT_ACTb of the first active material layer DT_ACT, respectively, through contact holes (e.g., contact openings) passing through the first interlayer insulating layer 107 and the first gate insulating layer 103. The first source/drain electrode ST_SD1 and the second source/drain electrode ST_SD2 of the switching transistor ST may be in contact with the third doped region ST_ACTa and the fourth doped region ST_ACTb of the second active material layer ST_ACT, respectively, through contact holes (e.g., contact openings) passing through the first interlayer insulating layer 107 and the first gate insulating layer 103. In addition, the first source/drain electrode DT_SD1 of the driving transistor DT and the first source/drain electrode ST_SD1 of the switching transistor ST may be electrically connected to the first light-blocking layer BML1 and the second light-blocking layer BML2, respectively, through other contact holes (e.g., other contact openings). In the first source/drain electrodes DT_SD1 and ST_SD1 and the second source/drain electrodes DT_SD2 and ST_SD2 of the driving transistor DT and the switching transistor ST, when one electrode is a source electrode, the other electrode may be a drain electrode. However, the present disclosure is not limited thereto, and in the first source/drain electrodes DT_SD1 and ST_SD1 and the second source/drain electrodes DT_SD2 and ST_SD2, when one electrode is a drain electrode, the other electrode may be a source electrode.

The second voltage line VL2 may be connected to one of the source/drain electrodes DT_SD1 and DT_SD2 of the driving transistor DT. For example, the second voltage line VL2 may be electrically connected to the second source/drain electrode DT_SD2 of the driving transistor DT. A high potential voltage (e.g., a second power voltage VDD) supplied to the driving transistor DT may be applied to the second voltage line VL2. The driving transistor DT may be electrically connected to the second electrode 220, as will be described below, and the second power voltage VDD applied through the second voltage line VL2 may be transmitted to the second electrode 220 through the driving transistor DT.

The first data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The second interlayer insulating layer 108 may be disposed on the first data conductive layer. The second interlayer insulating layer 108 may be entirely disposed on the first interlayer insulating layer 107 while covering the first data conductive layer and may protect the first data conductive layer. The second interlayer insulating layer 108 may be formed as a single inorganic layer including an inorganic material such as silicon oxide ($SiO_x$), silicon nitride ($SiN_x$), and silicon oxynitride ($SiO_xN_y$), or may be formed as a structure in which the inorganic layers are alternately stacked or are stacked in multiple layers.

The second data conductive layer is disposed on the second interlayer insulating layer 108. The second data conductive layer may include a first voltage line VL1, a first alignment line AL1, and the first conductive pattern CDP. A low potential voltage (e.g., a first power voltage VSS) supplied to the first electrode 210 may be applied to the first voltage line VL1.

An alignment signal required to align the light-emitting elements 300 during a manufacturing process of the display apparatus 10 may be applied to the first alignment line AL1, and the first alignment line AL1 may be electrically connected to the second electrode 220 to transmit the alignment signal to the second electrode 220. The alignment signal may also be applied to the first voltage line VL1 during the manufacturing process of the display apparatus 10, and the first voltage line VL1 may transmit the alignment signal to the first electrode 210. The first alignment line AL1 may be patterned in a subsequent process after the light-emitting elements 300 are aligned, and an electrical signal may not be applied thereto when the display apparatus 10 is driven. As will be described below, the first alignment line AL1 may be electrically connected to the second electrode 220 through the third contact hole CT3 passing through a second inner bank 420 and the first planarization layer 109.

The first conductive pattern CDP may be electrically connected to the first source/drain electrode DT_SD1 of the driving transistor DT through a contact hole (e.g., a contact opening) formed in the second interlayer insulating layer 108. The first conductive pattern CDP may also be electrically connected to the second electrode 220, which will be described below, and the driving transistor DT may transmit the second power voltage VDD applied from the second voltage line VL2 to the second electrode 220 through the first conductive pattern CDP.

In FIG. 5, the second data conductive layer is illustrated as including one first alignment line AL1, but the present disclosure is not limited thereto. The first alignment line AL1 may be disposed in a greater number according to the number of the electrodes 210 and 220 disposed in each sub-pixel PXn. For example, when the number of the second electrodes 220 disposed in each sub-pixel PXn is greater, the first alignment line AL1 may be disposed in a greater number. However, the present disclosure is not limited thereto, and when each sub-pixel PXn further includes other electrodes, other alignment lines other than the first alignment line AL1 may be further disposed in the second data conductive layer.

The second data conductive layer may be formed as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first planarization layer 109 is disposed on the second data conductive layer. The first planarization layer 109 may include an organic insulating material and provide surface planarization.

Inner banks 410 and 420, a plurality of electrodes 210 and 220, an outer bank 450, a plurality of contact electrodes 260, and the light-emitting element 300 are disposed on the first planarization layer 109. Further, a plurality of insulating layers 510, 520, and 550 may be further disposed on the first planarization layer 109.

The inner banks 410 and 420 are disposed directly on the first planarization layer 109. The inner banks 410 and 420 may include a first inner bank 410 and a second inner bank 420 disposed adjacent to a center portion of each pixel PX or sub-pixel PXn.

The first inner bank 410 and the second inner bank 420 may have shapes similar to those of the first electrode 210 and the second electrode 220 in a plan view, respectively. For example, similar to the first electrode 210, the first inner bank 410 may have both short sides crossing each other and having ends connected to each other and a curved outer side connecting (or extending between) the other sides of both short sides. Similar to the electrode curved portion 220R of the second electrode 220, the second inner bank 420 may have both short sides extending in directions crossing each other and both curved outer sides that interconnect both ends of each of the both short sides. For example, the first inner bank 410 may have a quarter-circle shape in a plan view, and the second inner bank 420 may have a curved shape to be spaced apart from and face the curved outer side of the first inner bank 410. The first inner bank 410 and the second inner bank 420 may also be disposed to be spaced apart from each other, and the curved outer side of the first inner bank 410 may be spaced apart from and face one of the curved outer sides of the second inner bank 420.

The first inner bank 410 and the second inner bank 420 may be disposed in each sub-pixel PXn to form a pattern on the entire surface of the display apparatus 10. By disposing the inner banks 410 and 420 to be spaced apart from each other and face each other, a region in which the light-emitting element 300 is disposed may be formed therebetween. In FIG. 5, only one first inner bank 410 and one second inner bank 420 are illustrated, but the present disclosure is not limited thereto. The first inner bank 410 and the second inner bank 420 disposed in each sub-pixel PXn may vary depending on the number of the electrodes 210 and 220.

Further, each of the first inner bank 410 and the second inner bank 420 may have a structure in which at least a portion thereof protrudes with respect to an upper surface of the first planarization layer 109. The protruding portion of each of the first inner bank 410 and the second inner bank 420 may have inclined side surfaces, and light emitted from the light-emitting element 300 disposed between the first inner bank 410 and the second inner bank 420 may travel toward the inclined side surfaces of the inner banks 410 and 420. As will be described below, when the electrodes 210 and 220 respectively disposed on the inner banks 410 and 420 include a material having a high reflectance, the light emitted from the light-emitting element 300 may be reflected from the side surfaces of the inner banks 410 and 420 to be emitted in an upward direction with respect to the first substrate 101. For example, the inner banks 410 and 420 may provide a region in which the light-emitting element 300 is disposed and may also act as a reflective partition wall that reflects the light emitted from the light-emitting element 300 upwardly. In an embodiment, the inner banks 410 and 420 may include an organic insulating material, such as polyimide (PI), but the present disclosure is not limited thereto.

The plurality of electrodes 210 and 220 are disposed on the inner banks 410 and 420 and the first planarization layer 109. The plurality of first electrodes 210 may be disposed on the first inner bank 410, and the second electrode 220 may be disposed on the second inner bank 420.

The first electrode 210 may be disposed to cover the first inner bank 410. For example, the first electrode 210 may be formed to have the same shape as the first inner bank 410 but have a greater width and, thus, may be disposed to cover an outer surface of the first inner bank 410. Accordingly, a portion of a lower surface of the first electrode 210 may be disposed on the first inner bank 410, and another portion thereof may be disposed on the first planarization layer 109. The first contact hole CT1 may be formed in a portion of the first electrode 210 disposed on the first planarization layer 109. The first contact hole CT1 may pass through the first planarization layer 109 to expose a portion of an upper surface of the first voltage line VL1. The first electrode 210 may be in contact with the first voltage line VL1 through the first contact hole CT1, and the first electrode 210 may be electrically connected to the first voltage line VL1.

The second electrode 220 may be disposed to cover the second inner bank 420. For example, the second electrode 220 may be formed to have the same shape as the first inner bank 410 but have a greater width and, thus, may be disposed to cover an outer surface of the second inner bank 420. Accordingly, a portion of a lower surface of the second electrode 220 may be disposed on the second inner bank 420, and another portion thereof may be disposed on the first planarization layer 109. In addition, the second electrode 220 may include an electrode protrusion 220P disposed directly on the first planarization layer 109. The second contact hole CT2 may be formed in the electrode protrusion 220P of the second electrode 220. The second contact hole CT2 may pass through the first planarization layer 109 to expose a portion of an upper surface of the first conductive pattern CDP. The second electrode 220 may be in contact with the first conductive pattern CDP through the second contact hole CT2, and the second electrode 220 may be electrically connected to the first source/drain electrode DT_SD1 of the driving transistor DT through the first conductive pattern CDP.

Further, the third contact hole CT3 may be formed in a portion of the second electrode 220 disposed on the second inner bank 420. The third contact hole CT3 may pass through the second inner bank 420 and the first planarization layer 109 to expose a portion of an upper surface of the first alignment line AL1, and the second electrode 220 may be in direct contact with the first alignment line AL1. A description thereof will be provided below with reference to other drawings.

The plurality of electrodes 210 and 220 may be electrically connected to the light-emitting elements 300 and may receive a voltage (e.g., a predetermined voltage) to allow the light-emitting element 300 to emit light. For example, the plurality of electrodes 210 and 220 may be electrically connected to the light-emitting element 300 through the contact electrodes 260, which will be described below, and may transmit an electrical signal applied to the electrodes 210 and 220 to the light-emitting element 300 through the contact electrodes 260.

In an embodiment, one of the first electrode 210 and the second electrode 220 is an anode of the light-emitting element 300, and the other one may be a cathode of the light-emitting element 300. For example, the first electrode 210 may be a cathode, and the second electrode 220 may be an anode; but the present disclosure is not limited thereto, and the reverse of the above description may be possible.

Further, each of the electrodes 210 and 220 may be utilized to form an electric field in the sub-pixel PXn, thereby aligning the light-emitting element 300. The light-emitting element 300 may be disposed between the first electrode 210 and the second electrode 220 through a process of forming an electric field between the first electrode 210 and the second electrode 220 by applying an alignment signal to the first electrode 210 and the second electrode 220. For example, the light-emitting elements 300 may be sprayed (or deposited) onto the first electrode 210 and the second electrode 220 in a state of being dispersed in an ink through an inkjet process, and may be aligned between the first electrode 210 and the second electrode 220 through a method of applying a dielectrophoretic force to the light-emitting elements 300 by applying the alignment signal between the first electrode 210 and the second electrode 220.

Each of the electrodes 210 and 220 may include a transparent conductive material. As an example, each of the electrodes 210 and 220 may include materials such as indium tin oxide (ITO), indium zinc oxide (IZO), indium tin-zinc oxide (ITZO), and the like, but the present disclosure is not limited thereto. In some embodiments, each of the electrodes 210 and 220 may include a conductive material having a high reflectance. For example, each of the electrodes 210 and 220 may include a metal, such as silver (Ag), copper (Cu), aluminum (Al), or the like as the material having a high reflectance. In such an embodiment, each of the electrodes 210 and 220 may reflect light that is emitted from the light-emitting element 300 and travels to the side surfaces of the first inner bank 410 and the second inner bank 420 in an upward direction with respect to each sub-pixel PXn.

The present disclosure is not limited thereto, and each of the electrodes 210 and 220 may be formed in a structure in which one or more layers of a transparent conductive material and a metal layer having a high reflectance are stacked or are formed as a single layer including the transparent conductive material and the metal layer. In an embodiment, each of the electrodes 210 and 220 may have a stacked structure of ITO/Ag/ITO/IZO or may be an alloy including Al, Ni, lanthanum (La), and the like.

The first insulating layer 510 is disposed on the first planarization layer 109, the first electrode 210, and the second electrode 220. The first insulating layer 510 may be disposed on a side opposite to the region between the inner banks 410 and 420 with respect to the inner banks 410 and 420 in addition to the region between the electrodes 210 and 220 or between the inner banks 410 and 420 being spaced apart from each other. In addition, the first insulating layer 510 is disposed to partially cover the first electrode 210 and the second electrode 220. For example, the first insulating layer 510 may be entirely disposed on the first planarization layer 109, including the first electrode 210 and the second electrode 220, and may be disposed to expose a portion of an upper surface of each of the first electrode 210 and the second electrode 220. An opening) partially exposing the first electrode 210 and the second electrode 220 may be formed in the first insulating layer 510, and the first insulating layer 510 may be disposed to cover only one side and the other side of each of the first electrode 210 and the second electrode 220. Some portions of the first electrode 210 and the second electrode 220, which are disposed on the inner banks 410 and 420, may be partially exposed due to (or through) the opening.

The first insulating layer 510 may protect the first electrode 210 and the second electrode 220 and may insulate the first electrode 210 from the second electrode 220. In addition, the light-emitting element 300 disposed on the first insulating layer 510 may not come into direct contact with other members, thereby preventing damage. However, the shape and structure of the first insulating layer 510 are not limited thereto.

In an embodiment, a step difference may be formed on a portion of an upper surface of the first insulating layer 510 between the first electrode 210 and the second electrode 220. In some embodiments, the first insulating layer 510 may include an inorganic insulating material, and a portion of the upper surface of the first insulating layer 510 disposed to partially cover the first electrode 210 and the second electrode 220 may be stepped due to the step difference that is formed by the electrodes 210 and 220 disposed below the first insulating layer 510. Accordingly, the light-emitting element 300, which is disposed on the first insulating layer 510 between the first electrode 210 and the second electrode 220, may form an empty space between the light-emitting element 300 and the upper surface of the first insulating layer 510. The empty space may be filled with a material forming the second insulating layer 520, which will be described below.

The outer bank 450 may be disposed on the first insulating layer 510. As described above, the outer bank 450 may be disposed at the boundary between each of the sub-pixels PXn. The outer bank 450 may be disposed to surround the inner banks 410 and 420 and the electrodes 210 and 220, including a region in which the light-emitting element 300 is disposed between the inner banks 410 and 420 and between the electrodes 210 and 220.

According to one embodiment, a height of the outer bank 450 may be greater than a height of each of the inner banks 410 and 420. Different from the inner banks 410 and 420, the outer bank 450 may divide adjacent sub-pixels PXn and, as will be described below, prevent the ink from overflowing to the adjacent sub-pixels PXn during the inkjet printing process for disposing the light-emitting element 300 during the manufacturing process of the display apparatus 10. For example, the outer bank 450 may separate inks in which different light-emitting elements 300 are dispersed in different sub-pixels PXn from each other so as to prevent the inks from being mixed with each other.

The light-emitting element 300 may be disposed in a region formed between the first electrode 210 and the second electrode 220, or between the first inner bank 410 and the second inner bank 420. For example, the light-emitting element 300 may be disposed on the first insulating layer 510 disposed between the inner banks 410 and 420. The light-emitting element 300 may be disposed such that a partial region thereof overlaps each of the electrodes 210 and 220 in the thickness direction. One end of the light-emitting element 300 may overlap the first electrode 210 in the thickness direction and may be placed on the first electrode 210, and the other end thereof may overlap the second electrode 220 in the thickness direction and may be placed on the second electrode 220. However, the present disclosure is not limited thereto, and at least some of the light-emitting elements 300 disposed in each sub-pixel PXn may be disposed in regions other than a region formed between the inner banks 410 and 420, for example, regions between the inner banks 410 and 420 and the outer bank 450.

The light-emitting element 300 may include a plurality of layers disposed therein in a direction parallel to an upper surface of the first substrate 101 or the first planarization layer 109. The light-emitting element 300 of the display apparatus 10, according to one embodiment, may have a shape extending in one direction and may have a structure in which a plurality of semiconductor layers are sequentially disposed in the one direction. The light-emitting element 300 may be disposed such that the one direction in which the light-emitting element 300 extends is parallel to the first planarization layer 109, and a plurality of semiconductor layers included in the light-emitting element 300 may be sequentially disposed in the direction parallel to the upper surface of the first planarization layer 109. However, the present disclosure is not limited thereto. In some embodiments, when the light-emitting element 300 has a different structure, the plurality of layers may be disposed in a direction perpendicular to the first planarization layer 109.

The second insulating layer 520 may be partially disposed on the light-emitting element 300, which is disposed between the first electrode 210 and the second electrode 220. For example, the second insulating layer 520 may be disposed to partially surround the outer surface of the light-emitting element 300 and, thus, may protect the light-emitting element 300 and fix the light-emitting element 300 during the manufacturing process of the display apparatus 10. A portion of the second insulating layer 520 disposed on the light-emitting element 300 may have a shape curved in the same direction as the outer sides OS1, OS2, and OS3 between the first electrode 210 and the second electrode 220 in a plan view. As an example, the second insulating layer 520 may form a curved pattern, such as an arc in each sub-pixel PXn.

The second insulating layer 520 may be disposed on the light-emitting element 300 and may expose one end and the other end of the light-emitting element 300. The exposed ends of the light-emitting element 300 may be in contact with the contact electrodes 260, which will be described below. Such a shape of the second insulating layer 520 may be formed by a patterning process using a material forming the second insulating layer 520 by using a known mask process. A mask for forming the second insulating layer 520 has a width less than a length of the light-emitting element 300, and the material forming the second insulating layer 520 may be patterned to expose both ends of the light-emitting element 300. However, the present disclosure is not limited thereto.

Further, in an embodiment, a portion of the material of the second insulating layer 520 may be disposed between the first insulating layer 510 and a lower surface of the light-emitting element 300. The second insulating layer 520 may be formed to fill a space between the first insulating layer 510 and the light-emitting element 300, which is formed during the manufacturing process of the display apparatus 10. Accordingly, the second insulating layer 520 may be formed to surround the outer surface of the light-emitting element 300. However, the present disclosure is not limited thereto.

The plurality of contact electrodes 260 may be disposed on the second insulating layer 520. As described above, the contact electrodes 260 may include the first contact electrode 261 and the second contact electrode 262. The first contact electrode 261 and the second contact electrode 262 may be in contact with one end and the other end of the light-emitting element 300, respectively, and may also be in contact with the first electrode 210 and the second electrode 220, respectively. In some embodiments, the upper surface of each of the first electrode 210 and the second electrode 220 may be partially exposed, and the first contact electrode 261 and the second contact electrode 262 may be in contact with the exposed upper surfaces of the first electrode 210 and the second electrode 220, respectively. For example, the first contact electrode 261 may be in contact with a portion of the first electrode 210, which is located on the first inner bank 410, and the second contact electrode 262 may be in contact with a portion of the second electrode 220, which is located on the second inner bank 420. However, the present disclosure is not limited thereto, and in some embodiments, the widths of the first contact electrode 261 and the second contact electrode 262 may be formed to be less than those of the first electrode 210 and the second electrode 220, respectively, and the first contact electrode 261 and the second contact electrode 262 may be disposed to cover only the exposed portions of the upper surfaces of the first electrode 210 and the second electrode 220, respectively. In addition, at least a partial region of each of the first contact electrode 261 and the second contact electrode 262 is disposed on the first insulating layer 510.

According to one embodiment, the light-emitting element 300 has the semiconductor layer exposed on both end surfaces thereof in an extending direction, and the first contact electrode 261 and the second contact electrode 262 may be in contact with the light-emitting element 300 on the end surfaces where the semiconductor layer is exposed. However, the present disclosure is not limited thereto. In some embodiments, both end side surfaces of the light-emitting element 300 may be partially exposed. During the manufacturing process of the display apparatus 10, an insulating film 380 (see, e.g., FIG. 9) surrounding an outer surface of the semiconductor layer of the light-emitting element 300 may be partially removed in a process of forming the second insulating layer 520 covering the outer surface of the light-emitting element 300, and the exposed side surface of the light-emitting element 300 may be in contact with the first contact electrode 261 and the second contact electrode 262. One end of the light-emitting element 300 may be electrically connected to the first electrode 210 through the first contact electrode 261, and the other end thereof may be electrically connected to the second electrode 220 through the second contact electrode 262.

In addition, at least a portion of each of the first contact electrode 261 and the second contact electrode 262 is disposed on the second insulating layer 520. The first contact electrode 261 and the second contact electrode 262 are disposed to be spaced apart from each other on the second insulating layer 520, and side surfaces thereof that are spaced apart from each other and face each other may be disposed on the second insulating layer 520. The second insulating layer 520 may include an organic insulating material, and the first contact electrode 261 and the second contact electrode 262 may be formed together in the same process. The first contact electrode 261 and the second contact electrode 262 may be electrically insulated from each other without being in direct contact with (e.g., by being spaced apart from) each other. However, the present disclosure is not limited thereto, and an insulating layer may be further disposed between the first contact electrode 261 and the second contact electrode 262. The insulating layer may prevent the first contact electrode 261 and the second contact electrode 262 from being in direct contact with each other.

The contact electrode 260 may include a conductive material. For example, the contact electrode 260 may include ITO, IZO, ITZO, aluminum (Al), or the like. As an example, the contact electrode 260 may include a transparent conductive material, and light emitted from the light-emitting element 300 may pass through the contact electrode 260 to travel toward the electrodes 210 and 220. Each of the electrodes 210 and 220 may include a material having a high reflectance, and the electrodes 210 and 220 disposed on the inclined side surfaces of the inner banks 410 and 420 may reflect incident light in an upward direction with respect to the first substrate 101. However, the present disclosure is not limited thereto.

The third insulating layer 550 may be entirely disposed on the first substrate 101. The third insulating layer 550 may protect members disposed on the first substrate 101 from an external environment.

Each of the first insulating layer 510, the second insulating layer 520, and the third insulating layer 550, which are described above, may include an inorganic insulating material or an organic insulating material. In an embodiment, the first insulating layer 510, the second insulating layer 520, and the third insulating layer 550 may each include an inorganic insulating material, such as silicon oxide ($SiO_x$), silicon nitride ($SiN_x$), silicon oxynitride ($SiO_xN_y$), aluminum oxide ($Al_xO_y$), aluminum nitride ($Al_xN_y$), or the like. In some embodiments, the first insulating layer 510, the second insulating layer 520, and the third insulating layer 550 may each include an organic insulating material, such as an acrylic resin, an epoxy resin, a phenol resin, a polyamide resin, a polyimide (PI) resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the present disclosure is not limited thereto.

As described above, the first electrode 210 and the second electrode 220 disposed in each sub-pixel PXn may be used to align the light-emitting element 300 during the manufacturing process of the display apparatus 10. As an example, the first electrode 210 and the second electrode 220 may be electrically connected to the first voltage line VL1 and the first alignment line AL1 disposed in the second data conductive layer, and an alignment signal may be transmitted through first voltage line VL1 and the first alignment line AL1.

Figure 6:
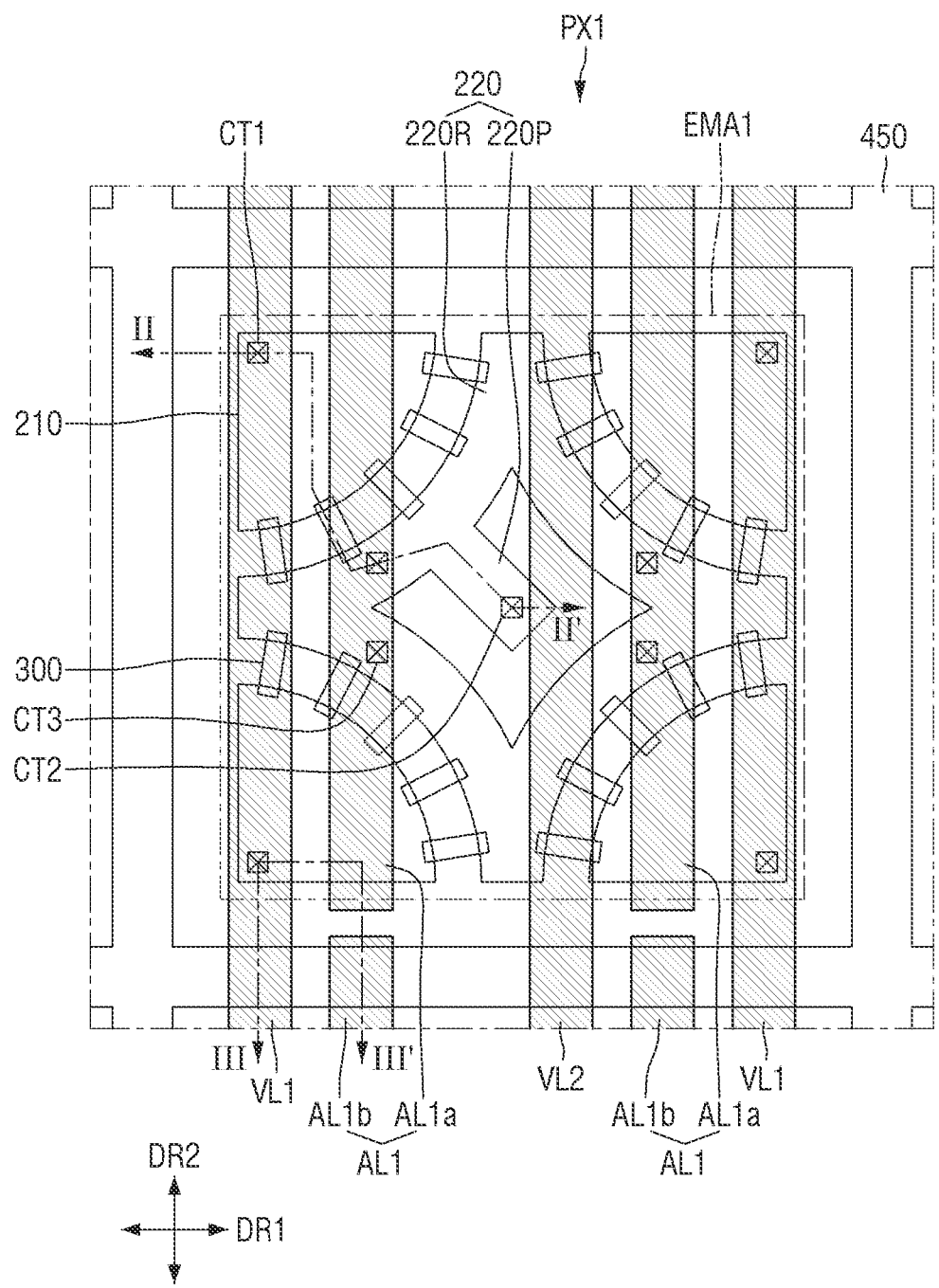
FIG. 6 is a schematic layout diagram illustrating electrode units and alignment lines according to one embodiment.
Figure 7:
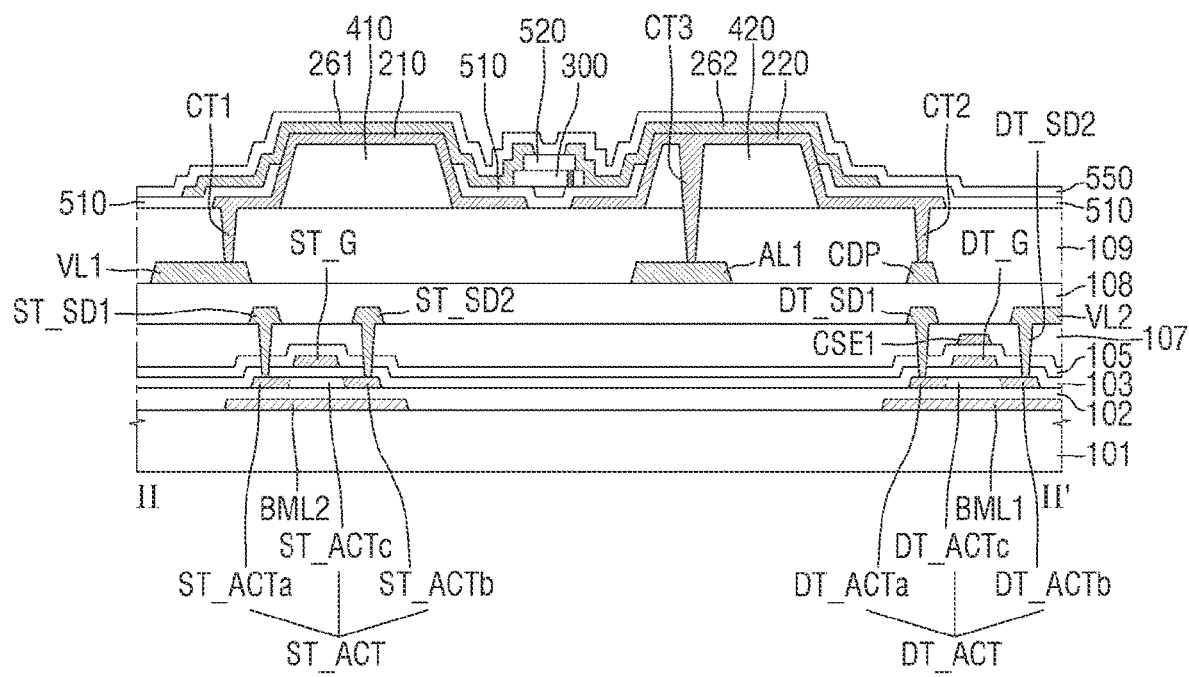
FIG. 7 is a cross-sectional view taken along the line II-II' of FIG. 6.

FIG. 6 is a schematic plan view illustrating electrode units and alignment lines according to one embodiment, and FIG. 7 is a cross-sectional view taken along the line II-II' of FIG. 6.

FIG. 6 illustrates the first voltage lines VL1 and the first alignment lines AL1 of the second data conductive layer, and the second voltage line VL2 of the first data conductive layer in addition to the first electrodes 210, the second electrodes 220, and the outer bank 450 disposed in one sub-pixel PXn. In FIG. 6, only some electrodes and lines are illustrated for convenience of description. FIG. 7 illustrates a cross section crossing the contact holes CT1, CT2, and CT3 formed in the first electrode 210 and the second electrode 220 shown in FIG. 6. Hereinafter, the first voltage lines VL1, the second voltage line VL2, and the first alignment lines AL1 will be described in detail.

Referring to FIGS. 6 and 7, a plurality of first voltage lines VL1, for example, two first voltage lines VL1, may be disposed in each sub-pixel PXn. The first voltage line VL1 may be disposed to overlap the first electrode 210, which is disposed in each sub-pixel PXn, in the thickness direction and may be in contact with the first electrode 210 through the first contact hole CT1. As an example, the first voltage lines VL1 may be disposed on left and right sides, respectively, that are both sides with respect to a center of the sub-pixel PXn. The first voltage line VL1 disposed on the left side of the sub-pixel PXn may be electrically connected to the first electrodes 210 of the first electrode unit EU1 and the fourth electrode unit EU4, and the first voltage line VL1 disposed on the right side of the sub-pixel PXn may be electrically connected to the first electrodes 210 of the second electrode unit EU2 and the third electrode unit EU3. However, the present disclosure is not limited thereto. The number of the first voltage lines VL1 may vary depending on the number of the first electrodes 210 disposed in each sub-pixel PXn.

The first voltage line VL1 may be disposed to extend in the second direction DR2 and may also be disposed in other sub-pixels PXn beyond the boundary with the sub-pixel PXn adjacent in the second direction DR2.

The second voltage line VL2 may also be disposed in each sub-pixel PXn to extend in the second direction DR2. However, different from the first voltage line VL1, one second voltage line VL2 may be disposed in each sub-pixel PXn, but the present disclosure is not limited thereto. The second voltage line VL2 may be disposed in a location adjacent to the electrode protrusion 220P of the second electrode 220. The second voltage line VL2 may be electrically connected to the source/drain electrode of the driving transistor DT, and as described above, the electrode protrusion 220P of the second electrode 220 may be electrically connected to the driving transistor DT through the first conductive pattern CDP connected through the second contact hole CT2.

Similar to the first voltage line VL1, a plurality of first alignment lines AL1, for example, two first alignment lines AL1, may be disposed in each sub-pixel PXn. The first alignment line AL1 may be disposed to overlap the second electrode 220, which is disposed in each sub-pixel PXn, in the thickness direction and may be in contact with the second electrode 220 through the third contact hole CT3. As an example, the first alignment lines AL1 may be disposed on left and right sides, respectively, that are both sides with respect to a center of the sub-pixel PXn. The first alignment line AL1 disposed on the left side of the sub-pixel PXn may be electrically connected to the second electrodes 220 of the first electrode unit EU1 and the fourth electrode unit EU4, and the first alignment line AL1 disposed on the right side of the sub-pixel PXn may be electrically connected to the second electrodes 220 of the second electrode unit EU2 and the third electrode unit EU3. However, the present disclosure is not limited thereto. The number of the first alignment lines AL1 may vary depending on the number of the second electrodes 220 disposed in each sub-pixel PXn.

In the second electrode 220 of each electrode unit EU, the electrode curved portion 220R may be electrically connected to the first alignment line AL1 through the third contact hole CT3. The third contact holes CT3 may be formed in each sub-pixel PXn according to the number of the second electrodes 220 electrically connected to the first alignment line AL1.

Each of the first voltage line VL1, the second voltage line VL2, and the first alignment line AL1 may extend in the second direction DR2 to be connected to pads disposed in the non-display region NDA. The first voltage line VL1, the second voltage line VL2, and the first alignment line AL1 may receive an electrical signal from the pads and may transmit the electrical signal to the respective electrodes 210 and 220.

During the manufacturing process of the display apparatus 10, an alignment signal for aligning the light-emitting element 300 may be applied through the first voltage lines VL1 and the first alignment lines AL1. The alignment signal applied to the first voltage line VL1 may be transmitted to the first electrode 210, and the alignment signal applied to the first alignment line AL1 may be transmitted to the second electrode 220. The alignment signal transmitted to the first electrode 210 and the second electrode 220 may generate an electric field between the first electrode 210 and the second electrode 220, and the light-emitting element 300 may be disposed (or aligned) between the first electrode 210 and the second electrode 220 due to the electric field.

However, when the display apparatus 10 is driven, a driving signal for driving the light-emitting element 300 may be applied through the first voltage line VL1 and the second voltage line VL2. Different electrical signals may be applied to the first electrodes 210 through the same first voltage line VL1 during the manufacturing process and the driving of the display apparatus 10. On the other hand, different signals may be applied to the second electrodes 220 through different lines during the manufacturing process and the driving of the display apparatus 10. From among the lines connected to the second electrode 220, the first alignment line AL1 to which the alignment signal is applied may be partially disconnected after aligning the light-emitting element 300.

Figure 8:
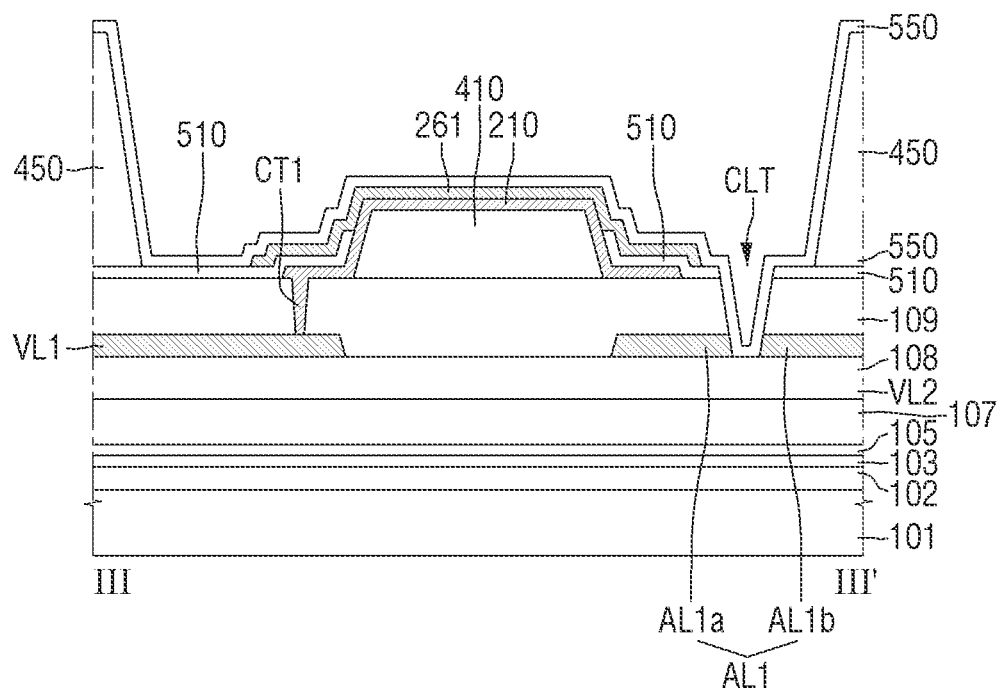
FIG. 8 is a cross-sectional view taken along the line III-III' of FIG. 6.

FIG. 8 is a cross-sectional view taken along the line III-III' of FIG. 6.

Referring to FIGS. 6 and 8, the display apparatus 10 according to one embodiment may include a plurality of floating lines AL1a and AL1b after the first alignment line AL1 is partially disconnected. The first alignment line AL1 disposed in each sub-pixel PXn may include a first floating line AL1a and a second floating line AL1b. The first floating line AL1a and the second floating line AL1b may extend in the second direction DR2 and may be partially disconnected in the non-light-emitting region of each sub-pixel PXn.

As shown in FIG. 8, a line contact hole (e.g., a line contact opening) CLT (see, e.g., FIG. 8) passing through the first planarization layer 109 may be formed in the non-light-emitting region of each sub-pixel PXn. The line contact hole CLT may be formed to expose a portion of the first alignment line AL1 after aligning the light-emitting element 300. The exposed portion of the first alignment line AL1 may be etched and disconnected, and the first alignment line AL1 may be separated into the first floating line AL1a and the second floating line AL1b. The first floating line AL1a may be a line in contact with the second electrode 220 through the third contact hole CT3, and the second floating line AL1b may be a line in contact with the second electrode 220 of another sub-pixel PXn. The first floating line AL1a and the second floating line AL1b may not be electrically connected to each other and may be electrically disconnected from the pads disposed in the non-display region.

During the manufacturing process of the display apparatus 10, an alignment signal may be applied to the second electrode 220 through the first alignment line AL1. When the display apparatus 10 is driven, only an electrical signal applied to the second voltage line VL2 may be transmitted to the second electrode 220, and an electrical signal may not be transmitted to the first alignment line AL1 or the floating lines AL1a and AL1b.

The light-emitting element 300 may be a light-emitting diode and, may be, in one embodiment, an inorganic light-emitting diode having a size of a micrometer scale or a nanometer scale and made of an inorganic material. The inorganic light-emitting diode may be aligned between two electrodes in which polarity is formed when forming an electric field in a specific direction between the two electrodes facing each other. The light-emitting element 300 may be aligned between the two electrodes due to the electric field formed on the two electrodes.

The light-emitting element 300 according to one embodiment may have a shape extending in one direction. The light-emitting element 300 may have a shape of a rod, a wire, a tube, or the like. In an embodiment, the light-emitting element 300 may have a cylindrical shape or a rod shape. However, the shape of the light-emitting element 300 is not limited thereto, and the light-emitting element 300 may have various shapes, including a shape of a cube, a rectangular parallelepiped, a polygonal pillar, such as a hexagonal pillar or the like, or a shape that extends in one direction and has a partially inclined outer surface. A plurality of semiconductors included in the light-emitting element 300, which will be described below, may have a structure in which the semiconductors are sequentially disposed or stacked in the one direction.

The light-emitting element 300 may include a semiconductor layer doped with an arbitrary conductive-type (e.g., a p-type or n-type) impurity. The semiconductor layer may receive an electrical signal applied from an external power source and emit light in a specific wavelength range.

Figure 9:
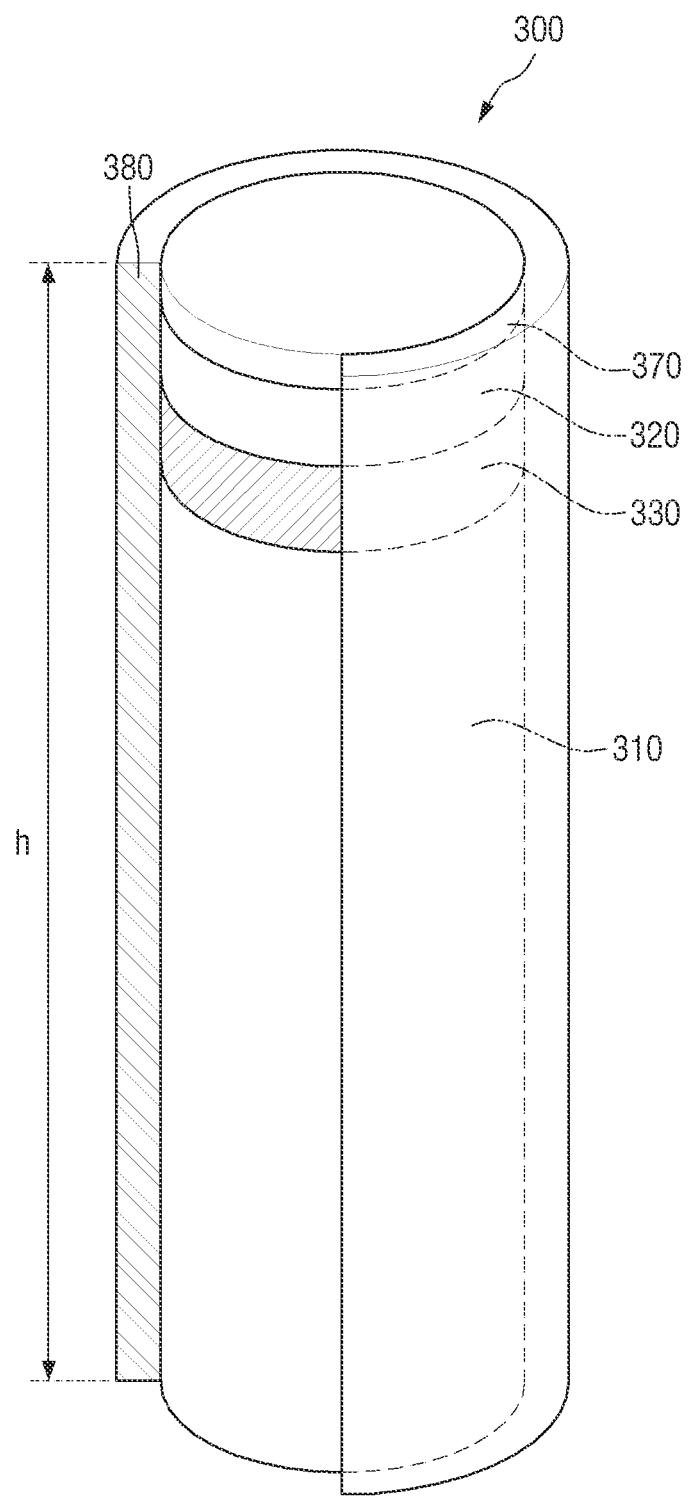
FIG. 9 is a schematic view of a light-emitting element according to one embodiment.

FIG. 9 is a schematic view of the light-emitting element according to one embodiment.

Referring to FIG. 9, the light-emitting element 300 may include a first semiconductor layer 310, a second semiconductor layer 320, an active layer 330, an electrode layer 370, and an insulating film 380.

The first semiconductor layer 310 may be an n-type semiconductor layer. As an example, when the light-emitting element 300 emits light in a blue wavelength range, the first semiconductor layer 310 may include a semiconductor material having a chemical formula of $Al_xGa_yIn_{1-x-y}N$ ($0<=x<=1$, $0<=y<=1$, and $0<=x+y<=1$). For example, the semiconductor material may be one or more from among AlGaInN, GaN, AlGaN, InGaN, AlN, and InN that are doped with an n-type impurity. The first semiconductor layer 310 may be doped with an n-type dopant. As an example, the n-type dopant may be Si, Ge, Sn, or the like. In an embodiment, the first semiconductor layer 310 may be n-GaN doped with n-type Si. A length of the first semiconductor layer 310 may be in a range from about 1.5 μm to about 5 μm, but the present disclosure is not limited thereto.

The second semiconductor layer 320 is disposed on the active layer 330 to be described below. The second semiconductor layer 320 may be a p-type semiconductor. As an example, when the light-emitting element 300 emits light in a blue or green wavelength range, the second semiconductor layer 320 may include a semiconductor material having a chemical formula of $Al_xGa_yIn_{1-x-y}N$ ($0<=x<=1$, $0<=y<=1$, and $0<=x+y<=1$). For example, the semiconductor material may be one or more from among AlGaInN, GaN, AlGaN, InGaN, AlN, and InN that are doped with a p-type impurity. The second semiconductor layer 320 may be doped with a p-type dopant. As an example, the p-type dopant may be Mg, Zn, Ca, Se, Ba, or the like. In an embodiment, the second semiconductor layer 320 may be p-GaN doped with p-type Mg. A length of the second semiconductor layer 320 may be in a range from about 0.05 μm to about 0.10 μm, but the present disclosure is not limited thereto.

Each of the first semiconductor layer 310 and the second semiconductor layer 320 is illustrated in the drawing as being formed as a single layer, but the present disclosure is not limited thereto. According to some embodiments, each of the first semiconductor layer 310 and the second semiconductor layer 320 may further include a greater number of layers, such as a clad layer or a tensile strain barrier reducing (TSBR) layer according to a material of the active layer 330. A description thereof will be provided below with reference to other drawings.

The active layer 330 is disposed between the first semiconductor layer 310 and the second semiconductor layer 320. The active layer 330 may include a material having a single or multiple quantum well structure. When the active layer 330 includes a material having a multiple quantum well structure, the active layer 330 may have a structure in which quantum layers and well layers are alternately stacked. The active layer 330 may emit light due to a combination of electron-hole pairs in response to electrical signals applied through the first semiconductor layer 310 and the second semiconductor layer 320. As an example, when the active layer 330 emits light in a blue wavelength range, the active layer 330 may include a material such as AlGaN, AlGaInN, or the like. When the active layer 330 has a multiple quantum well structure in which quantum layers and well layers are alternately stacked, the quantum layer may include a material such as AlGaN or AlGaInN and the well layer may include a material such as GaN or AlInN. In an embodiment, the active layer 330 includes AlGaInN as a quantum layer and AlInN as a well layer. As described above, the active layer 330 may emit blue light having a central wavelength range from about 450 nm to about 495 nm.

However, the present disclosure is not limited thereto, and the active layer 330 may have a structure in which a semiconductor material having large bandgap energy and a semiconductor material having small bandgap energy are alternately stacked or include other group III or group V semiconductor materials according to the wavelength range of emitted light. The light emitted by the active layer 330 is not limited to light in a blue wavelength range, and the active layer 330 may emit light in a red or green wavelength range in some cases. A length of the active layer 330 may range from about 0.05 μm to about 0.10 μm, but the present disclosure is not limited thereto.

The light emitted from the active layer 330 may be emitted to not only an outer surface of the light-emitting element 300 in a length direction but also at both side surfaces of the light-emitting element 300. In other words, the directivity of the light emitted from the active layer 330 is not limited to one direction.

The electrode layer 370 may be an ohmic contact electrode. However, the present disclosure is not limited thereto, and the electrode layer 370 may also be a Schottky contact electrode. The light-emitting element 300 may include at least one electrode layer 370. Although the light-emitting element 300 illustrated in FIG. 9 includes a single electrode layer 370, the present disclosure is not limited thereto. In some embodiments, the light-emitting element 300 may include a greater number of electrode layers 370 or the electrode layer 370 may be omitted. The description of the light-emitting element 300, which will be provided below, may be identically applied even when the number of the electrode layers 370 is varied or another structure (e.g., another layer) is further included.

When the light-emitting element 300 is electrically connected to the electrodes 210 and 220 or the contact electrodes 260, the electrode layer 370 may reduce resistance between the light-emitting element 300 and the electrodes or contact electrodes. The electrode layer 370 may include a conductive metal. For example, the electrode layer 370 may include at least one from among aluminum (Al), titanium (Ti), indium (In), gold (Au), silver (Ag), indium tin oxide (ITO), indium zinc oxide (IZO), and indium tin-zinc oxide (ITZO). Further, the electrode layer 370 may include a semiconductor material doped with an n-type or p-type impurity. However, the present disclosure is not limited thereto.

The insulating film 380 is disposed to surround outer surfaces of the plurality of semiconductor layers and the electrode layers, which are described above. In an embodiment, the insulating film 380 may be disposed to surround at least an outer surface of the active layer 330 and may extend in one direction in which the light-emitting element 300 extends. The insulating film 380 may protect the underlying members. As an example, the insulating film 380 may be formed to surround side surface portions of the members (e.g., layers) and may expose both ends of the light-emitting element 300 in the length direction.

In FIG. 9, the insulating film 380 is illustrated as being formed to extend in the length direction of the light-emitting element 300 to cover from the first semiconductor layer 310 to a side surface of the electrode layer 370, but the present disclosure is not limited thereto. Because the insulating film 380 covers only outer surfaces of some semiconductor layers, including the active layer 330, or covers only a portion of the outer surface of the electrode layer 370, the outer surface of the electrode layer 370 may be partially exposed. In addition, an upper surface of the insulating film 380 may be formed to be rounded in cross section in a region adjacent to at least one end of the light-emitting element 300.

A thickness of the insulating film 380 may be in range from about 10 nm to about 1.0 μm, but the present disclosure is not limited thereto. In one embodiment, the thickness of the insulating film 380 may be about 40 nm.

The insulating film 380 may include materials having insulating properties, for example, silicon oxide ($SiO_x$), silicon nitride ($SiN_x$), silicon oxynitride ($SiO_xN_y$), aluminum nitride ($Al_xN_y$), aluminum oxide ($Al_xO_y$), and the like. Accordingly, an electrical short circuit, which may occur when the active layer 330 is in direct contact with the electrode through which an electrical signal is transmitted to the light-emitting element 300, may be prevented. Further, because the insulating film 380 protects the outer surface of the light-emitting element 300, including the active layer 330, degradation in light-emitting efficiency may be avoided.

Further, in some embodiments, an outer surface of the insulating film 380 may be surface treated. When the display apparatus 10 is manufactured, the light-emitting element 300 may be sprayed on the electrodes in a state of being dispersed in an ink and aligned. Here, to maintain a state in which the light-emitting element 300 is dispersed in the ink without aggregating with another adjacent light-emitting element 300, the surface of the insulating film 380 may be hydrophobically or hydrophilically treated.

The light-emitting element 300 may have a length h ranging from about 1 μm to about 10 μm, or from about 2 μm to about 6 μm, and in one embodiment, from about 3 μm to about 5 μm. In addition, a diameter of the light-emitting element 300 may range from about 300 nm to about 700 nm, and an aspect ratio of the light-emitting element 300 may range from about 1.2 to about 100. However, the present disclosure is not limited thereto, and the plurality of light-emitting elements 300 included in the display apparatus 10 may have different diameters according to a composition difference of the active layer 330. The diameter of the light-emitting element 300 may be about 500 nm.

Hereinafter, a manufacturing process of the display apparatus 10 according to one embodiment will be described with reference to other drawings.

Figure 10:
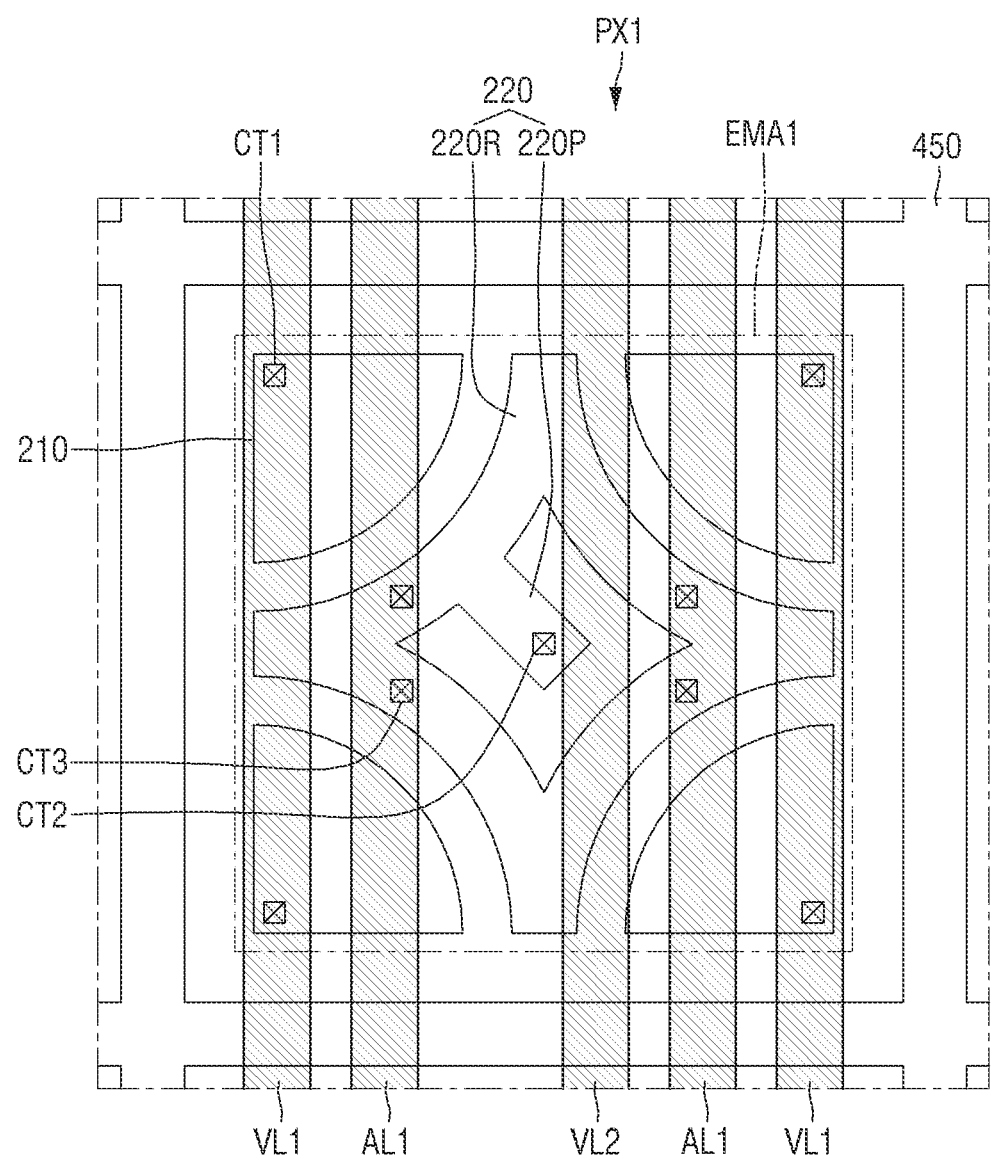
FIGS. 10 to 12 are plan views illustrating steps of a manufacturing process of a display apparatus according to one embodiment.
Figure 11:
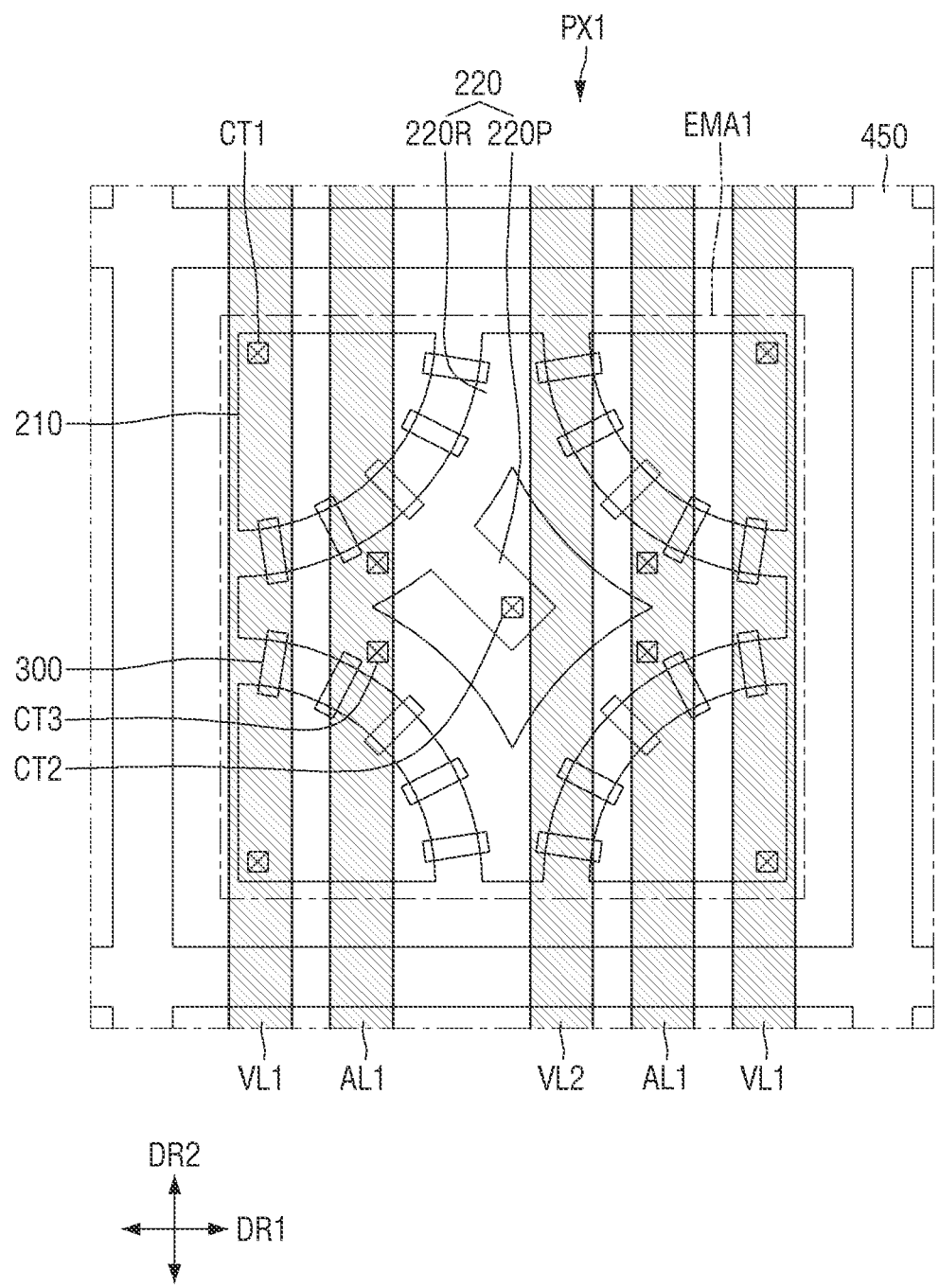
Figure 12:
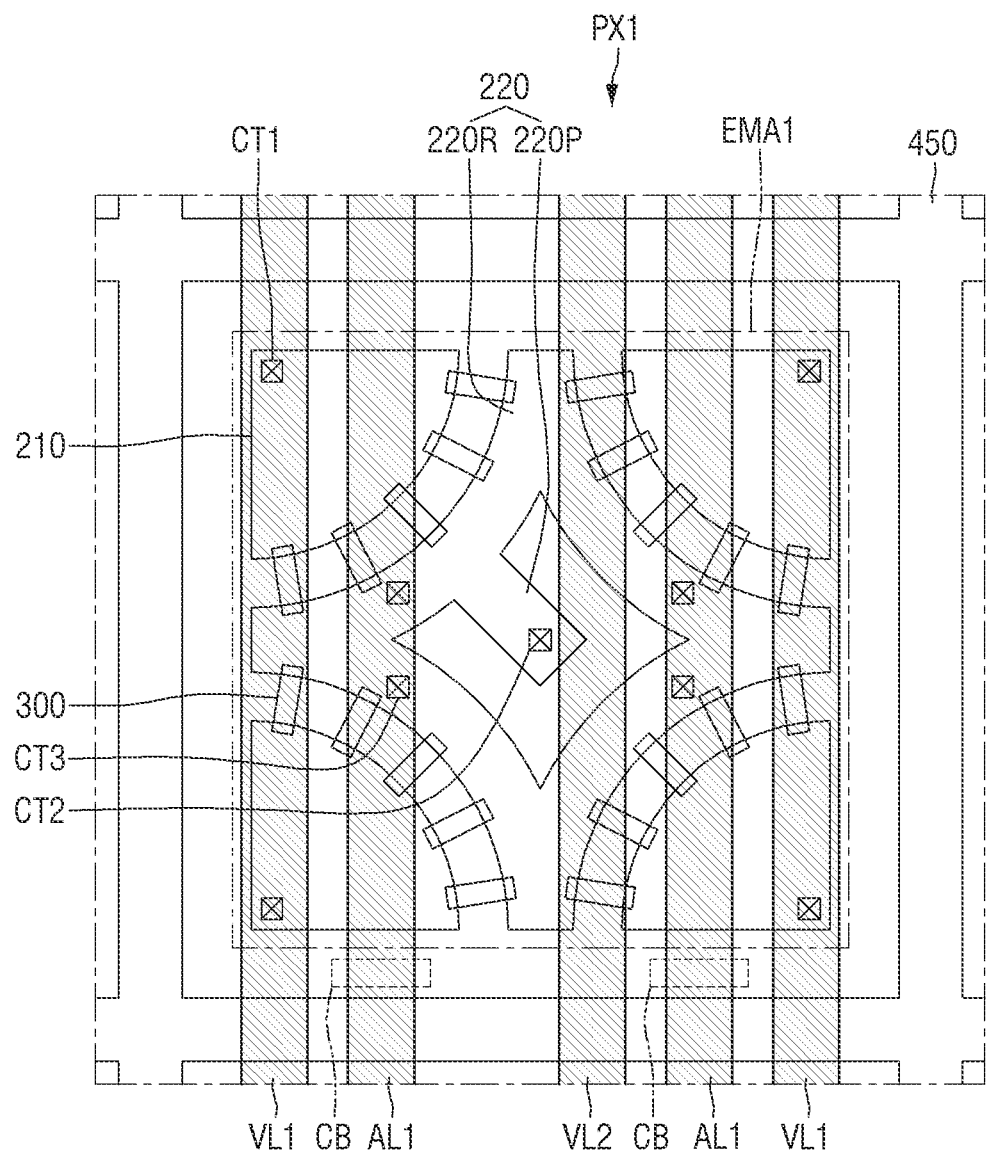

FIGS. 10 to 12 are plan views illustrating some steps of the manufacturing process of the display apparatus according to one embodiment.

First, referring to FIG. 10, a first electrode 210 and a second electrode 220 disposed in each sub-pixel PXn are formed. Because the shapes of the first electrode 210 and the second electrode 220 are the same as described above, detailed descriptions thereof will be omitted. The first electrode 210 may be electrically connected to a first voltage line VL1, and the second electrode 220 may be electrically connected to a first alignment line AL1 and a driving transistor DT. The first alignment line AL1 may extend in the second direction DR2 and may not yet be disconnected and separated into floating lines.

Subsequently, referring to FIG. 11, a plurality of light-emitting elements 300 are disposed between the first electrode 210 and the second electrode 220. A process of aligning the light-emitting elements 300 may be performed by a process of spraying an ink, in which the light-emitting elements 300 are dispersed, and applying an alignment signal to the first electrode 210 and the second electrode 220. When the alignment signal is applied to the first electrode 210 and the second electrode 220, an electric field is generated between the first electrode 210 and the second electrode 220, and the light-emitting elements 300 dispersed in the ink may receive (or may be acted upon by) a dielectrophoretic force due to the electric field. The light-emitting element 300 receiving the dielectrophoretic force may be placed (or aligned) between the first electrode 210 and the second electrode 220 while an orientation direction and a location are changed by the dielectrophoretic force. As described above, the light-emitting elements 300 may be disposed between a first outer side OS1 of the first electrode 210 and a second outer side OS2 of the second electrode 220 to have various orientation directions. The plurality of light-emitting elements 300 may be arranged along a curved side of the first outer side OS1, and the orientation directions thereof may be different from each other.

The alignment signal transmitted to the first electrode 210 may be applied through the first voltage line VL1, and the alignment signal transmitted to the second electrode 220 may be applied through the first alignment line AL1. The alignment signal for aligning the light-emitting element 300 may be applied when the first alignment line AL1 is connected (e.g., before the first alignment line AL1 is disconnected and separated into floating lines). Thereafter, in a subsequent process, the first alignment line AL1 may be partially disconnected.

Referring to FIG. 12, a portion of the first alignment line AL1 is patterned so that the first alignment line AL1 may be separated into a plurality of floating lines AL1a and AL1b. The first alignment line AL1 may be patterned in a non-light-emitting region of each sub-pixel PXn (e.g., the portion CB of FIG. 12). A description thereof is the same as described above.

Thereafter, the display apparatus 10 may be manufactured by forming a second insulating layer 520, contact electrodes 261 and 262, and a third insulating layer 550 disposed on the light-emitting element 300.

Hereinafter, various embodiments of the display apparatus 10 will be described.

Figure 13:
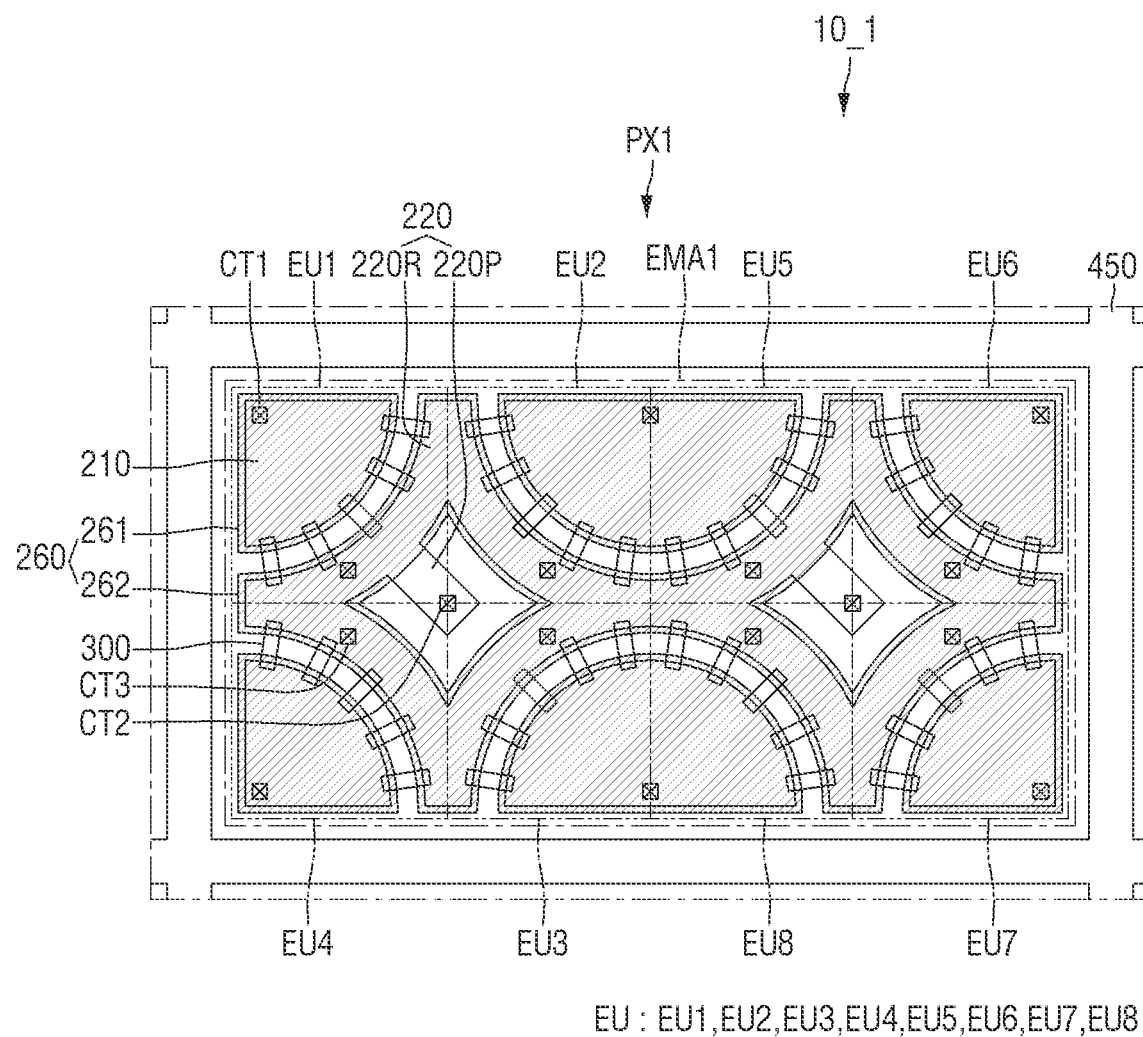
FIG. 13 is a plan view illustrating one sub-pixel of a display apparatus according to another embodiment.

FIG. 13 is a plan view illustrating one sub-pixel of a display apparatus according to another embodiment.

Referring to FIG. 13, in a display apparatus 10_1 according to one embodiment, each sub-pixel PXn may include a greater number of electrode units EU than in the above-described embodiment. When an area occupied by one sub-pixel PXn increases, a greater number of electrode units EU, for example, four or more electrode units EU, may be disposed in each sub-pixel PXn. In an embodiment, in the electrode units EU, some of the electrodes 210 and 220 may be directly connected to or integrated with the electrodes 210 and 220 of another electrode unit EU, and another type of electrodes 210 and 220 may be formed. The display apparatus 10_1 shown in FIG. 13 is different from that of the embodiment shown in FIG. 2 in that each sub-pixel PXn includes a greater number of electrode units EU and another type of electrode unit EU. Hereinafter, repeated descriptions will be omitted, and descriptions will be primarily focused on differences from the above-described contents.

The display apparatus 10_1 shown in FIG. 13 may further include fifth to eighth electrode units EU5, EU6, EU7, and EU8 in addition to first to fourth electrode units EU1, EU2, EU3, and EU4. The fifth electrode unit EU5 may be located on one side of the second electrode unit EU2 in the first direction DR1, and the sixth electrode unit EU6 may be located on one side of the fifth electrode unit EU5 in the first direction DR1. The fifth electrode unit EU5 and the sixth electrode unit EU6 may have the same shapes as the first electrode unit EU1 and the second electrode unit EU2, respectively. Similarly, the eighth electrode unit EU8 may be located on one side of the third electrode unit EU3 in the first direction DR1, and the seventh electrode unit EU7 may be located on one side of the eighth electrode unit EU8 in the first direction DR1. The seventh electrode unit EU7 and the eighth electrode unit EU8 may have the same shapes as the third electrode unit EU3 and the fourth electrode unit EU4, respectively.

As described above, in some of the plurality of electrode units EU, the second electrodes 220 may be directly connected and integrated. For example, in the fifth to eighth electrode units EU5, EU6, EU7, and EU8, the second electrodes 220 may be connected to each other like in the first to fourth electrode units EU1, EU2, EU3, and EU4, and from among the fifth to eighth electrode units EU5, EU6, EU7, and EU8, in the fifth electrode unit EU5, the second electrode 220 may further include an electrode protrusion 220P.

The second electrode unit EU2 and the fifth electrode unit EU5, and the third electrode unit EU3 and the eighth electrode unit EU8, may be formed to have a symmetrical structure with respect to a center of the sub-pixel PXn. In the second electrode unit EU2 and the fifth electrode unit EU5, and in the third electrode unit EU3 and the eighth electrode unit EU8, the first electrodes 210 may be integrally formed, and another type of first electrode 210 or electrode unit EU may be formed.

In the first electrode 210 of the second electrode unit EU2 and the first electrode 210 of the fifth electrode unit EU5, second short sides SS2 extending in the second direction DR2 may be integrated, and first outer sides OS1 may be connected to each other. A first short side SS1 extending in the first direction DR1 may have a greater length. In the electrode unit EU of the display apparatus 10_1 according to one embodiment, the first electrode 210 may include one short side extending in the first direction DR1, and the first outer side OS1 may include a second type electrode unit connecting both sides of the one short side. As shown in FIG. 13, in the second electrode unit EU2 and the fifth electrode unit EU5, and in the third electrode unit EU3 and the eighth electrode unit EU8, the first electrodes 210 may be integrated to have a shape of a half-circle, and fourth short sides SS4 of the second electrodes 220 may also be integrated to have a shape such as an arc of a half-circle. In FIG. 13, the electrode units are illustrated as different electrode units according to regions, for example, the second electrode unit EU2 and the fifth electrode unit EU5, and the third electrode unit EU3 and the eighth electrode unit EU8, but the present disclosure is not limited thereto. The second electrode unit EU2 and the fifth electrode unit EU5, and the third electrode unit EU3 and the eighth electrode unit EU8 may each form one electrode unit EU having a different shape as the first electrodes 210 and the second electrodes 220 thereof are integrated.

When one short side of the first electrodes 210 of a first type having a quarter-circle shape is integrated with one short side of another first electrode 210 thereof, the first electrodes 210 may have one half-circle shape. The display apparatus 101 may further include the first electrode 210 of a second type having a half-circle shape. The first electrode 210 of the second type may include one short side extending in the first direction DR1 or the second direction DR2 and a first outer side OS1 connecting both sides of the one short side. A center of curvature of the first outer side OS1 may be between both sides of the one short side. As an example, the center of curvature of the first outer side OS1 may be a midpoint of both sides of the one short side.

A second outer side OS2 of the second electrode 220 may have a shape corresponding to the first outer side OS1 of the first electrode 210. When the first electrode 210 has the second type shape, the second outer side OS2 of the second electrode 220 may have a shape such as an arc of a half-circle. In the display apparatus 10_1, according to one embodiment, each sub-pixel PXn includes a plurality of first type electrode units, and in some of the first type electrode units, the electrodes 210 and 220 may be partially integrated to form one electrode unit EU of another type. In the embodiment shown in FIG. 13, one sub-pixel PXn may include two second type electrode units and four first type electrode units.

Figure 14:
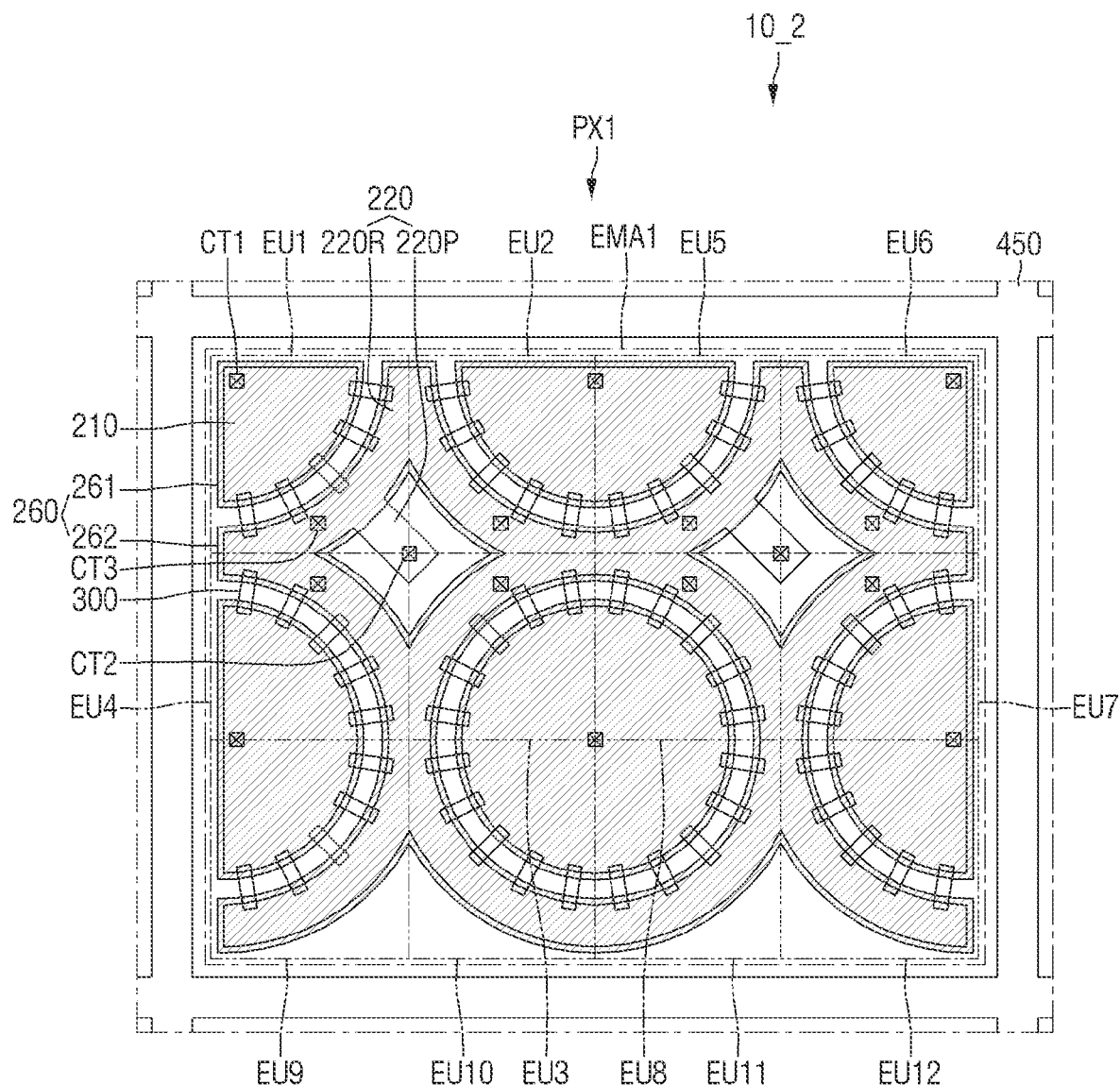
FIG. 14 is a plan view illustrating one sub-pixel of a display apparatus according to another embodiment.
Figure 14:
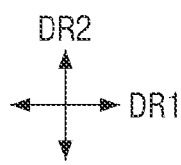

FIG. 14 is a plan view illustrating one sub-pixel of a display apparatus according to another embodiment.

Referring to FIG. 14, a display apparatus 102, according to one embodiment, may include a greater number of electrode units EU, and each sub-pixel PXn may further include first electrodes 210 and electrode units EU of another type. The display apparatus 10_2 shown in FIG. 14 is different from that of the embodiment shown in FIG. 13 in that the display apparatus 10_2 includes a greater number of electrode units EU.

In the display apparatus 10_2 of FIG. 14, one sub-pixel PXn may further include ninth to twelfth electrode units E9, EU10, EU11, and EU12. In the sub-pixel PXn shown in FIG. 13, the ninth to twelfth electrode units E9, EU10, EU11, and EU12 may be disposed on the other sides a fourth electrode unit EU4, a third electrode unit EU3, an eighth electrode unit EU8, and a seventh electrode unit EU7 in the second direction DR2, respectively. From among the ninth to twelfth electrode units E9, EU10, EU11, and EU12, one short side of the first electrodes 210 of the ninth electrode unit EU9 and the twelfth electrode unit EU12 may be integrated with those of the fourth electrode unit EU4 and the seventh electrode unit EU7, respectively. Accordingly, the fourth electrode unit EU4 and the ninth electrode unit EU9, and the seventh electrode unit EU7 and the twelfth electrode unit EU12, may each form a second type electrode unit.

The tenth electrode unit EU10 and the eleventh electrode unit EU11 may be disposed to be in contact with the third electrode unit EU3 and the eighth electrode unit EU8, respectively. For example, in the first electrodes 210 thereof, one short side may be integrated with each other. According to one embodiment, the sub-pixel PXn of the display apparatus 10_2 may further include an electrode unit of a third type in which the first electrode 210 has a circular shape.

In the electrode unit EU of the display apparatus 102, according to one embodiment, four first electrodes 210 each having a quarter-circle shape are integrated to form the first electrode 210 of the third type having a circular shape, and the electrode unit EU may include the electrode unit of the third type including the first electrode 210 of the third type.

A second outer side OS2 of a second electrode 220 may have a shape corresponding to a first outer side OS1 of the first electrode 210. When the first electrode 210 has a shape of a third type, the second outer side OS2 of the second electrode 220 may have the same shape as an arc of a circle. In the display apparatus 102, according to one embodiment, each sub-pixel PXn includes a plurality of first type electrode units and a plurality of second type electrode units, and in some of the first type electrode units and the second type electrode units, the electrodes 210 and 220 may be partially integrated to form one electrode unit EU of another type. In the embodiment shown in FIG. 14, one sub-pixel PXn may include two first type electrode units, three second type electrode units, and one third type electrode unit. The embodiment shown in FIG. 14 is different from the embodiment shown in FIG. 13 in that the electrodes 210 and 220 or electrode units of another type are further included. Repeated descriptions will be omitted.

The electrode unit EU may further include other electrodes disposed between the first electrode 210 and the second electrode 220.

Figure 15:
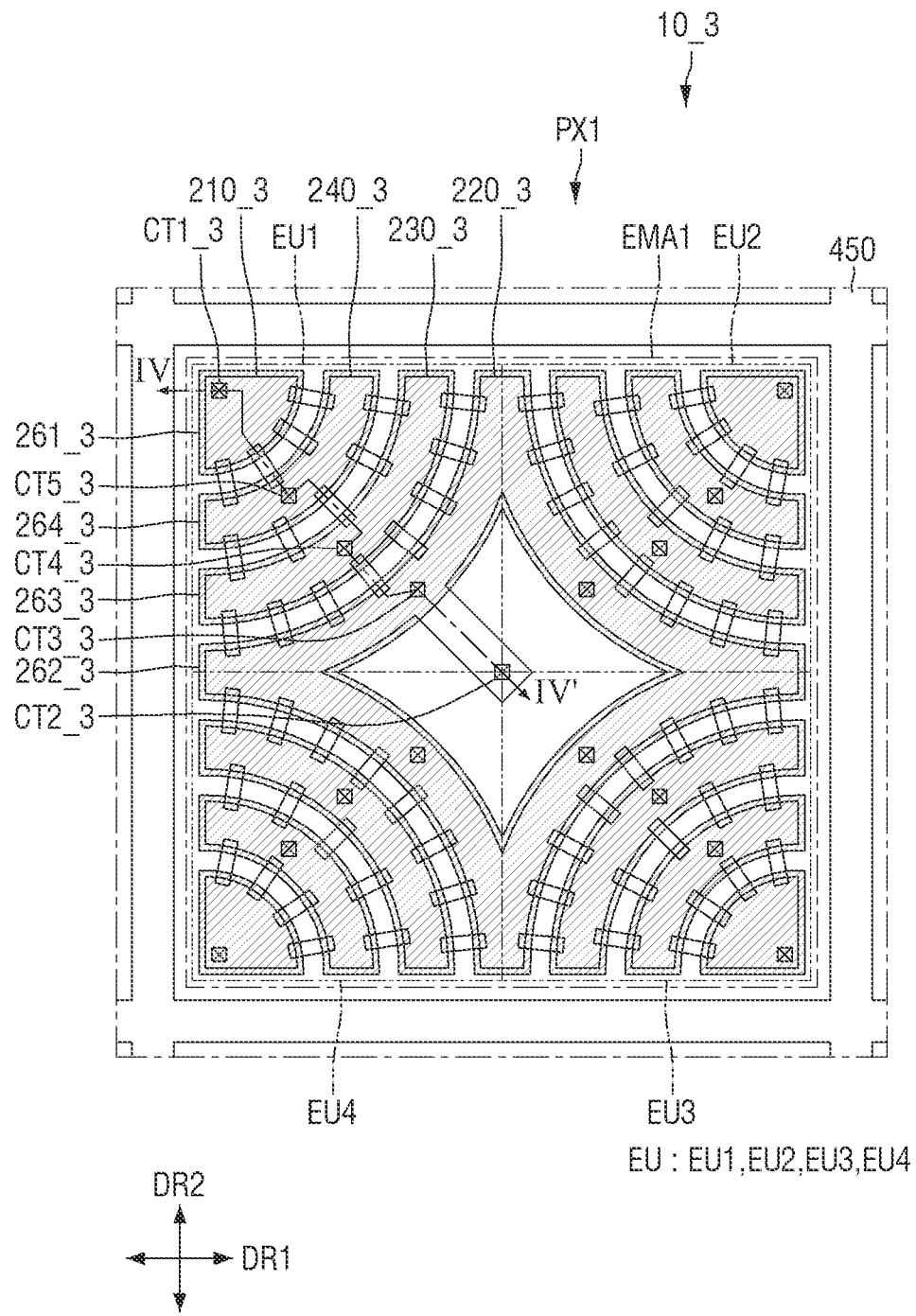
FIG. 15 is a plan view illustrating one sub-pixel of a display apparatus according to another embodiment.
Figure 16:
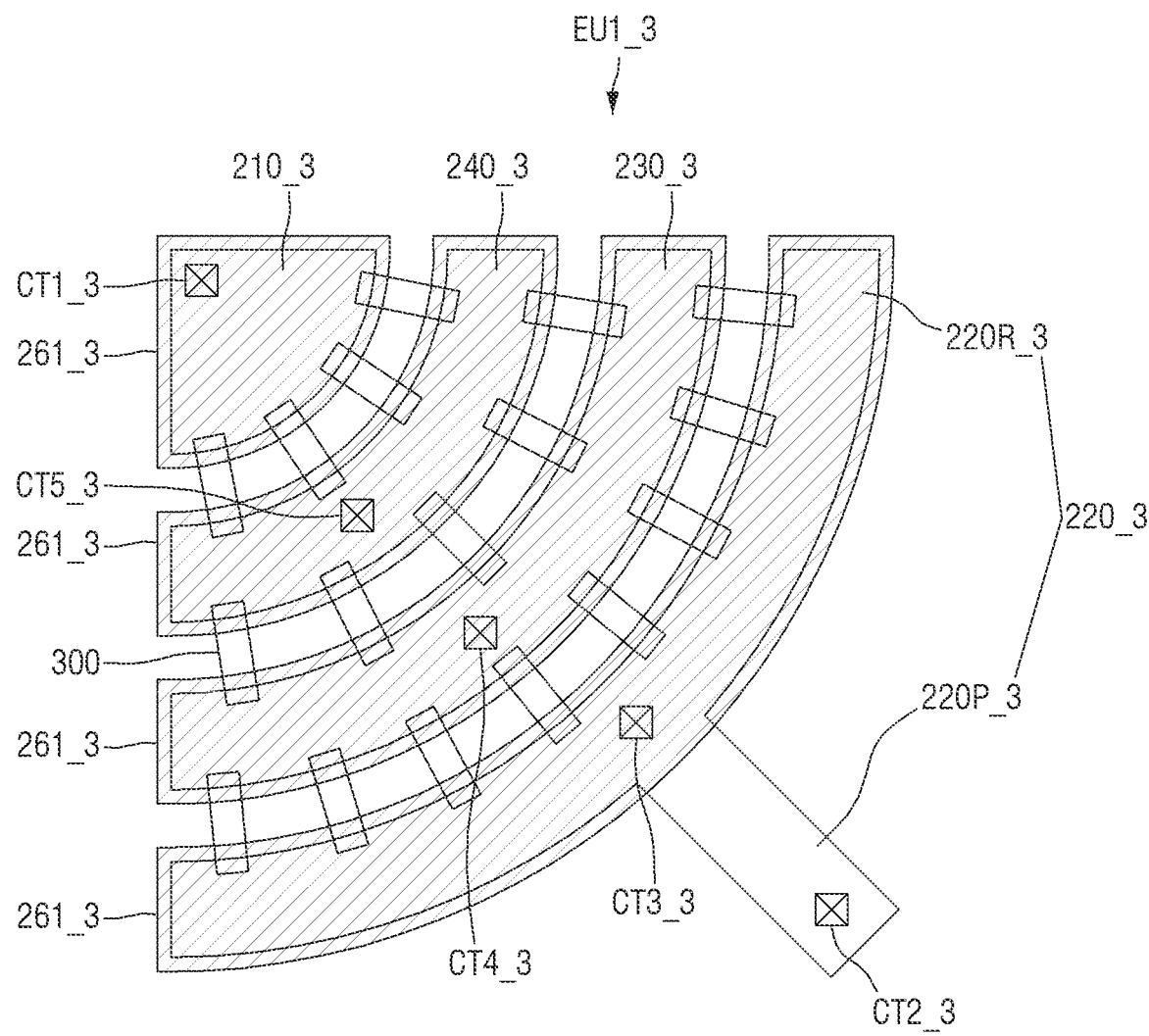
FIG. 16 is a schematic plan view illustrating an electrode unit of the sub-pixel shown in FIG. 15.

FIG. 15 is a plan view illustrating one sub-pixel of a display apparatus according to another embodiment, and FIG. 16 is a schematic plan view illustrating an electrode unit of the display apparatus shown in FIG. 15.

Referring to FIGS. 15 and 16, in a display apparatus 10_3, according to one embodiment, an electrode unit EU_3 may further include a third electrode 230_3 and a fourth electrode 240_3 disposed between a first electrode 210_3 and a second electrode 220_3. The display apparatus 10_3 shown in FIGS. 15 and 16 is different from that of the embodiment shown in FIG. 2 in that each electrode unit EU_3 includes electrodes 230_3 and 240_3. Hereinafter, repeated descriptions will be omitted and the third electrode 230_3 and the fourth electrode 240_3 will be primarily described.

The third electrode 230_3 may be disposed between the first electrode 210_3 and the second electrode 220_3. The third electrode 230_3 may have substantially the same shape as the second electrode 220_3 or an electrode curved portion 220R_3 and may be disposed to be spaced apart from and face the second electrode 220_3. According to one embodiment, the third electrode 230_3 may have a curved shape corresponding to a second outer side OS2 of the second electrode 220_3. One outer side of the third electrode 2303 may be spaced apart from and face the second outer side OS2, and the light-emitting elements 300 may be disposed therebetween.

The fourth electrode 240_3 may be disposed between the first electrode 210_3 and the third electrode 230_3. The fourth electrode 240_3 may have substantially the same shape as the second electrode 220_3 or the electrode curved portion 220R_3 and may be disposed to be spaced apart from and face the first electrode 210_3 and the third electrode 230_3. According to one embodiment, the fourth electrode 240_3 may have a curved shape corresponding to a first outer side OS1 of the first electrode 210_3. One outer side of the fourth electrode 2403 may be spaced apart from and face the first outer side OS1, and the light-emitting elements 300 may be disposed therebetween.

The third electrode 230_3 and the fourth electrode 240_3 may each have the same center of curvature as the first outer side OS1 of the first electrode 210_3 and may have a shape of an arc of a quarter-circle. However, as the second electrode 2203, the third electrode 2304, and the fourth electrode 240_3 move away from the center of curvature, the length and area of each of the second electrode 2203, the third electrode 230_4, and the fourth electrode 240_3 may increase.

The first electrode 2103, the second electrode 2203, the third electrode 2303, and the fourth electrode 240_3 may be spaced apart from each other and curved outer sides thereof may face each other. Separation distances thereof may be substantially the same, and as described above with reference to FIG. 4, separation distances of the first electrode 2103, the second electrode 2203, the third electrode 2303, and the fourth electrode 240_3 may be constant or substantially constant as a first separation distance W1 (see, e.g., FIG. 4). A plurality of light-emitting elements 300 may be arranged between the first electrode 2103, the second electrode 220_3, the third electrode 2303, and the fourth electrode 240_3.

Further, a third contact electrode 263_3 and a fourth contact electrode 264_3 may be disposed on the third electrode 230_3 and the fourth electrode 240_3, respectively. The third contact electrode 263_3 and the fourth contact electrode 264_3 have the same shape as a second contact electrode 2623, and may have different sizes depending on the respective shapes of the third electrode 230_3 and the fourth electrode 240_3. The plurality of light-emitting elements 300 may each be electrically connected to each of the first electrode 2103, the second electrode 220_3, the third electrode 2303, and the fourth electrode 240_3. Both ends of each of the light-emitting elements 300 may be in direct contact with one of a first contact electrode 2613, the second contact electrode 2623, the third contact electrode 263_3, and the fourth contact electrode 264_3. A detailed description thereof will be omitted.

The third electrode 230_3 and the fourth electrode 240_3 may not be directly connected to a first voltage line VL1 and a second voltage line VL2 to which a driving signal of the display apparatus 10_3 is applied. In the display apparatus 103, the driving signal applied through the first voltage line VL1 and the second voltage line VL2 may be transmitted only to the first electrode 210_3 and the second electrode 220_3 and may not be transmitted to the third electrode 230_3 and the fourth electrode 240_3. An electrical signal transmitted to the first electrode 210_3 may be transmitted to the fourth electrode 240_3 through the light-emitting element 300 electrically connected to the first electrode 210_3. The electrical signal transmitted to the fourth electrode 2403 may be transmitted through the light-emitting element 300 disposed between the fourth electrode 240_3 and the third electrode 230_3. Similarly, the electrical signal transmitted to the second electrode 220_3 may be transmitted to the third electrode 230_3 and the fourth electrode 240_3 through the light-emitting element 300 electrically connected to the second electrode 220_3.

According to one embodiment, in the display apparatus 103, the electrode unit EU_3 may further include the third electrode 230_3 and the fourth electrode 240_3 to which an electrical signal is not directly transmitted from the voltage lines VL1 and VL2, and the light-emitting elements 300 connected between the electrodes 210_3, 2203, 230_3, and 2403 may be partially connected in series. Accordingly, the number of the light-emitting elements 300 disposed per unit area may be increased and light-emitting efficiency may be improved due to the series connection.

The third electrode 230_3 and the fourth electrode 240_3 may not be directly connected to the first voltage line VL1 and the second voltage line VL2 but may be directly connected to alignment lines to which an alignment signal is applied.

Figure 17:
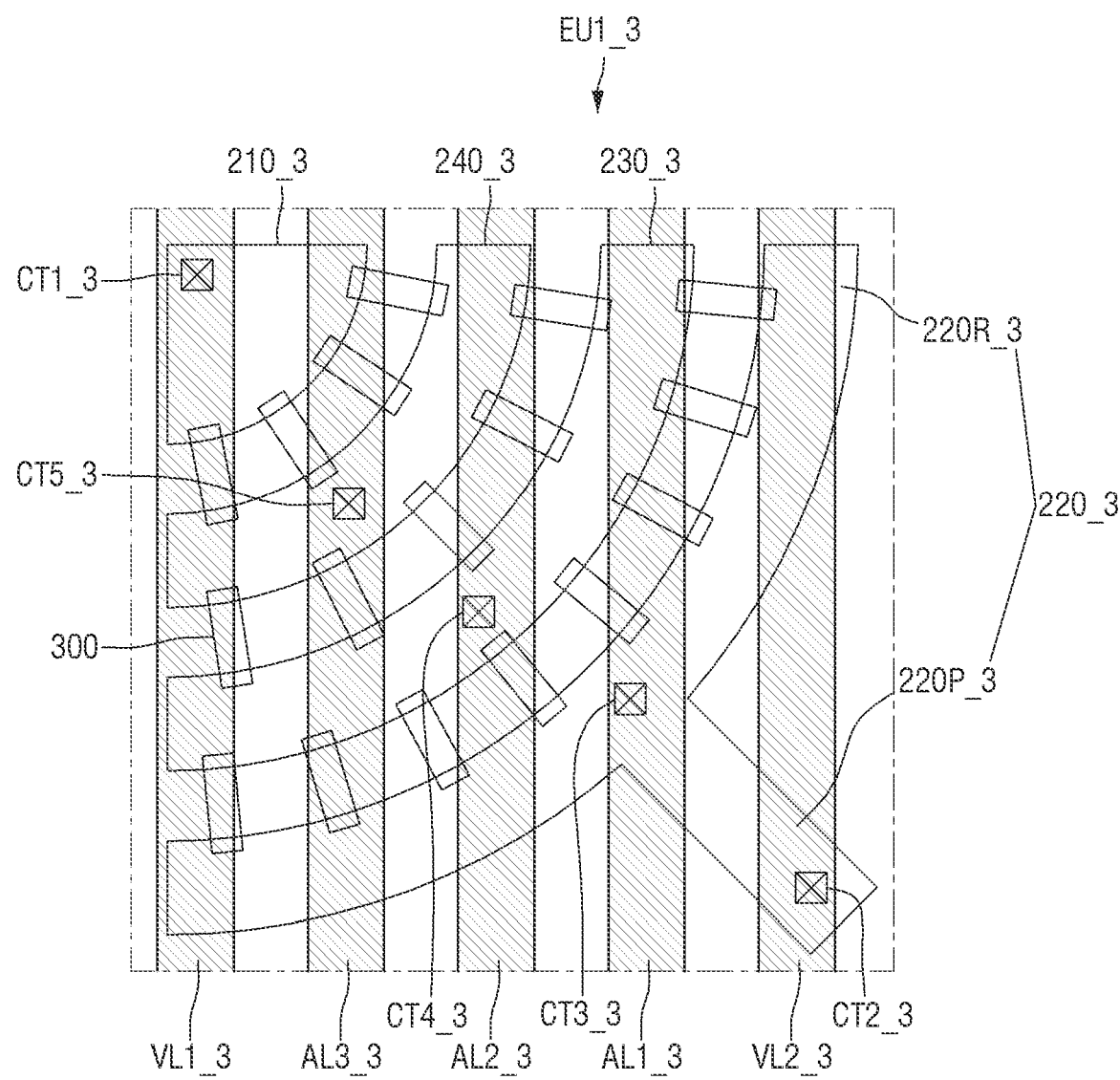
FIG. 17 is a schematic layout diagram illustrating the electrode unit and alignment lines of the sub-pixel shown in FIG. 15.
Figure 18:
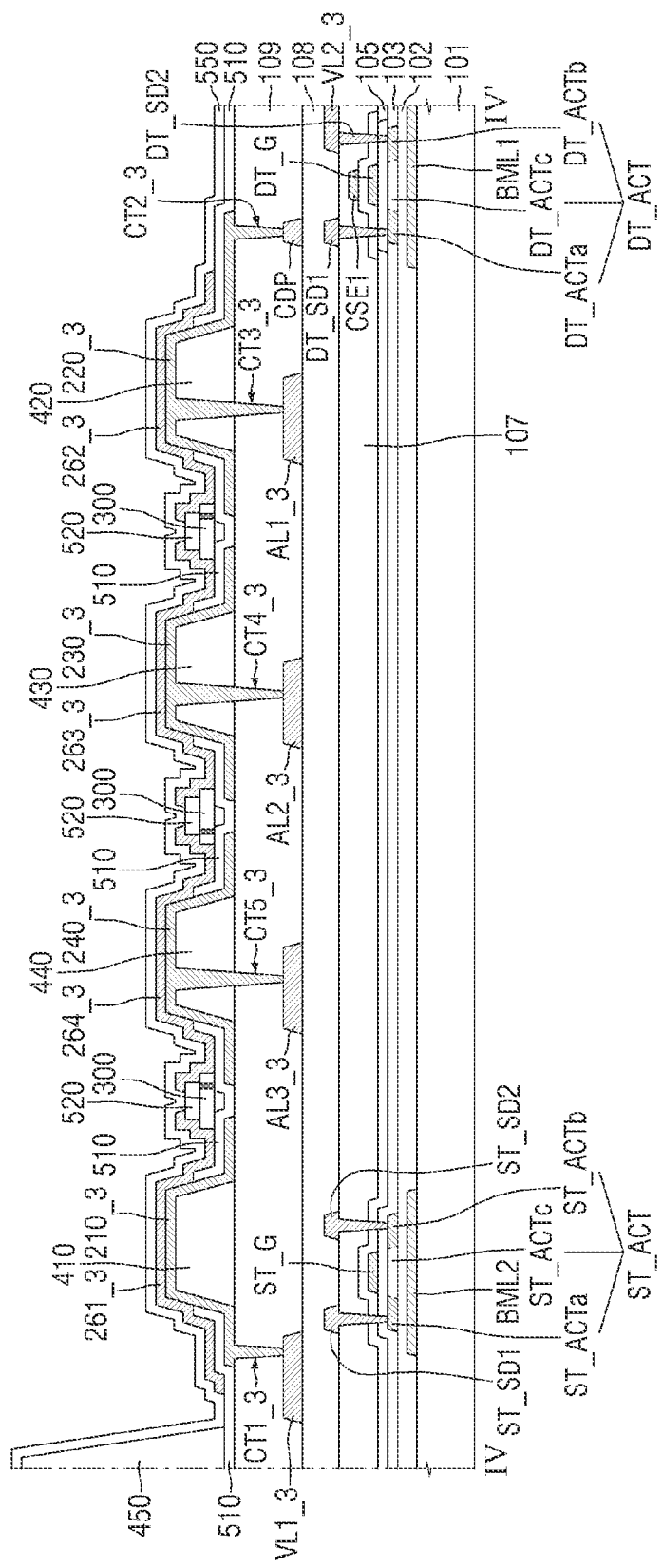
FIG. 18 is a cross-sectional view taken along the line IV-IV' of FIG. 15.

FIG. 17 is a schematic plan view illustrating the electrode unit and the alignment lines of the sub-pixel shown in FIG. 15, and FIG. 18 is a cross-sectional view taken along the line IV-IV' of FIG. 15. FIG. 17 is a partially enlarged view of a first electrode unit EU1_3 of the display apparatus 10_3 shown in FIG. 15.

Referring to FIGS. 17 and 18, in the display apparatus 10_3 according to one embodiment, the electrode unit EU_3 may include a greater number of electrodes, for example, the third electrode 230_3 and the fourth electrode 2403, and thus, may include a greater number of inner banks and alignment lines AL1_3, AL2_3, and AL3_3.

A third inner bank 430 and a fourth inner bank 440 may be disposed between a first inner bank 410 and a second inner bank 420. The third inner bank 430 may be disposed between a first planarization layer 109 and the third electrode 2303, and the fourth inner bank 440 may be disposed between the first planarization layer 109 and the fourth electrode 240_3. The third inner bank 430 and the fourth inner bank 440 may each have a shape similar to that of the second inner bank 420. A detailed description thereof will be omitted.

The alignment lines AL13, AL2_3, and AL3_3 may further include a second alignment line AL2_3 and a third alignment line AL3_3 in addition to a first alignment line AL1_3. A description of the first alignment line AL1_3 is the same as described above. The first alignment line AL1_3 may be electrically connected to the second electrode 220_3 through a third contact hole (e.g., a third contact opening) CT3_3 and may transmit the alignment signal. In addition, descriptions of a first voltage line VL1_3 and a second voltage line VL2_3 are the same as described above, and thus, hereinafter, the second alignment line AL2_3 and the third alignment line AL3_3 will be primarily described.

The second alignment line AL2_3 and the third alignment line AL3_3 may extend in the second direction DR2 similar to the first alignment line AL1_3. The second alignment line AL2_3 and the third alignment line AL3_3 are a second data conductive layer and may be disposed to overlap the third electrode 230_3 and the fourth electrode 240_3 in the thickness direction, respectively. A fourth contact hole (e.g., a fourth contact opening) CT4_3 exposing a portion of the second alignment line AL2_3 through the third inner bank 430 and the first planarization layer 109 may be formed in a region in which the third electrode 230_3 overlaps the second alignment line AL2_3. A fifth contact hole (e.g., a fifth contact opening) CT5_3 exposing a portion of the third alignment line AL3_3 through the fourth inner bank 440 and the first planarization layer 109 may be formed in a region in which the fourth electrode 240_3 overlaps the third alignment line AL3_3. The third electrode 230_3 and the fourth electrode 2403 may be electrically connected to the second alignment line AL2_3 and the third alignment line AL3_3 through the fourth contact hole CT4_3 and the fifth contact hole CT5_3, respectively. During a manufacturing process of the display apparatus 103, alignment signals may be applied to the second alignment line AL2_3 and the third alignment line AL3_3, and may be transmitted to the third electrode 230_3 and the fourth electrode 2403, respectively.

The fourth contact hole CT4_3 may pass through the third inner bank 430 and the first planarization layer 109 to expose the second alignment line AL2_3, and the fifth contact hole CT5_3 may pass through the fourth inner bank 440 and the first planarization layer 109 to expose the third alignment line AL3_3. The third electrode 230_3 and the fourth electrode 240_3 may be electrically connected to the second alignment line AL2_3 and the third alignment line AL3_3 through the fourth contact hole CT4_3 and the fifth contact hole CT5_3, respectively. The second alignment line AL2_3 and the third alignment line AL3_3 may also be disconnected in a non-light-emitting region of each sub-pixel PXn and separated into a plurality of floating lines. Hereinafter, repeated descriptions will be omitted.

As described above, in the electrode unit EU of the display apparatus 10, the first electrode 210 and the second electrode 220 may be disposed to be spaced apart from the electrodes 210 and 220 of another electrode unit EU. The electrodes 210 and 220 may not be integrated with each other and may be electrically connected through other portions or electrodes.

Figure 19:
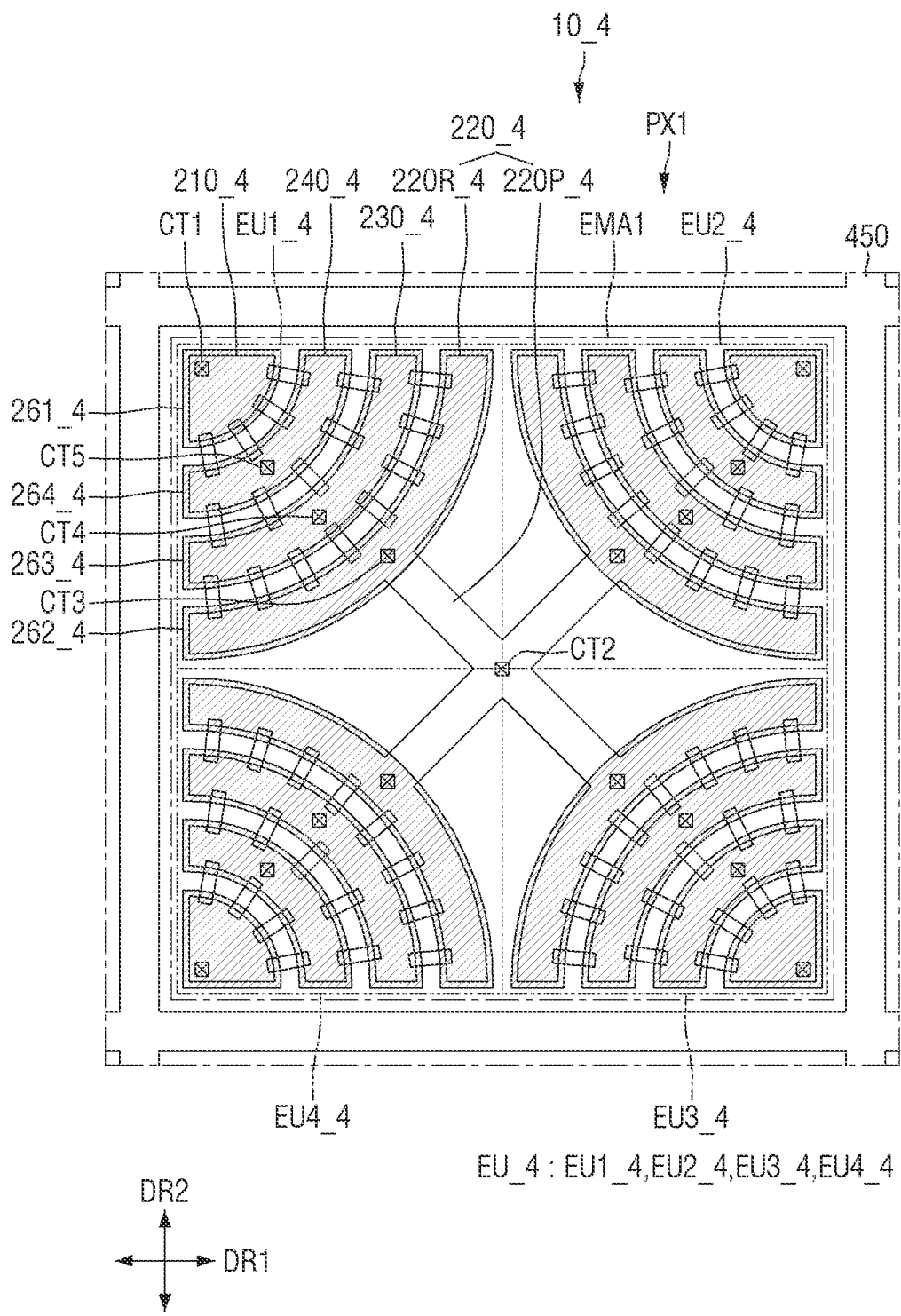
FIG. 19 is a plan view illustrating one sub-pixel of a display apparatus according to another embodiment.

FIG. 19 is a plan view illustrating one sub-pixel of a display apparatus according to another embodiment.

Referring to FIG. 19, in a display apparatus 10_4, according to one embodiment, second electrodes 220_4 of electrode units EU may be disposed to be spaced apart from each other and may each include an electrode protrusion 220P_4, and the electrode protrusions 220P_4 may be connected to each other. The embodiment shown in FIG. 19 is different from the embodiment shown in FIG. 15 in that each electrode unit EU_4 includes the electrode protrusion 220P_4, and the electrode protrusions 220P_4 are connected to each other. Hereinafter, repeated descriptions will be omitted, and descriptions will primarily focus on differences from the above-described contents.

In the display apparatus 10_4 shown in FIG. 19, a first electrode unit EU1_4, a second electrode unit EU2_4, a third electrode unit EU_3, and a fourth electrode unit EU4_4 may respectively include the second electrodes 220_4 having the same shape. In each of the first to fourth electrode units EU1_4, EU2_4, EU3_4, and EU4_4, the second electrode 2204 may include an electrode curved portion 220R_4 and the electrode protrusion 220P_4. Both ends of the second electrodes 220_4 of the first to fourth electrode units EU1_4, EU2_4, EU3_4, and EU4_4 may be disposed to be spaced apart from each other without being integrated.

However, in the first to fourth electrode units EU1_4, EU2_4, EU3_4, and EU4_4, the second electrodes 220_4 may respectively include the electrode protrusions 220P_4, and the electrode protrusions 220P_4 may be connected to each other. In each of the first to fourth electrode units EU1_4, EU2_4, EU3_4, and EU4_4, a first outer side OS1 of a first electrode 210_4 and a second outer side OS2 of the second electrode 220_4 may be disposed to face a center of a sub-pixel PXn, and a third electrode 230_4 and a fourth electrode 240_4 may each have a shape curved toward the center of the sub-pixel PXn. The electrode protrusions 220P_4 of the second electrodes 220_4 may protrude from third outer sides OS3 toward the center of the sub-pixel PXn and may be connected to each other at the center of the sub-pixel PXn.

In the display apparatus 10_4, according to one embodiment, even when the second electrodes 220_4 are not integrated, the electrode protrusions 220P_4 are connected to each other so that the plurality of first to fourth electrode units EU1_4, EU2_4, EU3_4, and EU4_4 may be electrically connected to a driving transistor DT through one second contact hole (e.g., second contact opening) CT2. Accordingly, the same electrical signal may be transmitted to the second electrodes 220_4 of the first to fourth electrode units EU1_4, EU2_4, EU3_4, and EU4_4. In the light-emitting elements 300 of each of the electrode units EU_4, the light-emitting elements 300 disposed between different electrodes may be configured to be connected to each other in series, and the light-emitting elements 300 of different electrode units EU_4 may be configured to be connected in parallel to each other.

In some embodiments, the first electrode 210 of one of the electrode units EU may be electrically connected to the second electrode 220 of another electrode unit EU. An electrical signal transmitted to the second electrode 220 may be transmitted to the second electrode 220 of another electrode unit EU through the first electrode 210. According to one embodiment, in the plurality of electrode units EU disposed in each sub-pixel PXn, the light-emitting elements 300 may be configured to be connected to each other in series.

Figure 20:
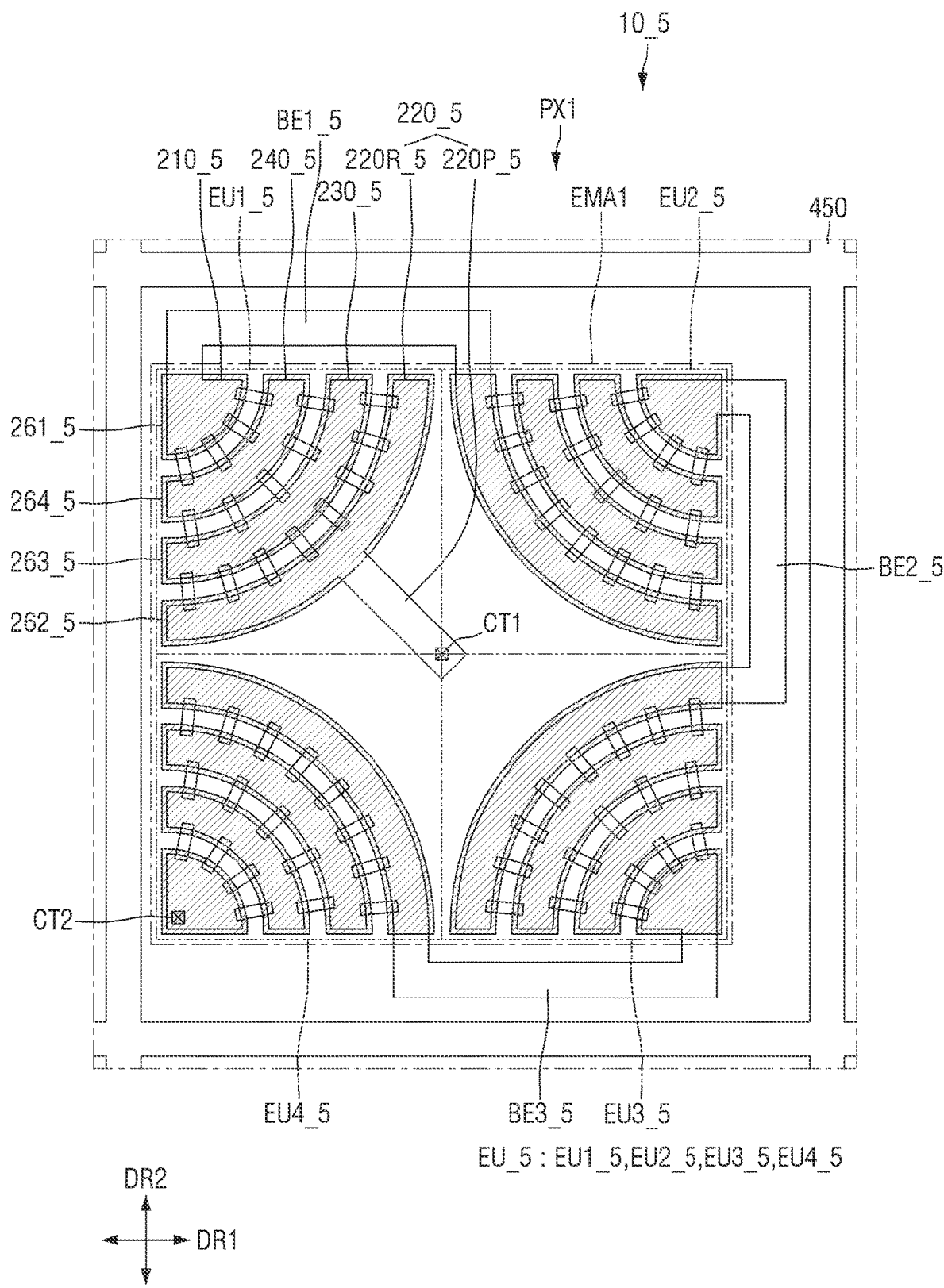
FIG. 20 is a plan view illustrating one sub-pixel of a display apparatus according to another embodiment.

FIG. 20 is a plan view illustrating one sub-pixel of a display apparatus according to another embodiment.

Referring to FIG. 20, a display apparatus 105, according to one embodiment, may further include bridge electrodes BE1_5, BE2_5, and BE3_5, which are disposed in each sub-pixel PXn and each have one side electrically connected to a first electrode 210_5 of one electrode unit EU_5 and the other side electrically connected to a second electrode 220_5 of another electrode unit EU_5. The embodiment shown in FIG. 20 is different from the embodiment shown in FIG. 19 in that the bridge electrodes BE1_5, BE2_5, and BE3_5, which connect the first electrodes 210_5 and the second electrodes 220_5 of different electrode units EU_5, are further included, and only any second electrode 220_5 includes an electrode protrusion 220P. Hereinafter, repeated descriptions will be omitted, and the bridge electrodes BE1_5, BE2_5, and BE3_5 will be primarily described in detail.

One side of each of the bridge electrodes BE1_5, BE2_5, and BE3_5 may be electrically connected to the first electrode 210_5 of one electrode unit EU_5. For example, one side of a first bridge electrode BE1_5 may be directly connected to the first electrode 210_5 of a first electrode unit EU1_5, one side of a second bridge electrode BE2_5 may be directly connected to the first electrode 210_5 of a second electrode unit EU2_5, and one side of a third bridge electrode BE3_5 may be directly connected to the first electrode 210_5 of a third electrode unit EU3_5.

Further, the other side of each of the bridge electrodes BE1_5, BE2_5, and BE3_5 may be electrically connected to the second electrode 220_5 of any one electrode unit EU_5. For example, the other side of the first bridge electrode BE1_5 may be directly connected to the second electrode 220_5 of the second electrode unit EU2_5, the other side of the second bridge electrode BE2_5 may be directly connected to the second electrode 220_5 of the third electrode unit EU3_5, and the other side of the third bridge electrode BE3_5 may be directly connected to the second electrode 220_5 of a fourth electrode unit EU4_5.

In FIG. 20, the bridge electrodes BE1_5, BE2_5, and BE3_5 are illustrated as having a shape disposed in a non-light-emitting region, extending in one direction, and being connected to the first electrode 210_5 and the second electrode 220_5 of the different electrode units EU_5. However, the present disclosure is not limited thereto, and the shapes of the bridge electrodes BE1_5, BE2_5, and BE3_5 may be variously modified depending on an area of the sub-pixel PXn.

The first electrode 210_5 and the second electrode 220_5 connected to the bridge electrodes BE1_5, BE2_5, and BE3_5 may not be directly connected to a first voltage line VL1 and a second voltage line VL2, respectively. For example, a first contact hole (e.g., a first contact opening) CT1 and a second contact hole (e.g., a second contact opening) CT2 may not be respectively formed in the first electrode 210_5 and the second electrode 220_5 connected to the bridge electrodes BE1_5, BE2_5, and BE3_5. An electrical signal may be substantially transmitted to the first electrode 210_5 and the second electrode 220_5 through the light-emitting elements 300 or the bridge electrodes BE1_5, BE2_5, and BE3_5 similar to a third electrode 230_5 and a fourth electrode 240_5.

For example, the first electrodes 210_5 of the first electrode unit EU1_5, the second electrode unit EU2_5, and the third electrode unit EU3_5 may be connected to the bridge electrodes BE1_5, BE2_5, and BE3_5, respectively, and may not be electrically connected to the first voltage line VL1. The first electrode 210_5 of the fourth electrode unit EU4_5 is electrically connected to the first voltage line VL1 through the first contact hole CT1. Similarly, the second electrodes 220_5 of the second electrode unit EU2_5, the third electrode unit EU3_5, and the fourth electrode unit EU4_5 may be connected to the bridge electrodes BE1_5, BE2_5, and BE3_5, respectively, and may not be electrically connected to a driving transistor DT. The second electrode 220_5 of the first electrode unit EU1_5 may include an electrode protrusion 220P_5 and may be electrically connected to the driving transistor DT through the second contact hole CT2.

The bridge electrodes BE1_5, BE2_5, and BE3_5 may electrically connect the first electrodes 210_5 and the second electrodes 220_5 of the different electrode units EU_5, and a driving signal may be transmitted through the bridge electrodes BE1_5, BE2_5, and BE3_5 while the display apparatus 10_5 is driven. The driving signal transmitted to the second electrode 220_5 of the first electrode unit EU1_5 is transmitted to the first electrode 210_5 of the first electrode unit EU1_5, and is transmitted to the second electrode 220_5 of the second electrode unit EU2_5 through the first bridge electrode BE1_5. In addition, in the same manner, the driving signal transmitted to the second electrode 220_5 of the second electrode unit EU2_5 may be transmitted to the other electrode units EU_5 through the first electrodes 210_5 and the bridge electrodes BE2_5 and BE3_5. The driving signal transmitted to the first electrode 210_5 of the fourth electrode unit EU4_5 may be similarly transmitted to the other electrode units EU_5 through the second electrodes 220_5 and the bridge electrodes BE2_5, BE2_5, and BE3_5. The display apparatus 105, according to one embodiment, may further include the bridge electrodes BE1_5, BE2_5, and BE3_5 that interconnect the electrode units EU_5 of each sub-pixel PXn so that the light-emitting elements 300 of the different electrode units EU_5 are configured to be connected in series.

Referring to the embodiments shown in FIGS. 19 and 20, in the display apparatus 10, some electrode units EU may be connected through the bridge electrode BE, and some other electrode units EU may be connected thorough the electrode protrusion 220P of the second electrode 220.

Figure 21:
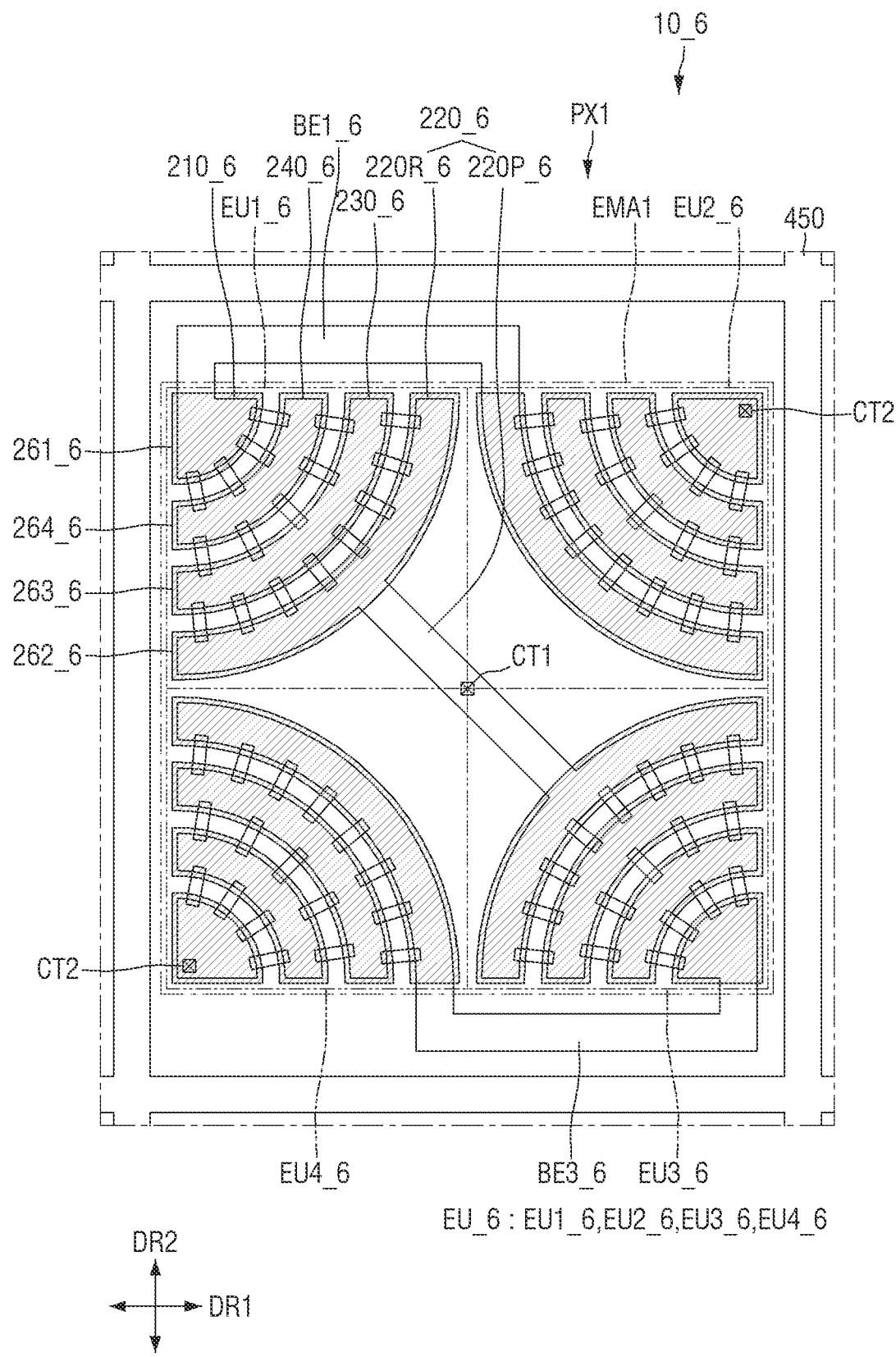
FIGS. 21 and 22 are plan views illustrating one sub-pixel of a display apparatus according to other embodiments.
Figure 22:
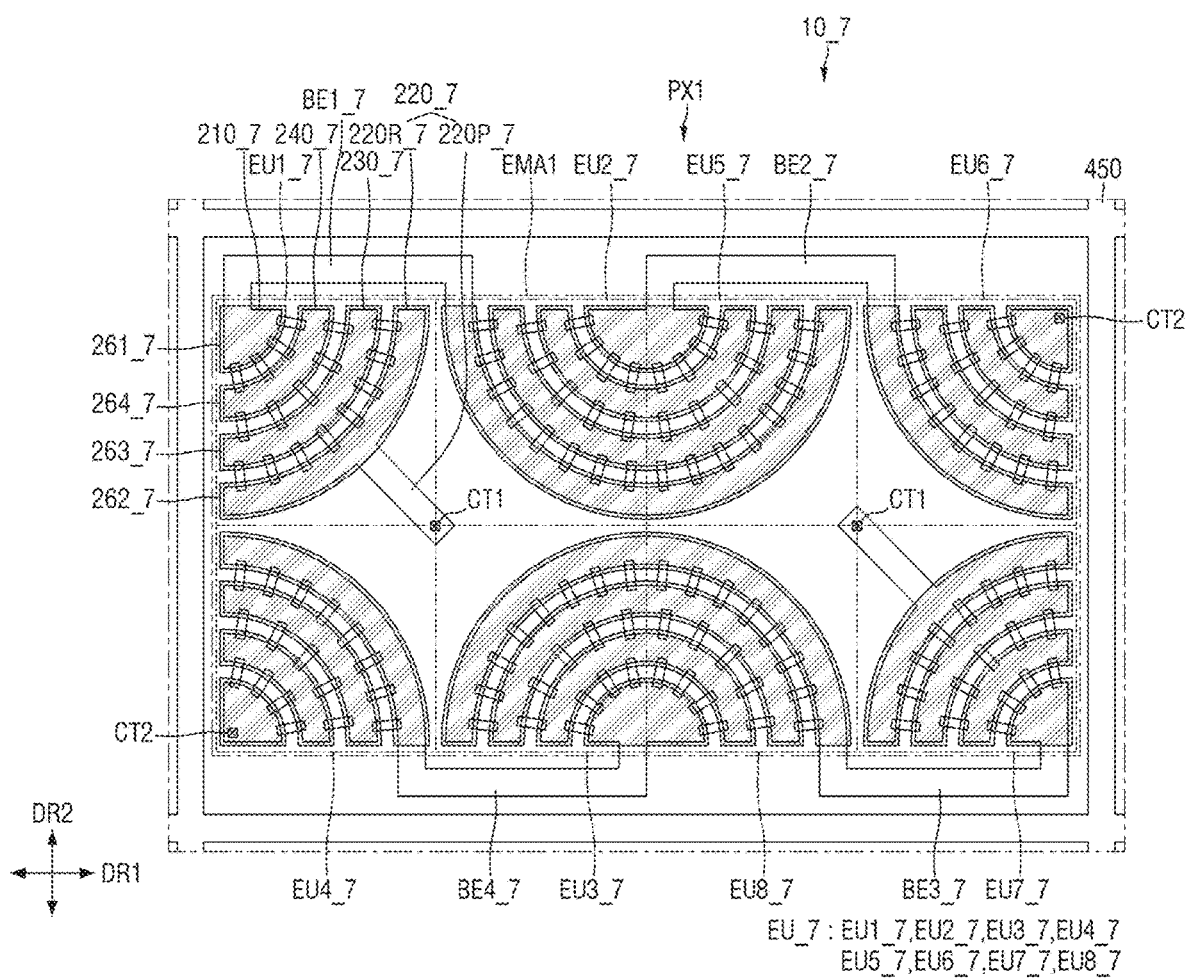

FIGS. 21 and 22 are plan views illustrating one sub-pixel of a display apparatus according to other embodiments.

Referring to FIG. 21, in a display apparatus 10_6, according to one embodiment, electrode protrusions 220P_6 of second electrodes 220_6 may be connected to each other in some of electrode units EU_6, and first electrodes 210_6 are connected to the second electrodes 220_6 through bridge electrodes BE1_6 and BE3_6, respectively, in some other electrode units EU_6. For example, in the display apparatus 10_6 shown in FIG. 21, each of the second electrodes 220_6 of a first electrode unit EU1_6 and a third electrode unit EU3_6 may include the electrode protrusion 220P_6, and the electrode protrusions 220P_6 may be connected to each other. In addition, the first electrode 210_6 of the first electrode unit EU1_6 may be connected to the second electrode 220_6 of a second electrode unit EU2_6 through a first bridge electrode BE1_6, and the first electrode 210_6 of a third electrode unit EU3_6 may be connected to the second electrode 220_6 of a fourth electrode unit EU4_6 through a third bridge electrode BE3_6.

In the first electrode unit EU1_6 and the third electrode unit EU3_6, the second electrodes 2206 may be electrically connected to a driving transistor DT through a second contact hole (e.g., a second contact opening) CT2, and in each of the second electrode unit EU2_6 and the fourth electrode unit EU4_6, the first electrode 210_6 may be electrically connected to a first voltage line VL1 through a first contact hole (e.g., a first contact opening) CT1. Other descriptions may be the same as described above.

Referring to FIG. 22, a display apparatus 107, according to one embodiment, may include a greater number of and different types of electrode units EU_7 and a greater number of bridge electrodes BE1_7, BE2_7, BE3_7, and BE4_7. The embodiment shown in FIG. 22 is different from the embodiments shown in FIGS. 13 and 15 in that the bridge electrodes BE1_7, BE2_7, BE3_7, and BE4_7 are further included.

The display apparatus 10_7 includes first to eighth electrode units EU1_7, EU2_7, EU3_7, EU4_7, EU5_7, EU6_7, EU7_7, and EU8_7. From among these, the first electrode unit EU1_7, the fourth electrode unit EU4_7, the sixth electrode unit EU6_7, and the seventh electrode unit EU7_7 may be first type electrode units. The other electrode units EU_7 may be integrated with each other to configure second type electrode units. In addition, each of the electrode units EU_7 may include a third electrode 230_7 and a fourth electrode 240_7. The description thereof is the same as described above with reference to FIGS. 13 and 15.

The bridge electrodes BE1_7, BE2_7, BE3_7, and BE4_7 may include first to fourth bridge electrodes BE1_7, BE2_7, BE3_7, and BE4_7. The first bridge electrode BE1_7 may connect the first electrode 210_7 of the first electrode unit EU1_7 and the second electrode 220_7 of the second electrode unit EU2_7. The second bridge electrode BE2_7 may connect the first electrode 210_7 of the fifth electrode unit EU5_7 and the second electrode 220_7 of the sixth electrode unit EU6_7. The third bridge electrode BE3_7 may connect the first electrode 210_7 of the seventh electrode unit EU7_7 and the second electrode 220_7 of the eighth electrode unit EU8_7. The fourth bridge electrode BE4_7 may connect the first electrode 210_7 of the third electrode unit EU3_7 and the second electrode 220_7 of the fourth electrode unit EU4_7. In each of the first electrode unit EU1_7 and the seventh electrode unit EU7_7, the second electrode 220_7 may include an electrode protrusion 220P_7 and may be electrically connected to the driving transistor DT through a first contact hole CT1. In addition, each of the fourth electrode unit EU4_7 and the sixth electrode unit EU6_7 may be electrically connected to a first voltage line VL1 through a second contact hole (e.g., a second contact opening) CT2. A description thereof is the same as that described above with reference to FIGS. 19 and 20, and thus, a detailed description thereof will be omitted.

The display apparatus 10 may further include the bridge electrode(s) BE so that the first electrodes 210 or the second electrodes 220 of some electrode units EU may not be electrically connected to the first voltage line VL1 or the driving transistor DT. Accordingly, the light-emitting elements 300 between different electrode units EU may be configured to be connected in series. Similarly, the display apparatus 10, according to one embodiment, may further include connection electrodes that connect the third electrode 230 and the fourth electrode 240 to the first electrode 210 or the second electrode 220 during the manufacturing process.

Figure 23:
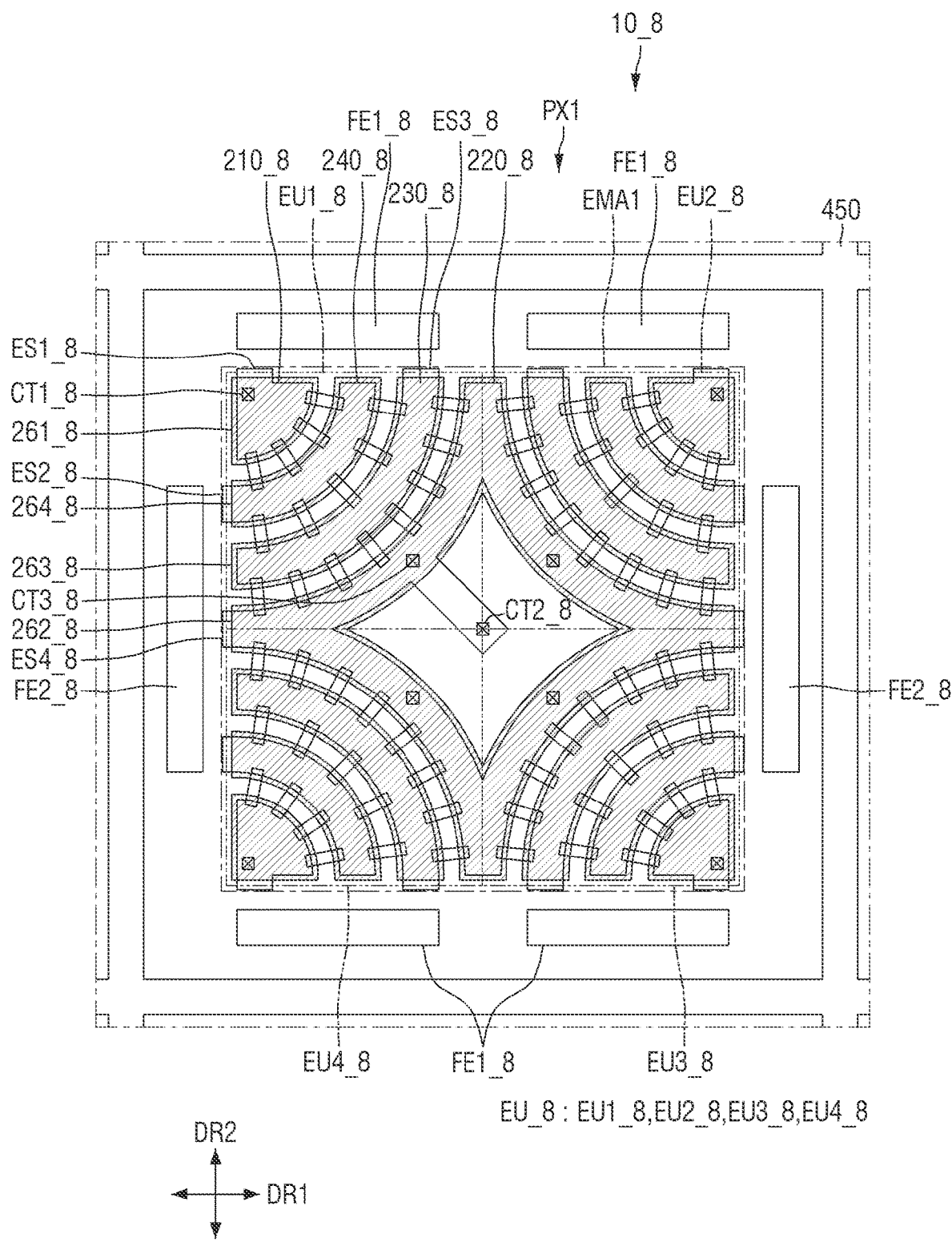
FIG. 23 is a plan view illustrating one sub-pixel of a display apparatus according to another embodiment.

FIG. 23 is a plan view illustrating one sub-pixel of a display apparatus according to another embodiment.

Referring to FIG. 23, a display apparatus 10_8 according to one embodiment may include a plurality of floating patterns FE1_8 and FE2_8 disposed in each sub-pixel PXn to be spaced apart from some electrodes 2108, 2208, 2308, and 240_8. The embodiment shown in FIG. 23 is different from the embodiment shown in FIG. 15 in that the floating patterns FE1_8 and FE2_8 are further included. Hereinafter, repeated descriptions will be omitted, and descriptions will primarily focus on differences from the above-described contents.

The floating patterns FE1_8 and FE2_8 may include a plurality of first floating patterns FE1_8, each having a shape extending in the first direction DR1, and a plurality of second floating patterns FE2_8, each having a shape extending in the second direction DR2. The first floating patterns FE1_8 and the second floating patterns FE2_8 may be disposed in a non-light-emitting region of each sub-pixel PXn and on one sides of respective electrode units EU_8 in the first direction DR1 and the second direction DR2. Two first floating patterns FE1_8 may be disposed on each of an upper side and a lower side with respect to a center of the sub-pixel PXn. The first floating patterns FE1_8 may be disposed to correspond to a first electrode unit EU1_8, a second electrode unit EU2_8, a third electrode unit EU3_8, and a fourth electrode unit EU4_8, respectively. One second floating pattern FE2_8 may be disposed on each of a left side and a right side with respect to the center of the sub-pixel PXn. The second floating patterns FE2_8 may be disposed to correspond to the first electrode unit EU1_8 and the fourth electrode unit EU4_8, and the second electrode unit EU2_8 and the third electrode unit EU3_8, respectively. Hereinafter, the floating patterns FE1_8 and FE2_8 disposed to correspond to the first electrode unit EU1_8 will be described as an example. It will be appreciated that the following description may be equally applied to other floating patterns FE1_8 and FE2_8.

At least some of the floating patterns FE1_8 and FE2_8 may be disposed in a state of being spaced apart from at least some of electrodes of the electrode units EU_8. According to one embodiment, the first floating patterns FE1_8 may include a portion that has a shape extending in the first direction DR1 and is disposed to be spaced apart from at least a first electrode 210_8 and a third electrode 230_8 in the second direction DR2. For example, the first floating pattern FE1_8 may be disposed to be spaced apart from a first short side SS1 of the first electrode 210_8 and a short side of the third electrode 230_8, which faces the second direction DR2, of both short sides of the third electrode 230_8.

Similarly, according to one embodiment, the second floating pattern FE2_8 may include a portion that has a shape extending in the second direction DR2 and is disposed to be spaced apart from at least a second electrode 220_8 and a fourth electrode 240_8 in the first direction DR1. For example, the second floating pattern FE2_8 may be disposed to be spaced apart from a fourth short side SS4 of the second electrode 220_8 and a short side of the fourth electrode 240_8, which faces the first direction DR1, of both short sides of the fourth electrode 240_8.

The floating patterns FE1_8 and FE2_8 may be patterns formed in a state of being connected to other electrodes during a manufacturing process of the display apparatus 10_8 and then disconnected in a subsequent process. As an example, the first floating pattern FE1_8 may be a pattern formed in a state of being connected to the first electrode 210_8 and the third electrode 230_8, and the second floating pattern FE2_8 may be a pattern formed in a state of being connected to the second electrode 220_8 and the fourth electrode 240_8.

Figure 24:
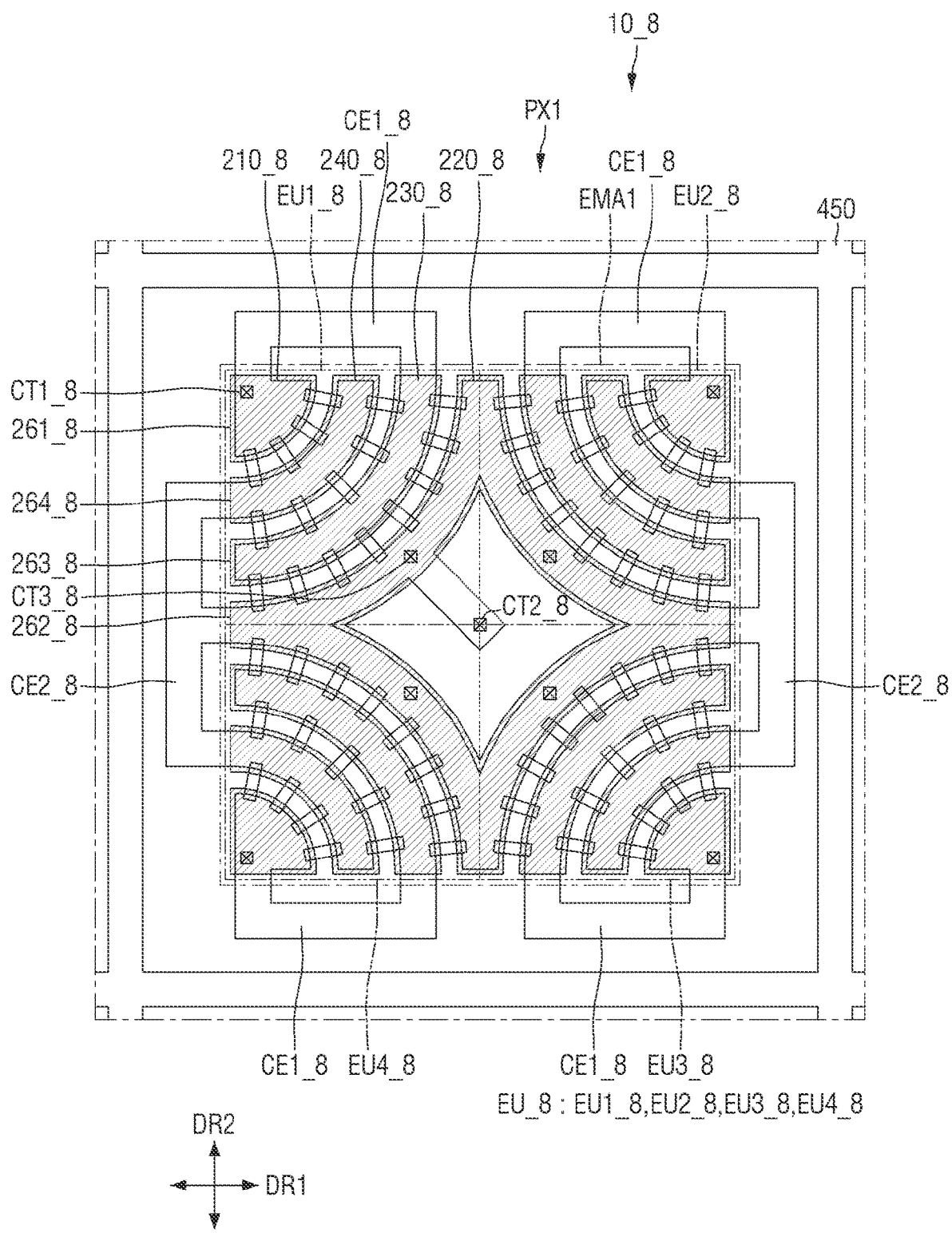
FIGS. 24 and 25 are plan views illustrating steps of a manufacturing process of the sub-pixel shown in FIG. 23.
Figure 25:
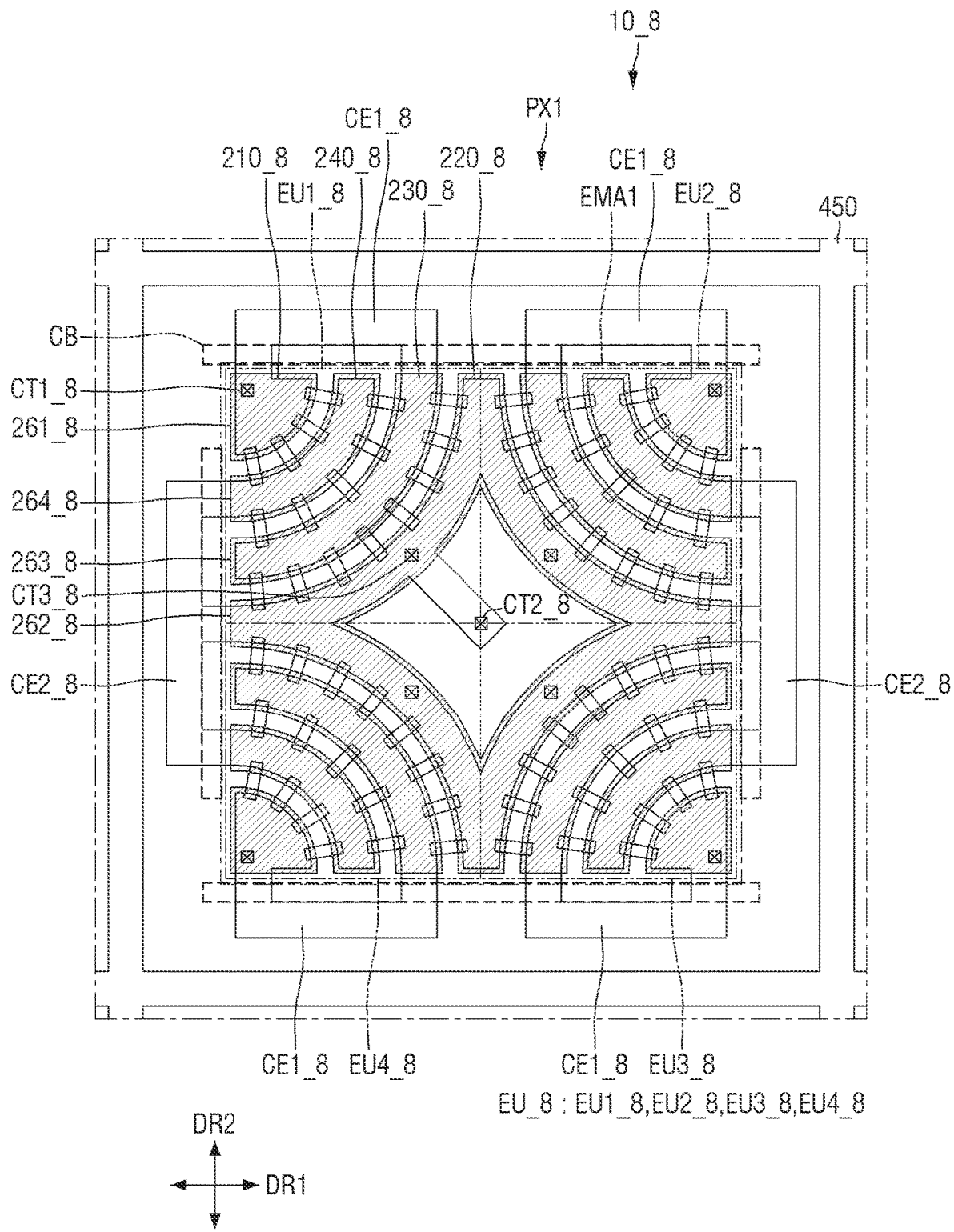

FIGS. 24 and 25 are plan views illustrating some steps of a manufacturing process of the display apparatus shown in FIG. 23.

When describing, in detail, with reference to FIGS. 24 and 25, during the manufacturing process of the display apparatus 10_8, in each electrode unit EU_8, a first electrode 210_8 and a third electrode 230_8, a second electrode 220_8 and a fourth electrode 240_8 may be electrically connected to each other respectively through connection electrodes CE1_8 and CE2_8. The connection electrodes CE1_8 and CE2_8 may include first connection electrodes CE1_8 each connected to the first electrode 210_8 and the third electrode 230_8, and second connection electrodes CE2_8 each connected to the second electrode 220_8 and the fourth electrode 240_8. The first connection electrodes CE1_8 and the second connection electrodes CE2_8 may be disposed in the non-light-emitting region and may have shapes extending in the first direction DR1 and the second direction DR2, respectively. Even the connection electrodes CE1_8 and CE2_8 may be disposed to correspond to the respective electrode units EU_8. Hereinafter, the connection electrodes CE1_8 and CE2_8 disposed to correspond to a first electrode unit EU1_8 will be described as an example. It will be appreciated that the following description may be equally applied to other connection electrodes CE1_8 and CE2_8.

During the manufacturing process of the display apparatus 10_8, an alignment signal may be transmitted to the first electrode 210_8 through a first voltage line VL1, and to the second electrode 220_8 through a first alignment line AL1. As in the embodiment shown in FIG. 17, the alignment signal may also be transmitted to the third electrode 230_8 and the fourth electrode 240_8 through a second alignment line AL2 and a third alignment line AL3, but the present disclosure is not limited thereto. In some embodiments, the second alignment line AL2 and the third alignment line AL3 may be omitted, and a fourth contact hole (e.g., a fourth contact opening) CT4 and a fifth contact hole (e.g., a fifth contact opening) CT5 may not be formed in the third electrode 230_8 and the fourth electrode 240_8. The third electrode 230_8 and the fourth electrode 240_8 may be connected to the first connection electrode CE1_8 and the second connection electrode CE2_8 connected to the first electrode 210_8 and the second electrode 220_8, an alignment signal may be transmitted through the first connection electrode CE1_8 and the second connection electrode CE2_8. For example, the connection electrodes CE1_8 and CE2_8 may transmit an alignment signal to other electrodes.

As shown in FIG. 24, the first connection electrode CE1_8 may be connected to the first electrode 210_8 and the third electrode 230_8. For example, the first connection electrode CE1_8 may be directly connected to the first short side SS1 of the first electrode 210_8 and one short side of the third electrode 230_8, which faces the second direction DR2. When the alignment signal is transmitted through the first electrode 210_8, the first connection electrode CE1_8 may transmit the alignment signal to the third electrode 230_8. Similarly, the second connection electrode CE2_8 may be connected to the second electrode 220_8 and the fourth electrode 240_8. For example, the second connection electrode CE2_8 may be directly connected to the fourth short side SS4 of the second electrode 220_8 and one short side of the fourth electrode 240_8, which faces the first direction DR1. When the alignment signal is transmitted through the second electrode 220_8, the second connection electrode CE2_8 may transmit the alignment signal to the fourth electrode 240_8. Even though the alignment signal is applied only through the first voltage line VL1 and the first alignment line AL1, an electric field may be generated between the electrodes 210_8, 220_8, 230_8, and 240_8 through the first connection electrode CE1_8 and the second connection electrode CE2_8. The light-emitting elements 300 may be disposed (or aligned) between the electrodes 210_8, 220_8, 230_8, and 240_8 due to the electric field.

Thereafter, as shown in FIG. 25, the connection electrodes CE1_8 and CE2_8 are disconnected from the respective electrodes 2108, 2208, 2308, and 2408 (the portion CB in FIG. 25)). The first connection electrode CE1_8 may be disconnected from the first electrode 210_8 and the third electrode 230_8 to form the first floating pattern FE1_8 shown in FIG. 23, and the second connection electrode CE2_8 may be disconnected from the second electrode 220_8 and the fourth electrode 240_8 to form the second floating pattern FE2_8 shown in FIG. 23. After the light-emitting elements 300 are disposed, the connection electrodes CE1_8 and CE2_8 may be patterned to be disconnected from the respective electrodes 2108, 2208, 230_8, and 2408, and may remain in a floating state.

As described above, after the light-emitting elements 300 are aligned, a process of partially disconnecting the alignment lines may be performed. When each of the electrode units EU_8 includes the third electrode 230_8 and the fourth electrode 240_8 and, thus, includes a greater number of alignment lines, an area of the line contact hole (the CLT in FIG. 8) formed in the non-light-emitting region may be increased. However, as shown in FIG. 24, when an alignment signal is transmitted to other electrodes except for the first electrode 210_8 and the second electrode 220_8 through the connection electrodes CE1_8 and CE2_8, the third electrode 230_8 and the fourth electrode 240_8 may be disconnected from the first electrode 210_8 and the second electrode 220_8 on a first planarization layer 109, and the line contact hole CLT may be formed only on a portion in which the first alignment line AL1 is located.

Meanwhile, when the connection electrodes CE1_8 and CE2_8 are disconnected to form the floating patterns FE1_8 and FE2_8, portions of the connection electrodes CE1_8 and CE2_8 may remain in a state of being connected to one short side of each of the electrodes 2108, 2208, 2308, and 240_8. As shown in FIG. 23, the display apparatus 10_8 according to one embodiment may include a plurality of electrode fragments ES1_8, ES2_8, ES3_8, and ES4_8 respectively formed on at least one short sides of the electrodes 2108, 2208, 2308, and 240_8.

The plurality of electrode fragments ES1_8, ES2_8, ES3_8, and ES4_8 may include a first electrode fragment ES1_8 connected to the first electrode 2108, a second electrode fragment ES2_8 connected to the second electrode 220_8, a third electrode fragment ES3_8 connected to the third electrode 2308, and a fourth electrode fragment ES4_8 connected to the fourth electrode 240_8. The first electrode fragment ES1_8 may be connected to the first short side SS1 of the first electrode 210_8 to form a shape in which a portion of the first short side SS1 protrudes in the second direction DR2. The third electrode fragment ES3_8 may be connected to one short side of the third electrode 2308, which faces the second direction DR2, and the one short side of the third electrode 2308 may protrude further than a short side of the fourth electrode 2408, which faces the second direction DR2. The first fragment ES1_8 and the third fragment ES3_8 may each remain as a trace of the first connection electrode CE1_8 and may be spaced apart from and face the first floating pattern FE1_8 in the second direction DR2.

Similarly, the second electrode fragment ES2_8 may be connected to a fourth short side SS4 of the second electrode 220_8 so that the fourth short side SS4 may protrude further in the first direction DR1 than a short side of the third electrode 2308, which faces the first direction DR1. The fourth electrode fragment ES4_8 may be connected to one short side of the fourth electrode 2408, which faces the first direction DR1, and the one short side of the fourth electrode 240_8 may protrude further than the short side of the third electrode 2308, which faces the first direction DR1. The second fragment ES2_8 and the fourth fragment ES4_8 may each remain as a trace of the second connection electrode CE2_8 and may be spaced apart from and face the second floating pattern FE2_8 in the first direction DR1.

However, the present disclosure is not limited thereto. In some embodiments, the electrode fragments ES may be removed and may not remain in the display apparatus 10.

Figure 26:
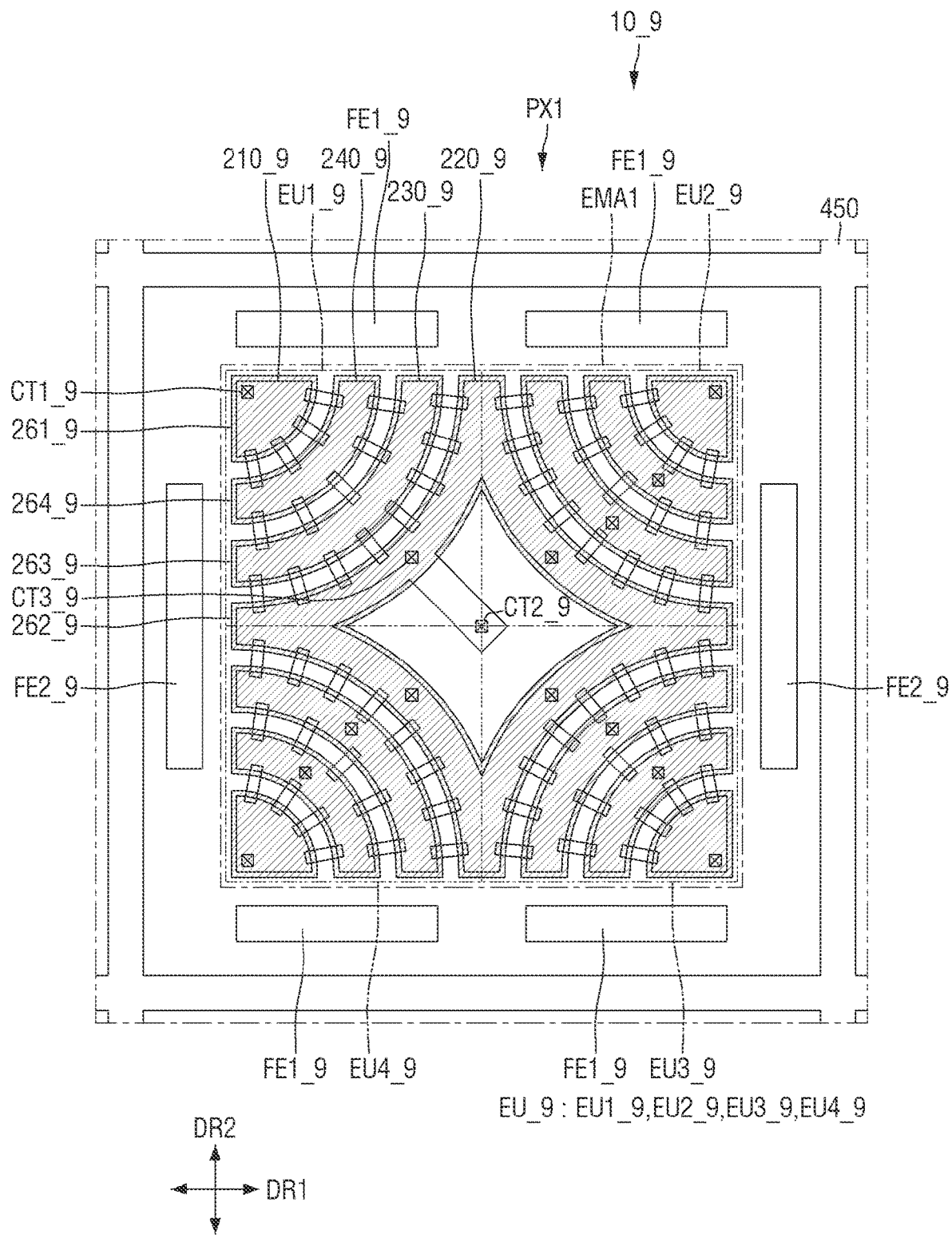
FIG. 26 is a plan view illustrating one sub-pixel of a display apparatus according to another embodiment.

FIG. 26 is a plan view illustrating one sub-pixel of a display apparatus according to another embodiment.

Referring to FIG. 26, in a display apparatus 10_9, according to one embodiment, electrode fragments may be removed. After the light-emitting elements 300 are disposed, in a process of patterning connection electrodes, electrode fragments ES may be removed so as not to remain according to the process conditions. The embodiment shown in FIG. 26 is different from the embodiment shown in FIG. 25 in that the electrode fragments ES are not removed, and only floating patterns FE1_9 and FE2_9 are disposed. Because the following description is a duplicate description, a detailed description thereof will be omitted.

In concluding the detailed description, those skilled in the art will appreciate that many variations and modifications can be made to the embodiments described herein without departing from the principles of the present disclosure. Therefore, the disclosed embodiments of the present disclosure are used in a generic and descriptive sense and not for purposes of limitation.

What is claimed is:

1. A display apparatus comprising:
   a substrate comprising a plurality of pixels;
   an electrode unit in each of the pixels of the substrate and comprising:
   a first electrode having a first outer side having a center of curvature and a curved shape; and
   a second electrode having a second outer side having a curved shape corresponding to the first outer side and spaced apart from and facing the first electrode; and
   a plurality of light-emitting elements between the first electrode and the second electrode,
   wherein the center of curvature of the first electrode is on a peripheral portion of the pixel, and the first outer side of the first electrode faces a center of the pixel.

2. The display apparatus of claim 1, wherein the electrode unit comprises a first type electrode unit in which the first electrode has a first short side extending in a first direction, a second short side extending in a second direction crossing the first direction with one end thereof connected to one end of the first short side,
   wherein the first outer side of the first electrode extends between the other end of the first short side and the other end of the second short side, and
   wherein, in the first electrode of the first type electrode unit, the center of curvature of the first outer side is the one end of the first short side.

3. The display apparatus of claim 2, wherein the second electrode has a third outer side having a curved shape corresponding to the second outer side, a third short side extending in the first direction and connecting one end of the second outer side and one end of the third outer side, and a fourth short side extending in the second direction and connecting the other end of the second outer side and the other end of the third outer side.

4. The display apparatus of claim 3, wherein the electrode unit comprises a first electrode unit in which the center of curvature of the first outer side is on one side of the pixel and a second electrode unit in which the center of curvature of the first outer side is on the other side of the pixel.

5. The display apparatus of claim 4, wherein the second electrode of the first electrode unit is directly connected to the second electrode of the second electrode unit.

6. The display apparatus of claim 4, further comprising a bridge electrode in the pixel, the bridge electrode having one end connected to the first electrode of the first electrode unit and the other end connected to the second electrode of the second electrode unit.

7. The display apparatus of claim 3, wherein the second electrode has an electrode protrusion in which a portion of the third outer side protrudes.

8. The display apparatus of claim 2, wherein the electrode unit further comprises a third electrode between the first electrode and the second electrode and a fourth electrode between the third electrode and the first electrode,
wherein the third electrode has a curved shape corresponding to the second outer side of the second electrode, and
wherein the fourth electrode has a curved shape corresponding to the first outer side of the first electrode.

9. The display apparatus of claim 8, wherein the third electrode and the fourth electrode are spaced apart from each other and face each other, and
wherein each of the light-emitting elements is between the third electrode and the fourth electrode.

10. The display apparatus of claim 8, further comprising:
a first floating pattern having a shape extending in the first direction and having a portion spaced apart from the first short side of the first electrode and the third electrode in the second direction; and
a second floating pattern having a shape extending in the second direction and having a portion spaced apart from a fourth short side of the second electrode and the fourth electrode in the first direction.

11. The display apparatus of claim 2, wherein the electrode unit comprises a second type electrode unit in which the first electrode has a fifth short side extending in the first direction, and the first outer side extends between both ends of the fifth short side,
wherein, in the first electrode of the second type electrode unit, the center of curvature of the first outer side is between both ends of the fifth short side.

12. The display apparatus of claim 2, wherein the electrode unit further comprises a third type electrode unit in which the first electrode has a circular shape.

13. The display apparatus of claim 1, further comprising:
a first contact electrode on the first electrode and having a side curved along the first outer side; and
a second contact electrode on the second electrode and having a side curved along the second outer side,
wherein the first contact electrode is in contact with the first electrode and one end of at least one of the light-emitting elements, and
wherein the second contact electrode is in contact with the second electrode and the other end of the at least of the light-emitting elements.

14. The display apparatus of claim 13, wherein a first separation distance between the first outer side of the first electrode and the second outer side of the second electrode is less than a second separation distance between the first contact electrode and the second contact electrode.

15. A display apparatus comprising:
a plurality of first electrodes each having a first short side and a second short side that extend in directions crossing each other and have ends connected to each other, and a first outer side having a curved shape and extending between the other ends of the first short side and the second short side;
a plurality of second electrodes, each of which is spaced apart from and faces the first outer side of the first electrode and has a second outer side having a curved shape corresponding to the first outer side; and
a plurality of light-emitting elements between the first electrodes and the second electrodes,
wherein the plurality of light-emitting elements are between the first outer side and the second outer side and arranged along a curvature of the first outer side.

16. The display apparatus of claim 15, further comprising a third electrode between the first electrode and the second electrode and a fourth electrode between the third electrode and the first electrode,
wherein the third electrode has a curved shape corresponding to the second outer side of the second electrode, and
wherein the fourth electrode has a curved shape corresponding to the first outer side of the first electrode.

17. The display apparatus of claim 16, further comprising:
a first contact electrode on the first electrode and having a side curved along the first outer side; and
a second contact electrode on the second electrode and having a side curved along the second outer side.

18. The display apparatus of claim 16, wherein the first outer side and the second outer side have the same center of curvature,
wherein at least some of the plurality of first electrodes have different centers of curvature, and
wherein at least some of the plurality of second electrodes have different centers of curvature.

19. The display apparatus of claim 18, wherein at least some of the second electrodes having different centers of curvature are directly connected to each other.

20. The display apparatus of claim 18, further comprising a bridge electrode connecting the first electrode and the second electrode, the second electrode having a center of curvature different from that of the first electrode.

* * * * *